(12) United States Patent
Kurokawa

(10) Patent No.: US 10,516,842 B2
(45) Date of Patent: Dec. 24, 2019

(54) DRIVING METHOD OF SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 15/642,390

(22) Filed: Jul. 6, 2017

(65) Prior Publication Data

US 2017/0310917 A1 Oct. 26, 2017

Related U.S. Application Data

(63) Continuation of application No. 14/790,801, filed on Jul. 2, 2015, now Pat. No. 9,729,809.

(30) Foreign Application Priority Data

Jul. 11, 2014 (JP) .................................. 2014-143256

(51) Int. Cl.
*H04N 5/3745* (2011.01)
*G01S 17/02* (2006.01)
(Continued)

(52) U.S. Cl.
CPC ......... *H04N 5/3745* (2013.01); *G01S 7/4816* (2013.01); *G01S 7/4863* (2013.01);
(Continued)

(58) Field of Classification Search
CPC ...... H04N 5/3745; H04N 5/374–37457; H01L 27/14609; H01L 27/14614;
(Continued)

(56) References Cited

U.S. PATENT DOCUMENTS

| 4,438,455 A | 3/1984 | Tabei |
| 5,965,875 A | 10/1999 | Merrill |

(Continued)

FOREIGN PATENT DOCUMENTS

| JP | 05-251705 A | 9/1993 |
| JP | 2004-294420 A | 10/2004 |

(Continued)

OTHER PUBLICATIONS

Brown.C et al., "31.3: A System LCD with Integrated 3-Dimensional Input Device", SID Digest '10 : SID International Symposium Digest of Technical Papers, 2010, pp. 453-456.

(Continued)

*Primary Examiner* — Paul M Berardesca
(74) *Attorney, Agent, or Firm* — Fish & Richardson P.C.

(57) ABSTRACT

A driving method of a semiconductor device that takes three-dimensional images with short duration is provided. In a first step, a light source starts to emit light, and first potential corresponding to the total amount of light received by a first photoelectric conversion element and a second photoelectric conversion element is written to a first charge accumulation region. In a second step, the light source stops emitting light and second potential corresponding to the total amount of light received by the first photoelectric conversion element and the second photoelectric conversion element is written to a second charge accumulation region. In a third step, first data corresponding to the potential written to the first charge accumulation region is read. In a fourth step, second data corresponding to the potential written to the second charge accumulation region is read.

12 Claims, 38 Drawing Sheets

(51) Int. Cl.
  *H01L 27/146* (2006.01)
  *G01S 17/89* (2006.01)
  *G01S 7/481* (2006.01)
  *G01S 7/486* (2006.01)
(52) U.S. Cl.
  CPC .............. *G01S 17/02* (2013.01); *G01S 17/89* (2013.01); *H01L 27/1464* (2013.01); *H01L 27/14609* (2013.01); *H01L 27/14614* (2013.01); *H01L 27/14621* (2013.01); *H01L 27/14645* (2013.01); *H01L 27/14649* (2013.01); *H01L 27/14689* (2013.01)
(58) Field of Classification Search
  CPC ........... H01L 27/14621; H01L 27/1464; H01L 27/14649; H01L 27/14689; H01L 27/14612; H01L 27/14643; H01L 27/14645–14652; G01S 7/4816; G01S 7/4863; G01S 17/02; G01S 17/89; G01S 17/08–36
  See application file for complete search history.

(56) References Cited

U.S. PATENT DOCUMENTS

| | | | |
|---|---|---|---|
| 6,747,638 | B2 | 6/2004 | Yamazaki et al. |
| 7,053,937 | B1 * | 5/2006 | Aoki ................. H04N 5/77 348/231.3 |
| 7,061,014 | B2 | 6/2006 | Hosono et al. |
| 7,271,835 | B2 | 9/2007 | Iizuka et al. |
| 7,385,224 | B2 | 6/2008 | Ishii et al. |
| 7,402,506 | B2 | 7/2008 | Levy et al. |
| 7,411,620 | B2 | 8/2008 | Taniguchi et al. |
| 7,436,496 | B2 | 10/2008 | Kawahito |
| 7,525,523 | B2 | 4/2009 | Yamazaki et al. |
| 7,663,165 | B2 | 2/2010 | Mouli |
| 7,674,650 | B2 | 3/2010 | Akimoto et al. |
| 7,732,819 | B2 | 6/2010 | Akimoto et al. |
| 7,970,204 | B2 | 6/2011 | Sawachi |
| 8,207,756 | B2 | 6/2012 | Shionoiri et al. |
| 8,289,427 | B2 | 10/2012 | Kawahito |
| 8,344,306 | B2 | 1/2013 | Kim |
| 8,378,391 | B2 | 2/2013 | Koyama et al. |
| 8,502,772 | B2 | 8/2013 | Kozuma et al. |
| 8,633,051 | B2 | 1/2014 | Kurokawa et al. |
| 8,872,120 | B2 | 10/2014 | Kurokawa et al. |
| 8,928,053 | B2 | 1/2015 | Kurokawa |
| 9,082,676 | B2 | 7/2015 | Kurokawa |
| 2002/0056838 | A1 | 5/2002 | Ogawa |
| 2002/0196415 | A1 * | 12/2002 | Shiratani ................. G01B 11/25 353/31 |
| 2003/0209651 | A1 | 11/2003 | Iwasaki |
| 2005/0017302 | A1 | 1/2005 | Hoffman |
| 2006/0035452 | A1 | 2/2006 | Carcia et al. |
| 2006/0108636 | A1 | 5/2006 | Sano et al. |
| 2006/0110867 | A1 | 5/2006 | Yabuta et al. |
| 2006/0157760 | A1 | 7/2006 | Hayashi et al. |
| 2006/0169973 | A1 | 8/2006 | Isa et al. |
| 2006/0170111 | A1 | 8/2006 | Isa et al. |
| 2006/0208977 | A1 | 9/2006 | Kimura |
| 2006/0238135 | A1 | 10/2006 | Kimura |
| 2006/0244107 | A1 | 11/2006 | Sugihara et al. |
| 2007/0018075 | A1 | 1/2007 | Cazaux et al. |
| 2007/0108446 | A1 | 5/2007 | Akimoto |
| 2007/0187760 | A1 | 8/2007 | Furuta et al. |
| 2008/0038882 | A1 | 2/2008 | Takechi et al. |
| 2008/0054319 | A1 | 3/2008 | Mouli |
| 2008/0258140 | A1 | 10/2008 | Lee et al. |
| 2009/0073325 | A1 | 3/2009 | Kuwabara et al. |
| 2009/0101948 | A1 | 4/2009 | Park et al. |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0295769 | A1 | 12/2009 | Yamazaki et al. |
| 2010/0020209 | A1 * | 1/2010 | Kim ...................... H04N 3/155 348/294 |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0117991 | A1 | 5/2010 | Koyama et al. |
| 2010/0182282 | A1 | 7/2010 | Kurokawa et al. |
| 2010/0238334 | A1 | 9/2010 | Takahashi |
| 2011/0108706 | A1 | 5/2011 | Koyama |
| 2011/0109591 | A1 | 5/2011 | Kurokawa et al. |
| 2011/0109592 | A1 | 5/2011 | Kurokawa et al. |
| 2011/0215323 | A1 | 9/2011 | Kurokawa et al. |
| 2012/0032193 | A1 | 2/2012 | Kurokawa et al. |
| 2012/0056861 | A1 | 3/2012 | Kurokawa et al. |
| 2012/0085890 | A1 | 4/2012 | Kurokawa |
| 2013/0015326 | A1 | 1/2013 | Tamura |
| 2013/0021441 | A1 * | 1/2013 | Kim ...................... H04N 5/3745 348/46 |
| 2013/0044917 | A1 | 2/2013 | Kurokawa |
| 2013/0088620 | A1 * | 4/2013 | Centen .................. G01S 7/4863 348/273 |
| 2013/0234027 | A1 | 9/2013 | Kurokawa |
| 2014/0056405 | A1 | 2/2014 | Kurokawa et al. |
| 2014/0104397 | A1 * | 4/2014 | Shin ....................... H04N 5/332 348/49 |
| 2014/0340363 | A1 | 11/2014 | Ikeda et al. |
| 2015/0002635 | A1 | 1/2015 | Kawai et al. |
| 2015/0035028 | A1 * | 2/2015 | Fan ................. H01L 27/14623 257/292 |
| 2015/0060675 | A1 | 3/2015 | Akimoto et al. |
| 2015/0296162 | A1 | 10/2015 | Kurokawa et al. |
| 2016/0134789 | A1 | 5/2016 | Inoue et al. |
| 2016/0173798 | A1 * | 6/2016 | Hirayama ......... H01L 27/14605 348/311 |
| 2017/0171485 | A1 * | 6/2017 | Kawahito .............. H04N 5/378 |
| 2018/0054581 | A1 * | 2/2018 | Sang; Takuya ........ H04N 5/374 |

FOREIGN PATENT DOCUMENTS

| | | |
|---|---|---|
| JP | 2008-059148 A | 3/2008 |
| JP | 2009-141717 A | 6/2009 |
| JP | 2010-035168 A | 2/2010 |
| JP | 2011-044887 A | 3/2011 |
| JP | 2013-217911 A | 10/2013 |
| WO | WO-2013/133143 | 9/2013 |

OTHER PUBLICATIONS

Tanaka.K et al., "45.5: A System LCD with Optical Input Function using Infra-Red Backlight Subtraction Scheme", SID Digest '10 : SID International Symposium Digest of Technical Papers, 2010, pp. 680-683.

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

Kim.S et al., "A Three-Dimensional Time-of-Flight CMOS Image Sensor With Pinned-Photodiode Pixel Structure", IEEE Electron Device Letters, Nov. 1, 2010, vol. 31, No. 11, pp. 1272-1274.

Kim.S et al., "A 640x480 Image Sensor with Unified Pixel Architecture for 2D/3D Imaging in 0.11μm CMOS", 2011 Symposium on VLSI Technology : Digest of Technical Papers, Jun. 15, 2011, pp. 92-93.

Furuta.M et al., "A High-Speed, High-Sensitivity Digital CMOS Image Sensor With a Global Shutter and 12-bit Column-Parallel Cyclic A/D Converters", IEEE Journal of Solid-State Circuits, Apr. 1, 2007, vol. 42, No. 4, pp. 766-774.

* cited by examiner

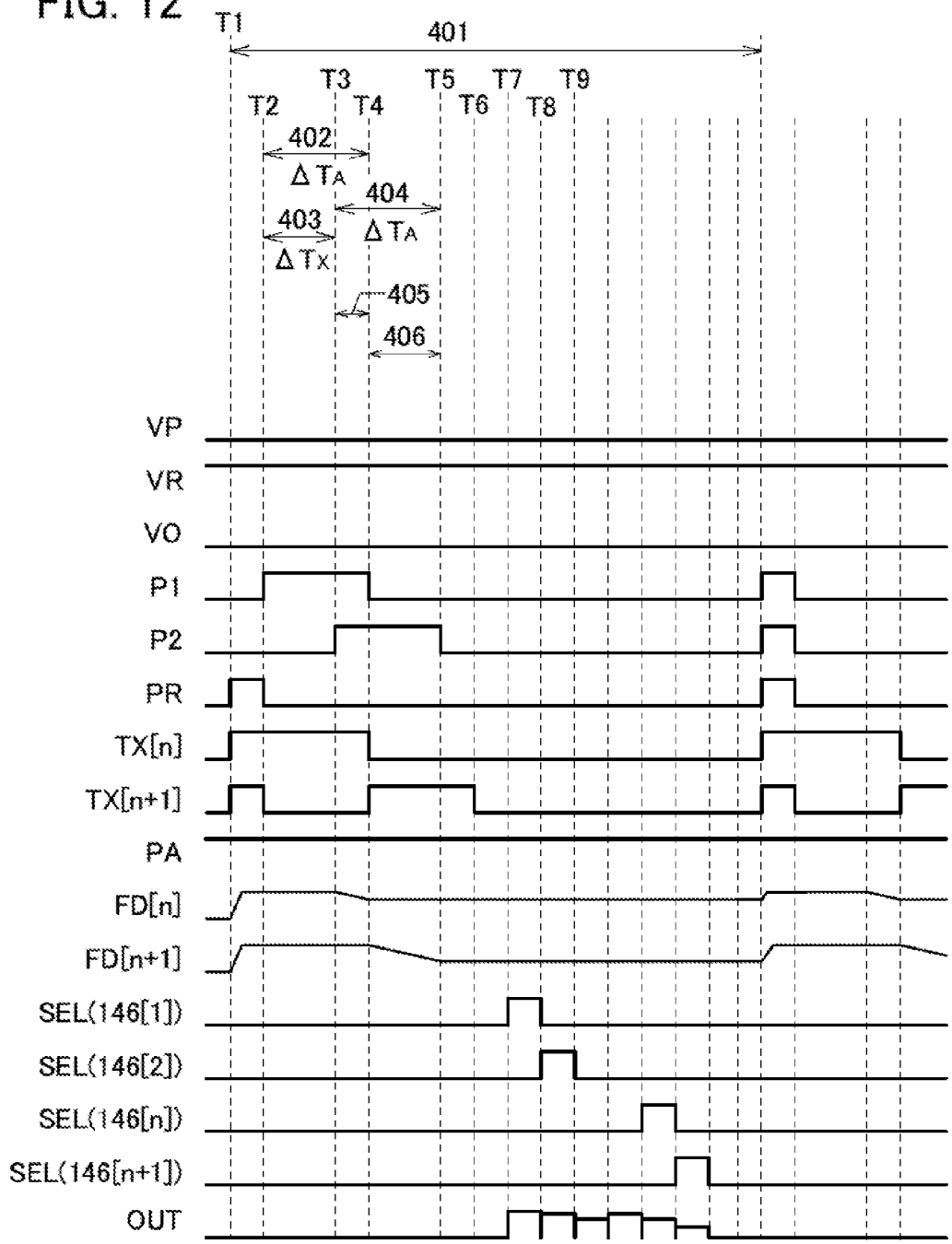

FIG. 29A1
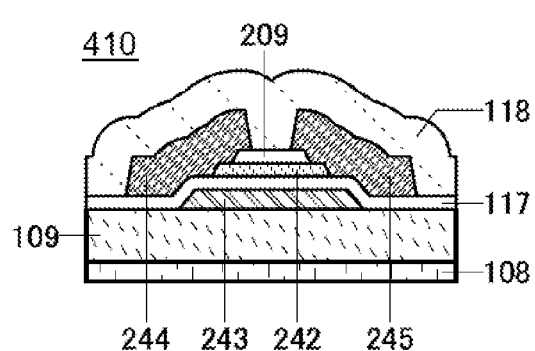
FIG. 29A2
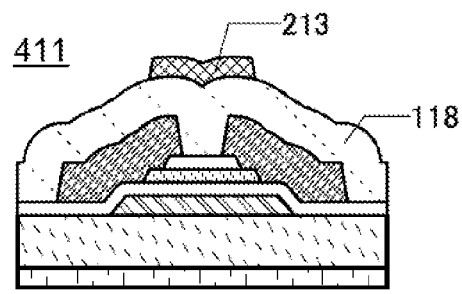
FIG. 29B1
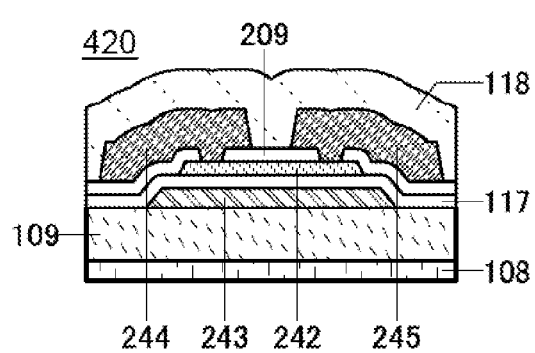
FIG. 29B2
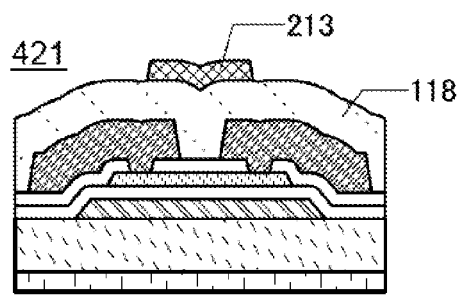

FIG. 30A1
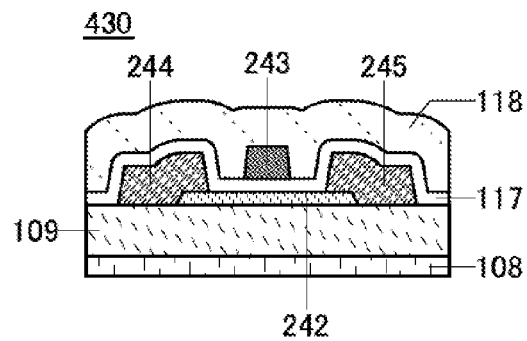
FIG. 30A2
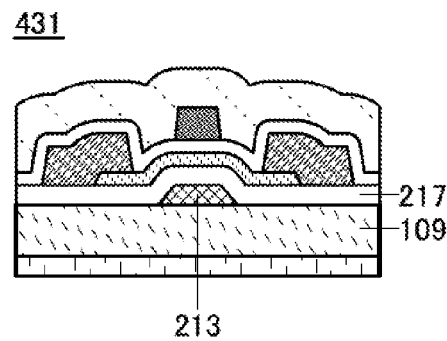
FIG. 30A3
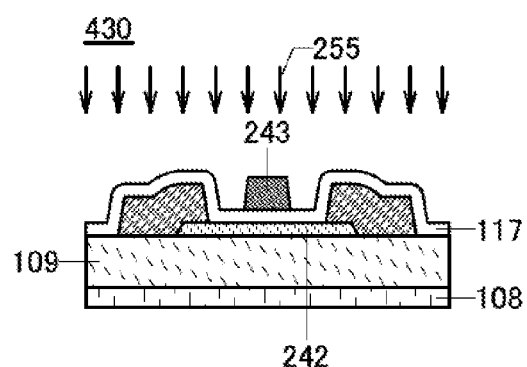
FIG. 30B1
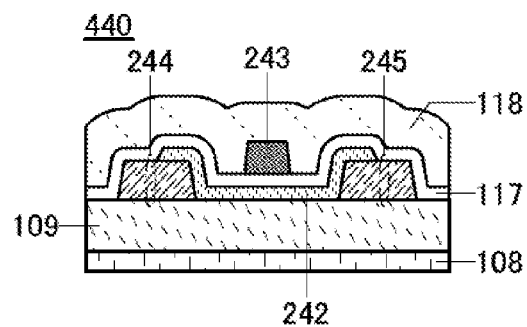
FIG. 30B2
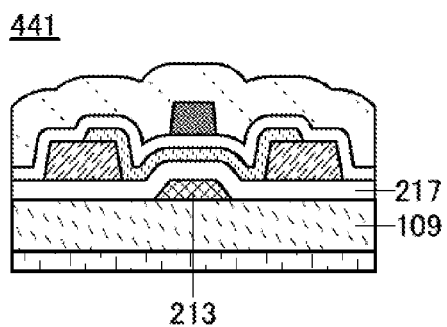

451

451

451

FIG. 35A1
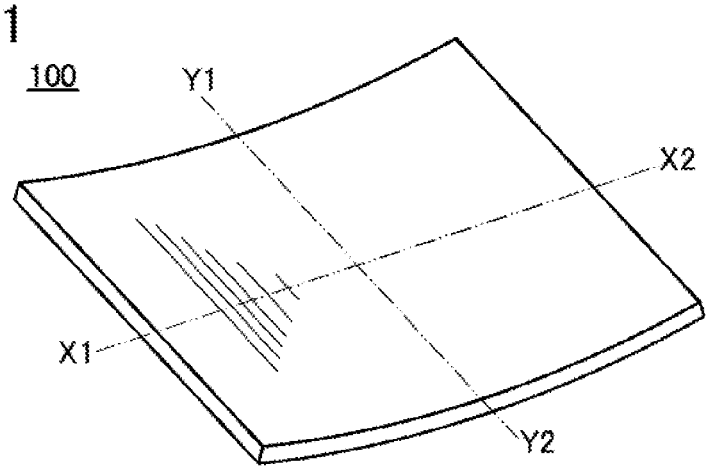
FIG. 35A2
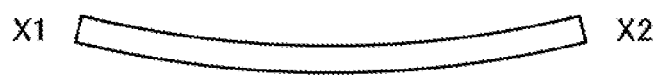
FIG. 35A3
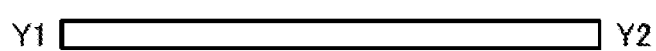
FIG. 35B1
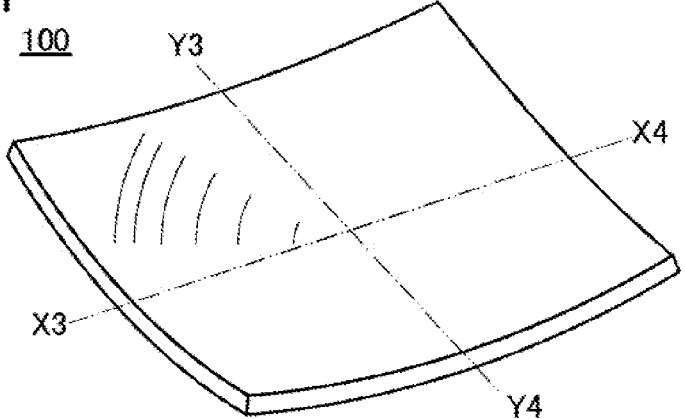
FIG. 35B2
FIG. 35B3
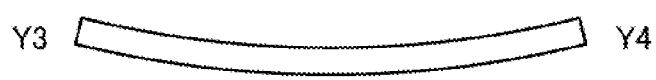

US 10,516,842 B2

DRIVING METHOD OF SEMICONDUCTOR DEVICE AND ELECTRONIC DEVICE

CROSS-REFERENCE TO RELATED APPLICATIONS

This application is a continuation of U.S. application Ser. No. 14/790,801, filed Jul. 2, 2015, now allowed, which claims the benefit of a foreign priority application filed in Japan as Serial No. 2014-143256 on Jul. 11, 2014, both of which are incorporated by reference.

BACKGROUND OF THE INVENTION

1. Field of the Invention

One embodiment of the present invention relates to a semiconductor device and a driving method thereof. Specifically, the present invention relates to a solid-state imaging device including a plurality of pixels provided with photosensors and to a method for driving the solid-state imaging device. Further, the present invention relates to an electronic device including the solid-state imaging device.

Note that one embodiment of the present invention is not limited to the above technical field. For example, one embodiment of the present invention relates to an object, a method, or a manufacturing method. One embodiment of the present invention relates to a process, a machine, manufacture, or a composition of matter. Further, one embodiment of the present invention relates to a memory device, a processor, a driving method thereof, or a manufacturing method thereof.

In this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, a solid-state imaging device, an electronic device, and the like may include a semiconductor element or a semiconductor circuit. Therefore, a display device, a light-emitting device, a lighting device, an electro-optical device, a solid-state imaging device, an electronic device, and the like include a semiconductor device in some cases.

2. Description of the Related Art

A photosensor using an amplification function of a metal oxide semiconductor (MOS) transistor, called a complementary metal oxide semiconductor (CMOS) sensor, can be fabricated through a general CMOS process. Thus, manufacturing cost of an imaging device including a CMOS sensor in each pixel can be low, and a semiconductor device having a photosensor and a display element formed over one substrate can be realized. Further, the drive voltage of a CMOS sensor is lower than that of a charge coupled device (CCD) sensor, so that power consumption of the solid-state imaging device can be kept low.

A solid-state imaging device including a CMOS sensor generally employs, for imaging, a rolling shutter method in which an operation to accumulate charge in a photodiode and an operation to read the charge are sequentially performed row by row (see Patent Document 1). In some cases, such a solid-state imaging device employs a global shutter method in which all the pixels are subjected to an operation to accumulate charge at a time, instead of the rolling shutter method.

Non-Patent Document 1 discloses an example in which three-dimensional imaging of an object is performed by detecting light reflected from the object.

As Non-Patent Document 1 describes, the channel width of a transistor, which transfers charge obtained through photoelectric conversion of a photodiode to a charge accumulation region, is increased to improve the transfer efficiency.

REFERENCE

Patent Document 1: Japanese Published Patent Application No. 2009-141717
Non-Patent Document 1: S. J. Kim et al., "A Three-Dimensional Time-of-Flight CMOS Image Sensor With Pinned-Photodiode Pixel Structure", IEEE Electron Device Letters, November 2010, Vol. 31, No. 11, pp. 1272-1274

SUMMARY OF THE INVENTION

However, increase in channel width of a transistor may increase off-state current, leading to deterioration in characteristics of holding accumulated charge. An object of one embodiment of the present invention is to provide a solid-state imaging device capable of taking high-quality images, or the like. Another object of one embodiment of the present invention is to provide a solid-state imaging device with a short duration of imaging, or the like. Another object of one embodiment of the present invention is to provide a low-power-consumption solid-state imaging device or the like. Another object of one embodiment of the present invention is to provide a driving method thereof.

Another object of one embodiment of the present invention is to provide a solid-state imaging device capable of three-dimensional imaging with a short duration of imaging. Another object of one embodiment of the present invention is to provide a solid-state imaging device capable of high-definition two-dimensional imaging. Another object of one embodiment of the present invention is to provide an imaging device with high reliability. Another object of one embodiment of the present invention is to provide a driving method thereof.

Note that the descriptions of these objects do not preclude the existence of other objects. In one embodiment of the present invention, there is no need to achieve all the objects. Other objects will be apparent from and can be derived from the description of the specification, the drawings, the claims, and the like.

One embodiment of the present invention is a driving method of a semiconductor device that includes a first circuit, a second circuit, a third transistor, and a light source. The first circuit includes a first photoelectric conversion element, a first transistor, and a first charge accumulation region. The second circuit includes a second photoelectric conversion element, a second transistor, and a second charge accumulation region. One of a source and a drain of the first transistor is electrically connected to the first photoelectric conversion element. The other of the source and the drain of the first transistor is electrically connected to the first charge accumulation region. One of a source and a drain of the second transistor is electrically connected to the second photoelectric conversion element. The other of the source and the drain of the second transistor is electrically connected to the second charge accumulation region. One of a source and a drain of the third transistor is electrically connected to the first photoelectric conversion element. The other of the source and the drain of the third transistor is electrically connected to the second photoelectric conversion element. The driving method of the semiconductor device of one embodiment of the present invention includes a first step, a second step, a third step, and a fourth step. In the first step, the light source starts to emit light. In the first step, the first transistor and the third transistor are on. In the first step, the second transistor is off. In the first step, first potential corresponding to a total amount of light received by the first photoelectric conversion element and the second photoelectric conversion element is written to the first charge accumulation region. In the second step, the light source stops emitting light. In the second step, the first transistor is off. In the second step, the second transistor and the third transistor are on. In the second step, second potential corresponding to a total amount of light received by the first photoelectric conversion element and the second photoelectric conversion element is written to the second charge accumulation region. In the third step, the first transistor and the second transistor are off. In the third step, first data corresponding to the first potential written to the first charge accumulation region is read. In the fourth step, the first transistor and the second transistor are off. In the fourth step, second data corresponding to the second potential written to the second charge accumulation region is read.

In the above structure, it is preferable that: the semiconductor device include an imaging device, the imaging device image an object in the first step and the second step, the object be irradiated with light emitted from the light source in the first step, and a distance between the imaging device and the object be calculated based on the first data and the second data. In the above structure, it is preferable that the first transistor and the second transistor each include an oxide semiconductor. In the above structure, it is preferable that the first photoelectric conversion element and the second photoelectric conversion element each include a PIN junction.

In the above structure, it is preferable that: the first circuit include a fourth transistor, the second circuit include a fifth transistor, a gate of the fourth transistor be electrically connected to the first charge accumulation region, a gate of the fifth transistor be electrically connected to the second charge accumulation region, the one of the source and the drain of the first transistor be electrically connected to the one of the source and the drain of the third transistor, and the one of the source and the drain of the second transistor be electrically connected to the other of the source and the drain of the third transistor.

According to one embodiment of the present invention, a solid-state imaging device capable of taking high-quality images, a solid-state imaging device with a short duration of imaging, or the like can be provided. According to one embodiment of the present invention, a low-power-consumption solid-state imaging device or the like can be provided. According to one embodiment of the present invention, a driving method thereof can be provided.

According to one embodiment of the present invention, a solid-state imaging device capable of three-dimensional imaging with a short duration of imaging, a solid-state imaging device capable of high-definition two-dimensional imaging, or an imaging device with high reliability can be provided. According to one embodiment of the present invention, a driving method thereof can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

In the accompanying drawings:
FIG. 12 is a timing chart showing an example of an imaging operation;
FIGS. 29A1, 29A2, 29B1, and 29B2 each illustrate one embodiment of a transistor;
FIGS. 30A1 to 30A3 and 30B1 and 30B2 each illustrate one embodiment of a transistor.

FIGS. 35A1 to 35A3 and 35B1 to 35B3 illustrate structure examples of an imaging device;

DETAILED DESCRIPTION OF THE INVENTION

Figure 1A:
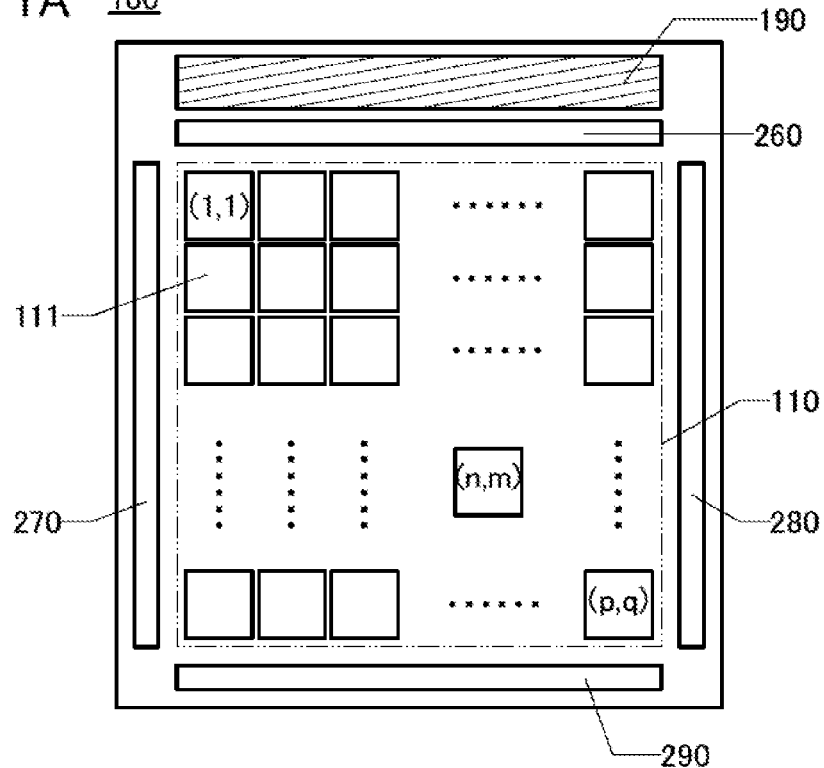
FIGS. 1A and 1B each illustrate a configuration example of an imaging device of one embodiment of the present invention.

Embodiments of the present invention will be described below in detail with reference to the drawings. However, the present invention is not limited to the description below, and it is easily understood by those skilled in the art that modes and details disclosed herein can be modified in various ways. Further, the present invention is not construed as being limited to description of the embodiments. Note that in all drawings used to illustrate the embodiments, portions that are identical or portion having similar functions are denoted by the same reference numerals, and their repetitive description may be omitted.

In addition, in this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" and "wirings" formed in an integrated manner.

For example, in this specification and the like, when it is explicitly described that X and Y are connected, the case where X and Y are electrically connected, the case where X and Y are functionally connected, and the case where X and Y are directly connected are included therein. Accordingly, another element may be provided between elements having a connection relation illustrated in drawings and texts, without limitation on a predetermined connection relation, for example, the connection relation illustrated in the drawings and the texts.

Here, X and Y each denote an object (e.g., a device, an element, a circuit, a wiring, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch has a function of becoming conducting or not conducting (being turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y, even when another circuit is provided between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like)

and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification and the like, a transistor can be formed using a variety of substrates. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, soda lime glass substrate, and the like can be given. For a flexible substrate, a flexible synthetic resin such as plastics typified by polyethylene terephthalate (PET), polyethylene naphthalate (PEN), and polyether sulfone (PES), or acrylic can be used, for example. For an attachment film, polypropylene, polyester, polyvinyl fluoride, polytetrafluoroethylene (PTFE), or polyvinyl chloride can be used, for example. For a base material film, polyester, polyamide, polyimide, an inorganic vapor deposition film, paper, or the like can be used, for example. Specifically, when a transistor is formed using a semiconductor substrate, a single crystal substrate, an SOI substrate, or the like, it is possible to form a transistor with few variations in characteristics, size, shape, or the like and with high current supply capability and a small size. By forming a circuit with the use of such a transistor, power consumption of the circuit can be reduced or the circuit can be highly integrated.

Note that a transistor may be formed using one substrate, and then the transistor may be transferred to another substrate. In addition to the above substrates over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, or the like can be used as a substrate to which the transistor is transferred. By using such a substrate, a transistor with excellent properties or a transistor with low power consumption can be formed, a device with high durability can be formed, heat resistance can be provided, or reduction in weight or thickness can be achieved.

The position, size, range, and the like of each component illustrated in the drawings and the like are not accurately represented in some cases to facilitate understanding of the invention. Therefore, the disclosed invention is not necessarily limited to the position, the size, the range, or the like disclosed in the drawings and the like. For example, in the actual manufacturing process, a resist mask or the like might be unintentionally reduced in size by treatment such as etching, which is not illustrated in some cases for easy understanding.

Especially in a top view (also referred to as a plan view), some components might not be illustrated for easy understanding. In addition, some hidden lines and the like might not be shown.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Further, functions of the source and the drain might be switched depending on operation conditions, e.g., when a transistor having a different polarity is employed or a direction of current flow is changed in circuit operation. Accordingly, it is difficult to define whichever electrode serves as a source or a drain. Thus, the terms "source" and "drain" can be switched in this specification.

In this specification, the term "parallel" indicates that the angle formed between two straight lines is greater than or equal to $-10°$ and less than or equal to $10°$, and accordingly also includes the case where the angle is greater than or equal to −5° and less than or equal to 5°. In addition, the term "perpendicular" or "orthogonal" indicates that the angle formed between two straight lines is greater than or equal to 80° and less than or equal to 100°, and accordingly also includes the case where the angle is greater than or equal to 85° and less than or equal to 95°.

A voltage usually refers to a potential difference between a given potential and a reference potential (e.g., a source potential or a ground potential (a GND potential)). A voltage can be referred to as a potential and vice versa.

Note that a "semiconductor" includes characteristics of an "insulator" in some cases when the conductivity is sufficiently low, for example. Thus, a "semiconductor" and an "insulator" can be replaced with each other. Furthermore, a "semiconductor" and an "insulator" cannot be strictly distinguished from each other because a border between the "semiconductor" and the "insulator" is not clear. Accordingly, a "semiconductor" in this specification can be replaced with an "insulator" in some cases.

Furthermore, a "semiconductor" includes characteristics of a "conductor" in some cases when the conductivity is sufficiently high, for example. Thus, a "semiconductor" and a "conductor" can be replaced with each other. Furthermore, a "semiconductor" and a "conductor" cannot be strictly distinguished from each other because a border between the "semiconductor" and the "conductor" is not clear. Accordingly, a "semiconductor" in this specification can be replaced with a "conductor" in some cases.

Note that an impurity in a semiconductor refers to, for example, elements other than the main components of the semiconductor. For example, an element with a concentration lower than 0.1 atomic % can be regarded as an impurity. When an impurity is contained, the density of states (DOS) in a semiconductor may be increased, the carrier mobility may be decreased, or the crystallinity may be decreased. In the case where the semiconductor is an oxide semiconductor, examples of an impurity that changes the characteristics of the semiconductor include Group 1 elements, Group 2 elements, Group 14 elements, Group 15 elements, and transition metals other than the main components; specific examples are hydrogen (included in water), lithium, sodium, silicon, boron, phosphorus, carbon, and nitrogen. In the case of an oxide semiconductor, oxygen vacancy may be formed by entry of impurities such as hydrogen. Further, in the case where the semiconductor is silicon, examples of an impurity that changes characteristics of the semiconductor include oxygen, Group 1 elements except hydrogen, Group 2 elements, Group 13 elements, and Group 15 elements.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. In addition, a term with an ordinal number in this specification and the like might be provided with a different ordinal number in a claim. Moreover, a term with an ordinal number in this specification and the like might not be provided with any ordinal number in a claim.

Note that in this specification, the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, the channel width of one transistor is not limited to one value in some cases. Therefore, in this specification, a channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

In this specification and the like, the high power supply potential $V_{DD}$ (hereinafter also simply referred to as $V_{DD}$ or H potential) is a power supply potential higher than the low power supply potential $V_{SS}$. The low power supply potential $V_{SS}$ (hereinafter also simply referred to as $V_{SS}$ or L potential) is a power supply potential lower than the high power supply potential $V_{DD}$. In addition, a ground potential can be used as $V_{DD}$ or $V_{SS}$. For example, in the case where a ground potential is used as $V_{DD}$, $V_{SS}$ is lower than the ground potential, and in the case where a ground potential is used as $V_{SS}$, $V_{DD}$ is higher than the ground potential.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

In this embodiment, an imaging device of one embodiment of the present invention will be described with reference to the drawings.

[Configuration Example of Imaging Device 100]

FIG. 1A is a plan view illustrating a configuration example of an imaging device 100 of one embodiment of the present invention. The imaging device 100 includes a pixel portion 110, and peripheral circuits (a first peripheral circuit 260, a second peripheral circuit 270, a third peripheral circuit 280, and a fourth peripheral circuit 290) for driving the pixel portion 110. The pixel portion 110 includes a plurality of pixels 111 arranged in a matrix with p rows and q columns (p and q are each a natural number greater than or equal to 2). The first to fourth peripheral circuits (260 to 290) are connected to the plurality of pixels 111 and each have a function of supplying a signal for driving the plurality of pixels 111. In this specification and the like, the first to fourth peripheral circuits (260 to 290) and the like are referred to as "peripheral circuit" or "driving circuit" in some cases. For example, the first peripheral circuit 260 can be regarded as part of the peripheral circuit.

The imaging device 100 preferably includes a light source 190. The light source 190 can emit light P1.

The peripheral circuit includes at least one of a logic circuit, a switch, a buffer, an amplifier circuit, and a converter circuit. The peripheral circuit may be formed over a substrate over which the pixel portion 110 is formed. Alternatively, a part or whole of the peripheral circuit may be fabricated using a semiconductor device such as an IC. Note that in the peripheral circuit, at least one of the first to fourth peripheral circuits (260 to 290) may be omitted. For example, when one of the first peripheral circuit 260 and the fourth peripheral circuit 290 additionally has a function of the other of the first peripheral circuit 260 and the fourth peripheral circuit 290, the other of the first peripheral circuit 260 and the fourth peripheral circuit 290 may be omitted. For another example, when one of the second peripheral circuit 270 and the third peripheral circuit 280 additionally has a function of the other of the second peripheral circuit 270 and the third peripheral circuit 280, the other of the second peripheral circuit 270 and the third peripheral circuit 280 may be omitted. For another example, when one of the first to fourth peripheral circuits (260 to 290) additionally has functions of the other circuits, the other circuits may be omitted.

Figure 1B:
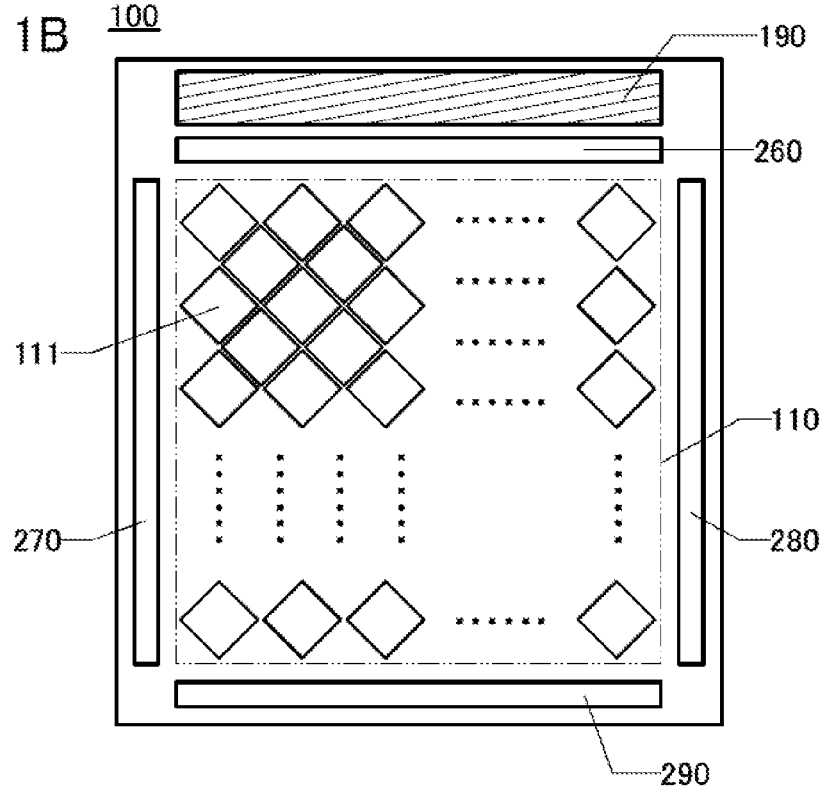

As illustrated in FIG. 1B, the pixels 111 may be provided to be inclined in the pixel portion 110 included in the imaging device 100. When the pixels 111 are inclined, the space between the pixels in the row direction and the column direction (pitch) can be decreased. Accordingly, the quality of an image taken with the imaging device 100 can be improved.

For example, the first peripheral circuit 260 or the fourth peripheral circuit 290 has a function of processing analog signals output from the pixels 111. For example, the first peripheral circuit 260 may include a signal processing circuit 271, a column driver circuit 272, an output circuit 273, and the like, as shown in FIG. 11.

Figure 11:
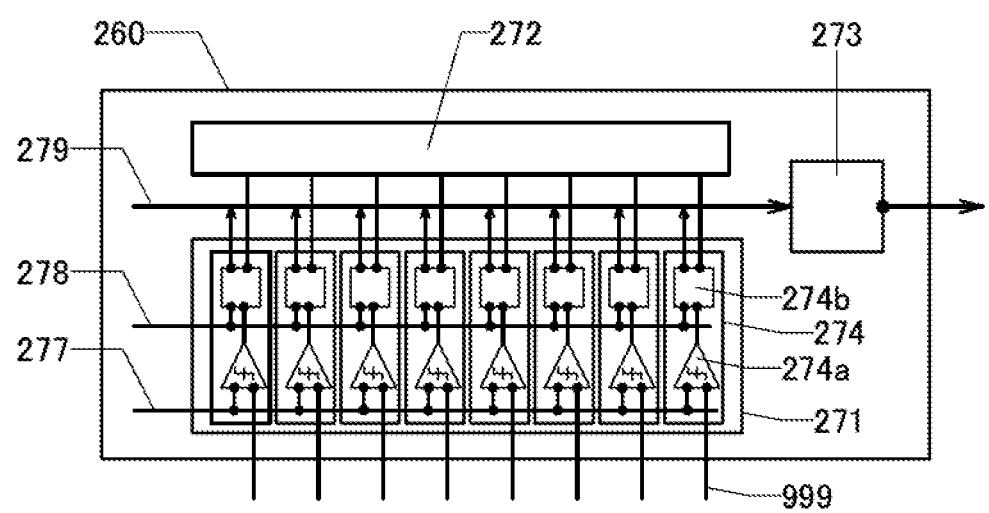
FIG. 11 illustrates a configuration example of a peripheral circuit.
Figure 13A:
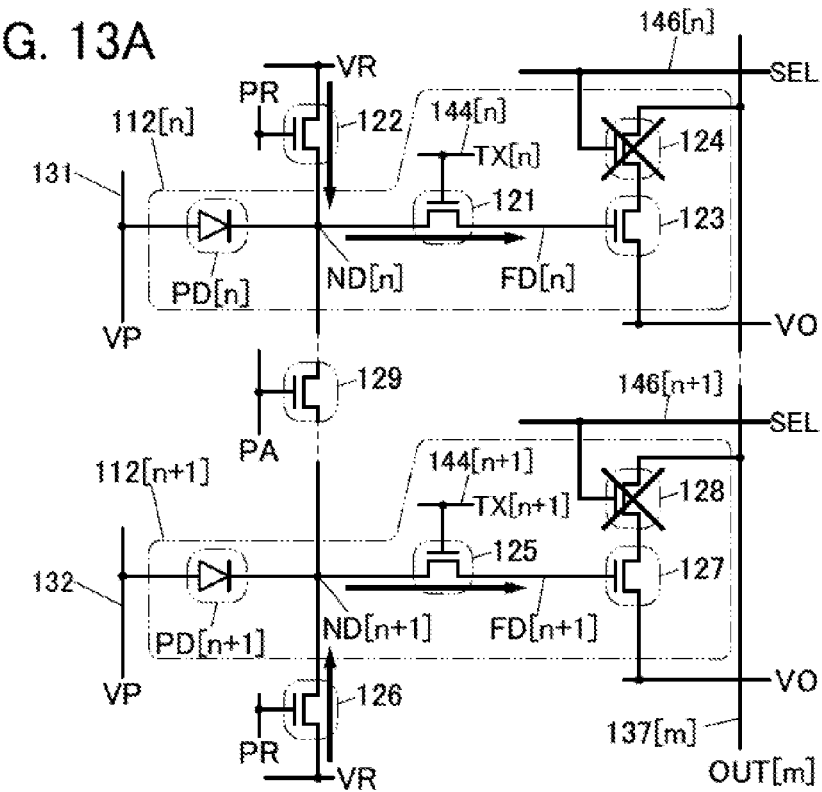
FIGS. 13A and 13B are each a circuit diagram showing an example of an imaging operation.
Figure 13B:
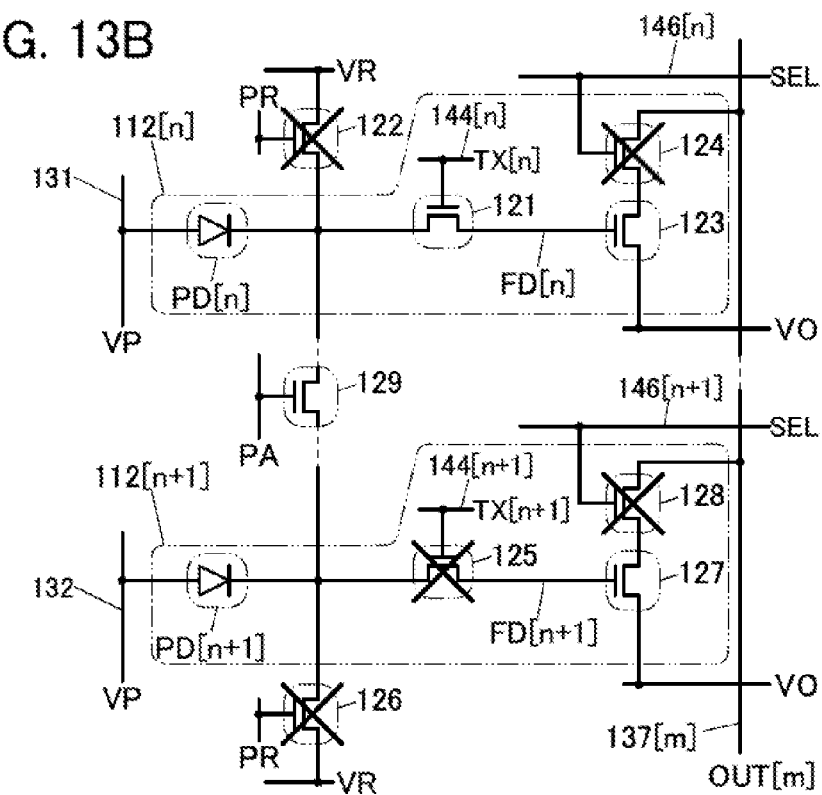
Figure 14A:
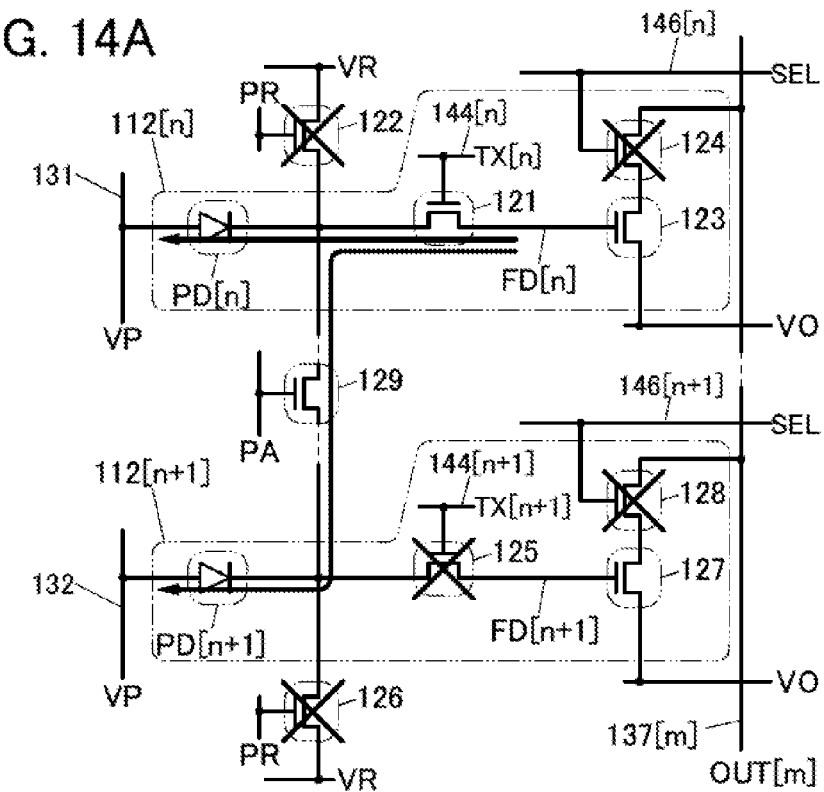
FIGS. 14A and 14B are each a circuit diagram showing an example of an imaging operation.
Figure 14B:
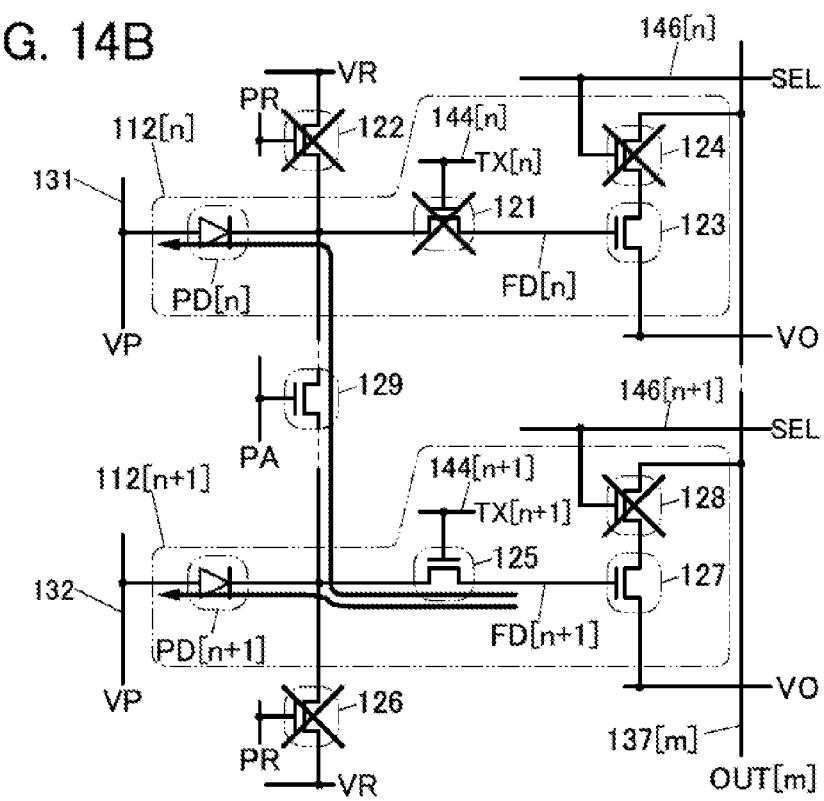
Figure 15A:
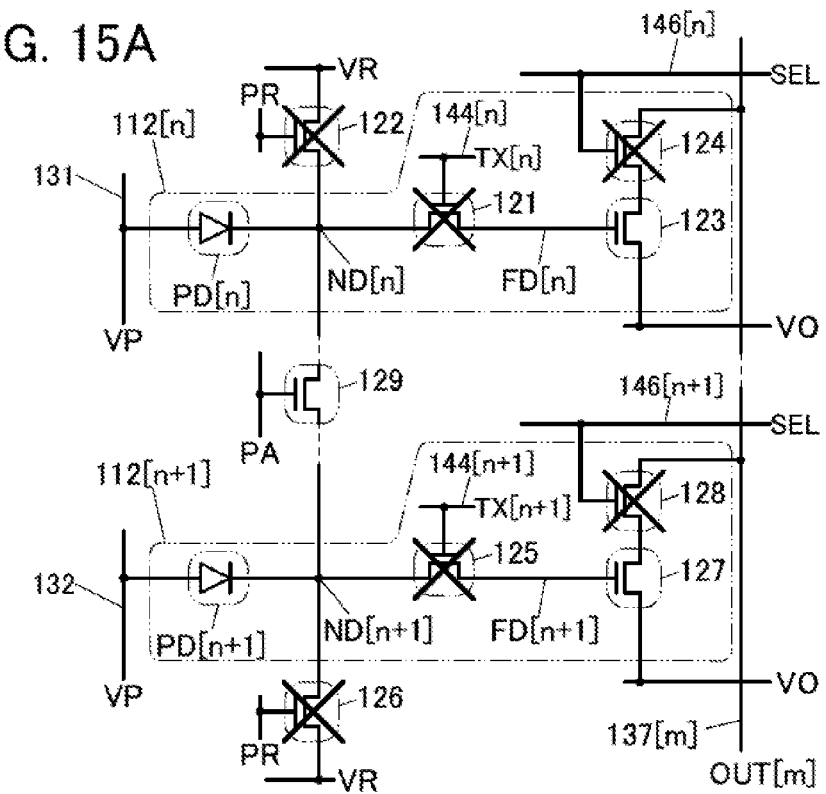
FIGS. 15A and 15B are each a circuit diagram showing an example of an imaging operation.
Figure 15B:
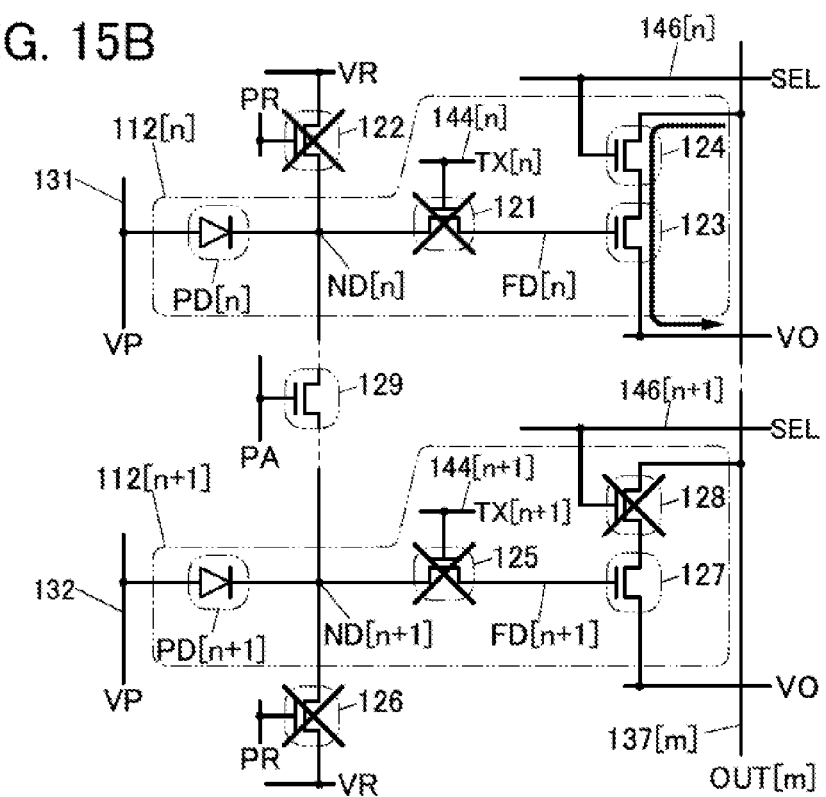
Figure 16A:
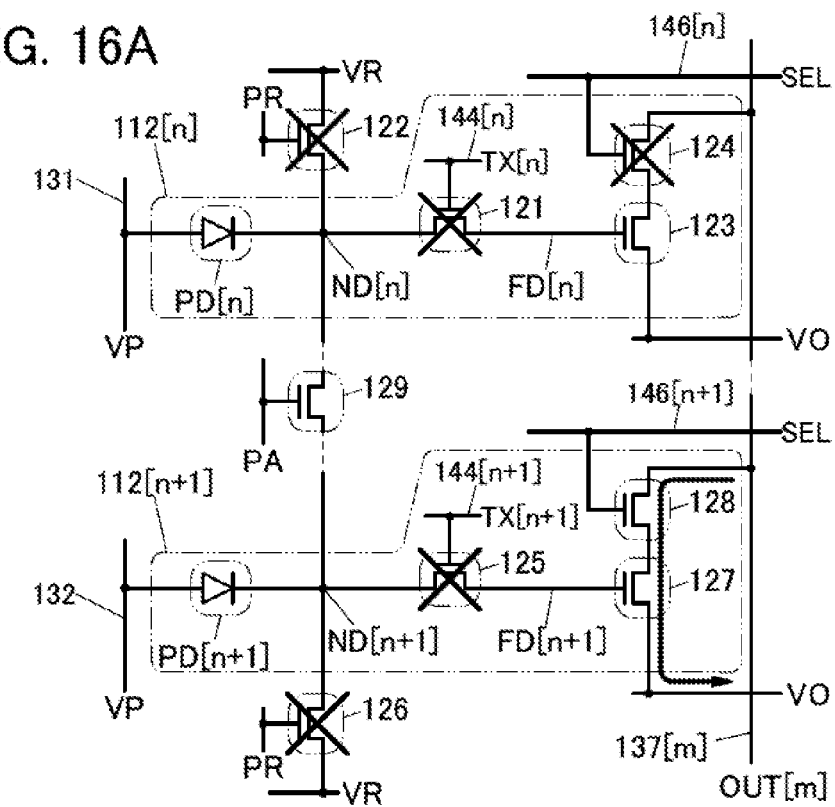
FIGS. 16A and 16B are each a circuit diagram showing an example of an imaging operation.
Figure 16B:
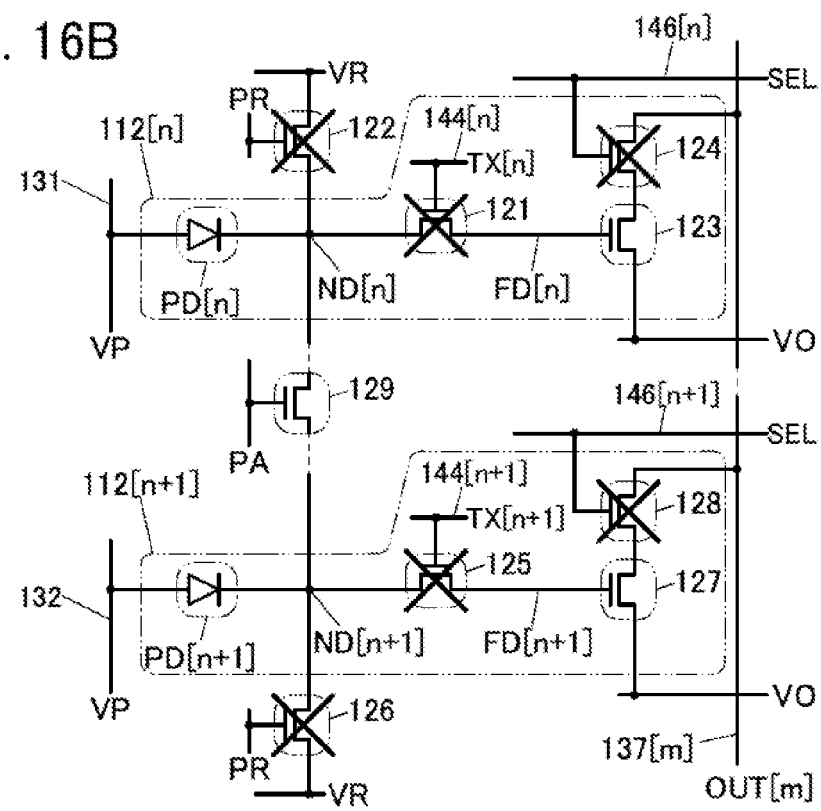

The signal processing circuit 271 shown in FIG. 11 includes circuits 274 each of which is provided for each column. The circuit 274 can have a function of performing signal processing such as removal of noise and analog-digital conversion. The circuit 274 shown in FIG. 11 has a function of analog-digital conversion. The signal processing circuit 271 can function as a column-parallel (column type) analog-digital conversion device.

The circuit 274 includes a comparator 274a and a counter circuit 274b. The comparator 274a has a function of comparing potentials of an analog signal input from a wiring 999 that is provided for each column and a reference potential signal (e.g., a ramp signal) input from a wiring 277. A clock signal is input to the counter circuit 274b from a wiring 278. The counter circuit 274b has a function of measuring the length of a period in which a first value is output owing to the comparison operation in the comparator 274a and holding the measurement result as an N-bit digital value.

The column driver circuit 272 is also referred to as a column selection circuit, a horizontal driver circuit, or the like. The column driver circuit 272 generates a selection signal for selecting a column from which a signal is read. The column driver circuit 272 can be formed using a shift register or the like. Columns are sequentially selected by the column driver circuit 272, and a signal output from the circuit 274 in the selected column is input to the output circuit 273 via a wiring 279. The wiring 279 can function as a horizontal transfer line.

A signal input to the output circuit 273 is processed in the output circuit 273, and is output outside the imaging device 100. The output circuit 273 can be formed using a buffer circuit, for example. The output circuit 273 may have a function of controlling the timing at which a signal is output outside the imaging device 100.

The second peripheral circuit 270 or the third peripheral circuit 280 has a function of generating and outputting a selection signal for selecting a pixel 111 from which a signal is read. Note that the second peripheral circuit 270 or the third peripheral circuit 280 may also be referred to as a row selection circuit or a vertical driver circuit.

As shown in FIGS. 35A1 and 35B1, the imaging device 100 may be bent. FIG. 35A1 illustrates a state in which the imaging device 100 is bent in the direction of two-dot chain line X1-X2. FIG. 35A2 is a cross-sectional view illustrating a portion indicated by two-dot chain line X1-X2 in FIG. 35A1. FIG. 35A3 is a cross-sectional view illustrating a portion indicated by two-dot chain line Y1-Y2 in FIG. 35A1.

FIG. 35B1 illustrates a state where the imaging device 100 is bent in the direction of two-dot chain line X3-X4 and the direction of two-dot chain line Y3-Y4. FIG. 35B2 is a cross-sectional view illustrating a portion indicated by two-dot chain line X3-X4 in FIG. 35B1. FIG. 35B3 is a cross-sectional view illustrating a portion indicated by two-dot chain line Y3-Y4 in FIG. 35B1.

The bent imaging device 100 enables the curved field and astigmatism to be reduced. Thus, the optical design of a lens and the like, which is used in combination of the imaging device 100, can be facilitated. For example, the number of lenses used for aberration correction can be reduced; accordingly, a reduction of size or weight of an imaging device or semiconductor device using the imaging device 100 can be facilitated. In addition, the quality of a taken image can be improved.

[Structure Example of Pixel 111]

The pixel 111 included in the imaging device 100 is formed with a plurality of subpixels 112, and each subpixel 112 is combined with a filter which transmits light with a specific wavelength band (color filter), whereby data for achieving color image display can be obtained.

Figure 2A:
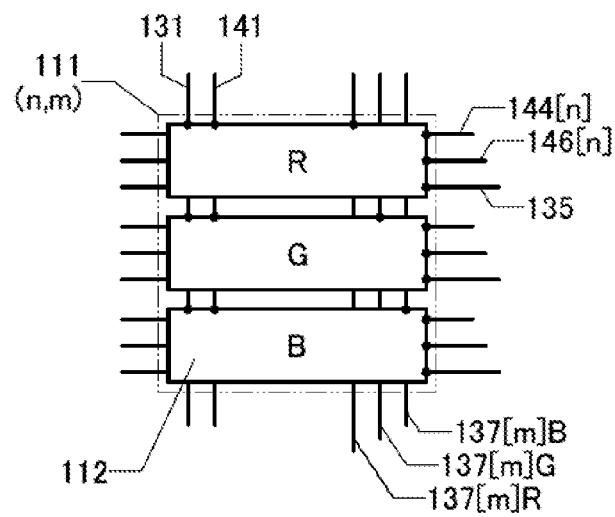
FIGS. 2A and 2B each illustrate a configuration example of a pixel.

FIG. 2A is a plan view showing an example of the pixel 111 with which a color image is obtained. The pixel 111 illustrated in FIG. 2A includes a subpixel 112 provided with a color filter transmitting light with a red (R) wavelength band (hereinafter also referred to as "subpixel 112R"), a subpixel 112 provided with a color filter transmitting light with a green (G) wavelength band (hereinafter also referred to as "subpixel 112G"), and a subpixel 112 provided with a color filter transmitting light with a blue (B) wavelength band (hereinafter also referred to as "subpixel 112B"). The subpixel 112 can function as a photosensor.

The subpixels 112 (the subpixel 112R, the subpixel 112G, and the subpixel 112B) are electrically connected to a wiring 131, a wiring 141, a wiring 144, a wiring 146, and a wiring 135. In addition, the subpixel 112R, the subpixel 112G, and the subpixel 112B are connected to respective wirings 137 which are independently provided. In this specification and the like, for example, the wiring 144 and the wiring 146 that are connected to the pixel 111 in the n-th row are referred to as a wiring 144[n] and a wiring 146[n]. For example, the wiring 137 connected to the pixel 111 in the m-th column is referred to as a wiring 137[m]. Note that in FIG. 2A, the wirings 137 connected to the subpixel 112R, the subpixel 112G, and the subpixel 112B in the pixel 111 in the m-th column are referred to as a wiring 137[m]R, a wiring 137[m]G, and a wiring 137[m]B, respectively. The subpixels 112 are electrically connected to the peripheral circuit through the above wirings.

Figure 2B:
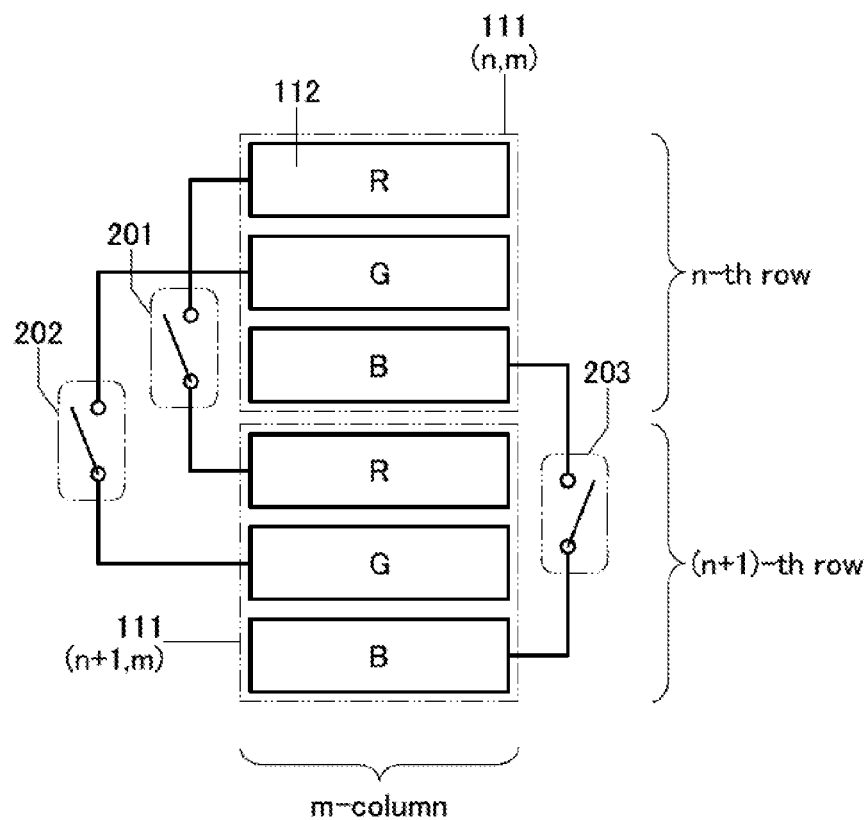

The imaging device 100 in this embodiment has a structure in which the subpixels 112, which are provided with color filters transmitting light with the same wavelength band and are arranged in the pixels 111 adjacent to each other, are connected to each other via a switch. FIG. 2B shows a connection example of the subpixels 112: the subpixel 112 in the pixel 111 arranged in the n-th (n is a natural number greater than or equal to 1 and less than or equal to p) row and the m-th (m is a natural number greater than or equal to 1 and less than or equal to q) column and the subpixel 112 in the adjacent pixel 111 arranged in the (n+1)-th row and the m-th column. In FIG. 2B, the subpixel 112R arranged in the n-th row and the m-th column and the subpixel 112R arranged in the (n+1)-th row and the m-th column are connected to each other via a switch 201. The subpixel 112G arranged in the n-th row and the m-th column and the subpixel 112G arranged in the (n+1)-th row and the m-th column are connected to each other via a switch 202. The subpixel 112B arranged in the n-th row and the m-th column and the subpixel 112B arranged in the (n+1)-th row and the m-th column are connected to each other via a switch 203.

Figure 3A:
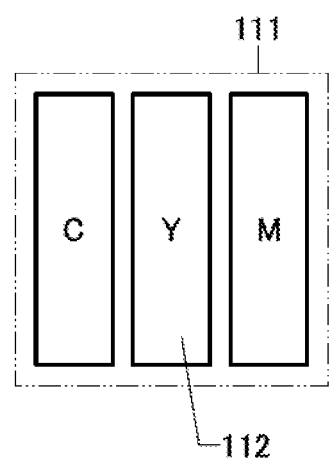
FIGS. 3A to 3D each illustrate a configuration example of a pixel.

The color filter used in the subpixel 112 is not limited to red (R), green (G), and blue (B) color filters, and as illustrated in FIG. 3A, color filters that transmit light of cyan (C), yellow (Y), and magenta (M) may be used. The subpixels 112 that sense light with three different wavelength bands are provided in one pixel 111, whereby a full-color image can be obtained.

Figure 3B:
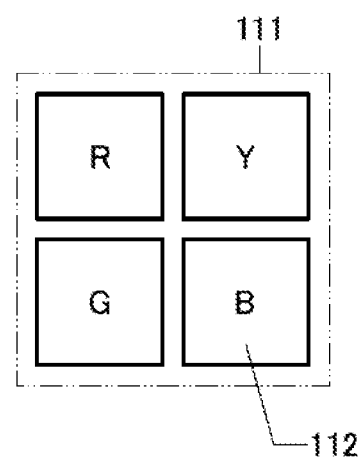
Figure 3C:
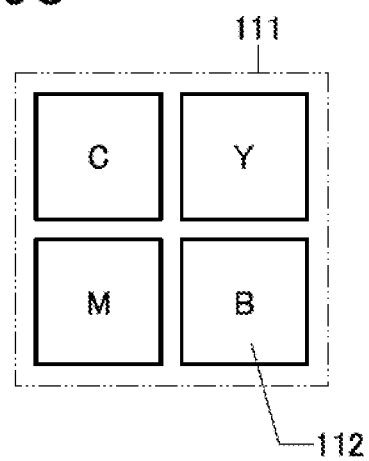

FIG. 3B shows the pixel 111 including the subpixel 112 provided with a color filter transmitting yellow (Y) light, in addition to the subpixels 112 provided with the color filters transmitting red (R), green (G), and blue (B) light. FIG. 3C illustrates the pixel 111 including the subpixel 112 provided with a color filter transmitting blue (B) light, in addition to the subpixels 112 provided with the color filters transmitting cyan (C), yellow (Y), and magenta (M) light. When the subpixels 112 sensing light with four different wavelength bands are provided in one pixel 111, the reproducibility of colors of an obtained image can be increased.

Figure 3D:
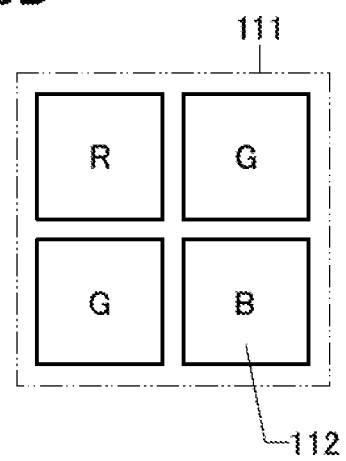

For example, in FIG. 2A, in regard to the subpixel 112 sensing a red wavelength band, the subpixel 112 sensing a green wavelength band, and the subpixel 112 sensing a blue wavelength band, the pixel number ratio (or the ratio of light receiving area) thereof is not necessarily 1:1:1. The pixel number ratio (the ratio of light receiving area) of red and green to blue may be 1:2:1 (Bayer arrangement), as illustrated in FIG. 3D. Alternatively, the pixel number ratio (the ratio of light receiving area) of red and green to blue may be 1:6:1.

Although the number of subpixels 112 provided in the pixel 111 may be one, two or more subpixels are preferably provided. For example, when two or more subpixels 112 sensing the same wavelength band are provided, the redundancy is increased, and the reliability of the imaging device 100 can be increased.

When an infrared (IR) filter that transmits infrared light and absorbs or reflects visible light is used as the filter, the imaging device 100 that senses infrared light can be fabricated.

Furthermore, when a neutral density (ND) filter (dark filter) is used as a filter 602, output saturation which occurs when a large amount of light is incident on a photoelectric conversion element (light-receiving element) can be prevented. With a combination of ND filters with different dimming capabilities, the dynamic range of the imaging device can be increased.

Besides the above-described filter, the pixel 111 may be provided with a lens. An arrangement example of the pixel 111, the filter 602, and a lens 600 is described with cross-sectional views in FIGS. 4A and 4B. With the lens 600, the photoelectric conversion element can receive incident light efficiently. Specifically, as illustrated in FIG. 4A, light 660 is incident on a photoelectric conversion element 220 through the lens 600, the filter 602 (a filter 602R, a filter 602G, and a filter 602B), a pixel circuit 230, and the like formed in the pixel 111.

However, as illustrated in a region surrounded by a two-dot chain line, part of light 660 indicated by arrows may be blocked by part of a wiring layer 604. Thus, a preferred structure is such that the lens 600 and the filter 602 are provided on the photoelectric conversion element 220 side, as illustrated in FIG. 4B, whereby the incident light can be efficiently received by the photoelectric conversion element 220. When the light 660 is incident on the photoelectric conversion element 220 from the photoelectric conversion element 220 side, the imaging device 100 with high sensitivity can be provided.

Figure 4A:
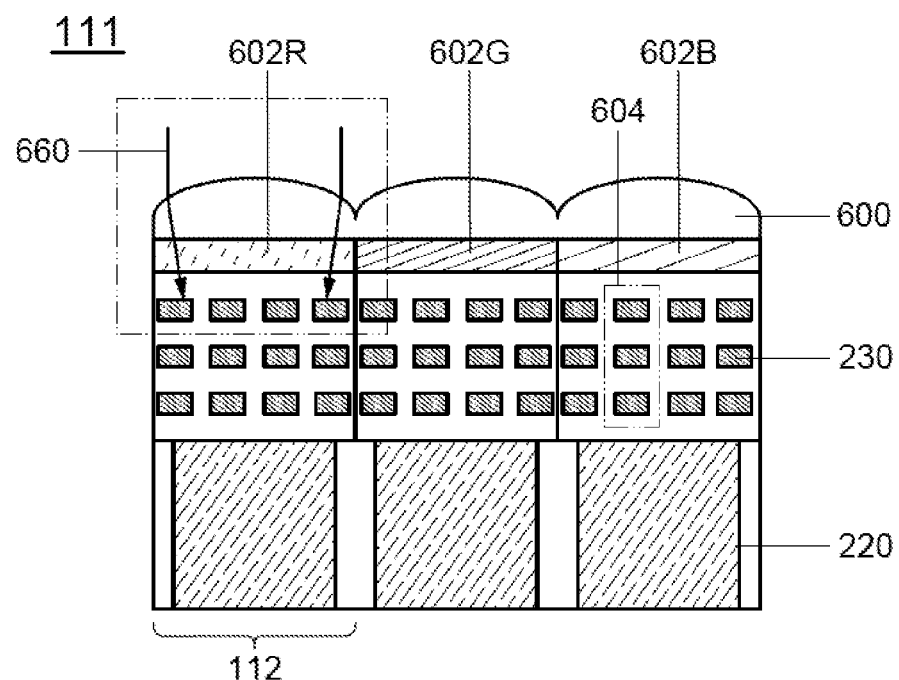
FIGS. 4A and 4B each illustrate a structure example of a pixel.
Figure 4B:
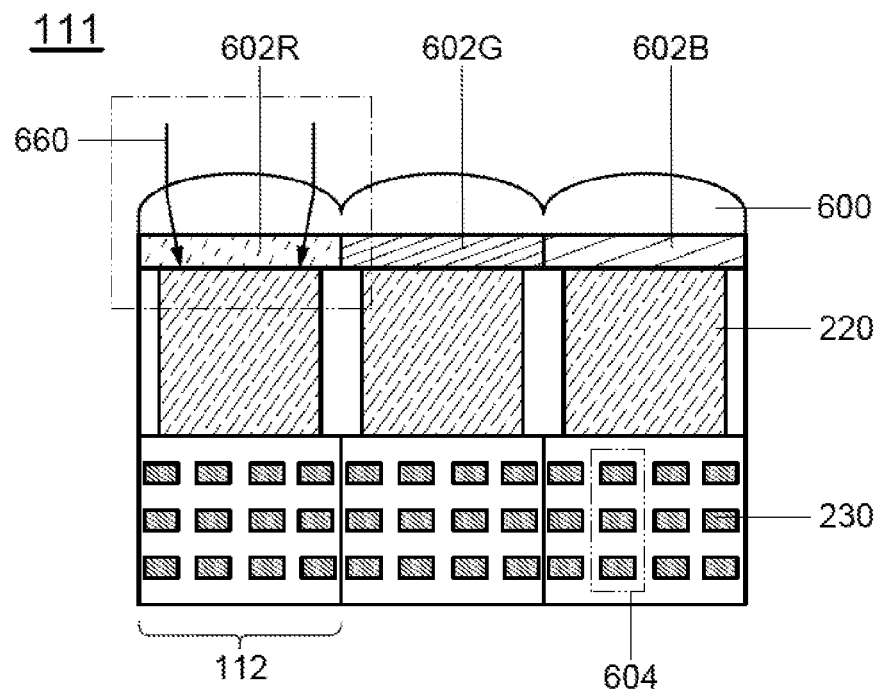

As the photoelectric conversion element 220 illustrated in FIGS. 4A and 4B, a photoelectric conversion element in which a PIN junction is formed may be used. A photoelectric conversion element in which a PIN junction is formed will be described in detail in Embodiment 3.

The photoelectric conversion element 220 may be formed using a material capable of generating electric charge by absorbing radiation. Examples of a material capable of generating electrical charge by absorbing radiation include selenium, lead iodide, mercury iodine, gallium arsenide, CdTe, and CdZn.

The use of selenium for the photoelectric conversion element 220 enables the photoelectric conversion element 220 to have a favorable light absorption coefficient over a wide wavelength range including X-rays and gamma rays in addition to visible light, ultraviolet light, and infrared rays.

One pixel 111 included in the imaging device 100 may include a subpixel with a first filter in addition to the subpixels illustrated in FIGS. 2A and 2B and FIGS. 3A to 3D. An example is illustrated in FIGS. 10A and 10B.

Figure 10A:
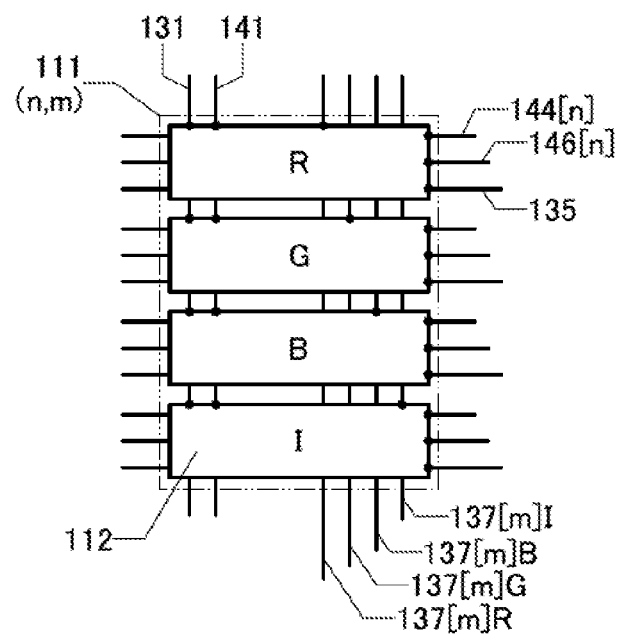
FIGS. 10A and 10B illustrate a structure example of a pixel.

FIG. 10A shows an example in which the pixel 111 shown in FIGS. 2A and 2B includes a subpixel provided with a filter 602I (hereinafter referred to as subpixel 112I), in addition to the subpixel 112R, the subpixel 112G, and the subpixel 112B. It is preferable that a filter that transmits light with the wavelength band that the light P1 has be provided as the filter 602I. In the case where light with an infrared wavelength band is used as the light P1, for example, a color filter transmitting light with an infrared wavelength band can be used as the filter 602I.

Figure 10B:
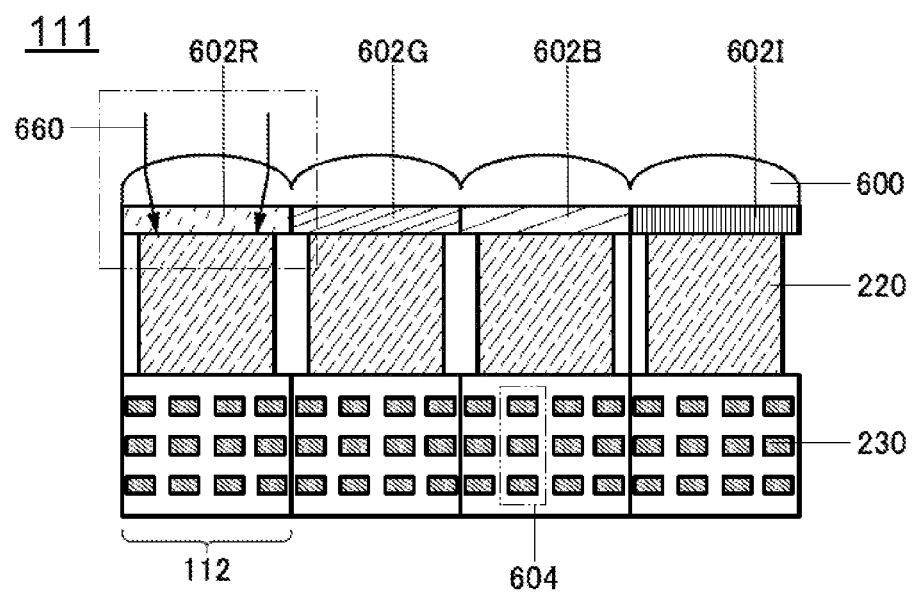

The cross-sectional view in FIG. 10B shows an example in which the pixel 111 includes four subpixels 112: the subpixel 112R, the subpixel 112G, the subpixel 112B, and the subpixel 112I provided with the filter 602R, the filter 602G, the filter 602B, and the filter 602I, respectively. In addition, the pixel 111 is provided with the lens 600.

[Circuit Configuration Example of Subpixel 112]

Figure 5:
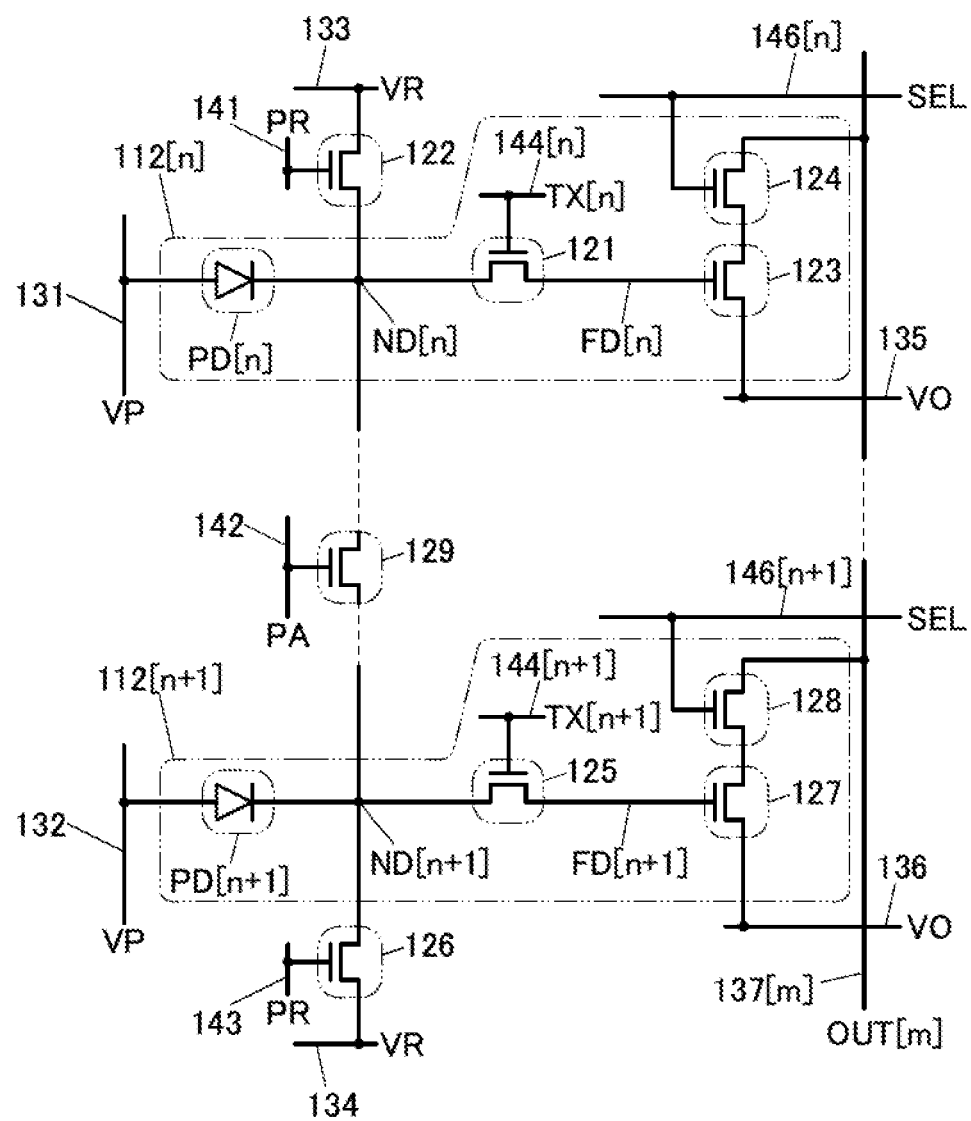
FIG. 5 illustrates a circuit configuration example of a pixel.

Next, a specific circuit configuration example of the subpixel 112 will be described with reference to a circuit diagram in FIG. 5. FIG. 5 shows a circuit configuration example in which a subpixel 112[$n$] in the pixel 111 in an n-th row is electrically connected to a subpixel 112[$n+1$] in the pixel 111 in an (n+1)-th row through a transistor 129. The transistor 129 can function as the switch 201, the switch 202, or the switch 203.

FIG. 5 shows an example in which photodiodes are used as photoelectric conversion elements.

In the circuit diagram shown in FIG. 5, specifically, the subpixel 112[$n$] in the pixel 111 in the n-th row includes a photodiode PD[n] (photoelectric conversion element), a transistor 121, a transistor 123, and a transistor 124. The subpixel 112[$n+1$] in the pixel 111 in the (n+1)-th row includes a photodiode PD[n+1], a transistor 125, a transistor 127, and a transistor 128.

In this embodiment, the case where n-channel transistors are used as the transistors 121 to 129 will be described. Thus, each of the transistors 121 to 129 has electrical conduction (in an on state) between a source and a drain when a signal supplied to a gate is at H potential, and the transistors 121 to 129 have no electrical conduction (in an off state) when the signal is at L potential.

However, one embodiment of the present invention is not limited to the above, and p-channel transistors can be used as the transistors 121 to 129. Alternatively, n-channel transistors and p-channel transistors may be used in combination as appropriate.

In the circuit configuration in FIG. 5, one of an anode and a cathode of the photodiode PD[n] is electrically connected to a wiring 131 from which a potential VP can be supplied. The other of the anode and the cathode of the photodiode PD[n], one of a source and a drain of the transistor 121, and one of a source and a drain of a transistor 122 are electrically connected to a node ND[n]. The other of the source and the drain of the transistor 122 is electrically connected to a wiring 133 from which a potential VR can be supplied. A gate of the transistor 122 is electrically connected to a wiring 141 from which a potential PR can be supplied. The other of the source and the drain of the transistor 121 and a gate of the transistor 123 are electrically connected to a node FD[n] which is a charge accumulation region. A gate of the transistor 121 is electrically connected to a wiring 144[$n$] from which a potential TX[n] can be supplied. One of a source and a drain of the transistor 123 is electrically connected to a wiring 135 from which a potential VO can be supplied, and the other of the source and the drain of the transistor 123 is electrically connected to one of a source and a drain of the transistor 124. The other of the source and the drain of the transistor 124 is electrically connected to a wiring 137[$m$], and a gate of the transistor 124 is electrically connected to a wiring 146[$n$] from which a potential SEL can be supplied. One of a source and a drain of the transistor 129 is electrically connected to the node ND[n], and a gate of the transistor 129 is electrically connected to a wiring 142 from which a potential PA can be supplied.

One of an anode and a cathode of the photodiode PD[n+1] is electrically connected to a wiring 132 from which the potential VP can be supplied. The other of the anode and the cathode of the photodiode PD[n+1], one of a source and a drain of the transistor 125, and one of a source and a drain of a transistor 126 are electrically connected to a node ND[n+1] which is a charge accumulation region. The other of the source and the drain of the transistor 126 is electrically connected to a wiring 134 from which the potential VR can be supplied. A gate of the transistor 126 is electrically connected to a wiring 143 from which the potential PR can be supplied. The other of the source and the drain of the transistor 125 and a gate of the transistor 127 are electrically connected to a node FD[n+1]. A gate of the transistor 125 is electrically connected to a wiring 144[n+1] from which the potential TX[n+1] can be supplied. One of a source and a drain of the transistor 127 is electrically connected to a wiring 136 from which the potential VO can be supplied. The other of the source and the drain of the transistor 127 is electrically connected to one of a source and a drain of the transistor 128. The other of the source and the drain of the transistor 128 is electrically connected to the wiring 137[$m$]. A gate of the transistor 128 is electrically connected to a wiring 146[n+1] from which the potential SEL can be supplied. The other of the source and the drain of the transistor 129 is electrically connected to the node ND[n+1].

The wiring 131 and the wiring 132 may be one common wiring although they are separate wirings in FIG. 5. The wiring 141 and the wiring 143 may be one common wiring although they are separate wirings in FIG. 5. The wiring 135 and the wiring 136 may be one common wiring although they are separate wirings in FIG. 5.

Note that although the photodiodes are used as photoelectric conversion elements in FIG. 5, one embodiment of the present invention is not limited thereto as long as elements capable of photoelectric conversion are used.

Operation Example 1

Next, an example of imaging operation for taking a two-dimensional image by the imaging device 100 with a global shutter system will be described with reference to FIG. 6, FIGS. 7A and 7B, FIGS. 8A and 8B, and FIGS. 9A and 9B. The imaging with a global shutter system can be performed in the following manner: a reset operation and an accumulation operation are concurrently performed in all of the subpixels 112, and a reading operation is sequentially performed. As an operation example of the subpixels 112, description will be made with reference to the subpixel 112[$n$] and the subpixel 112[$n$+1].

Figure 6:
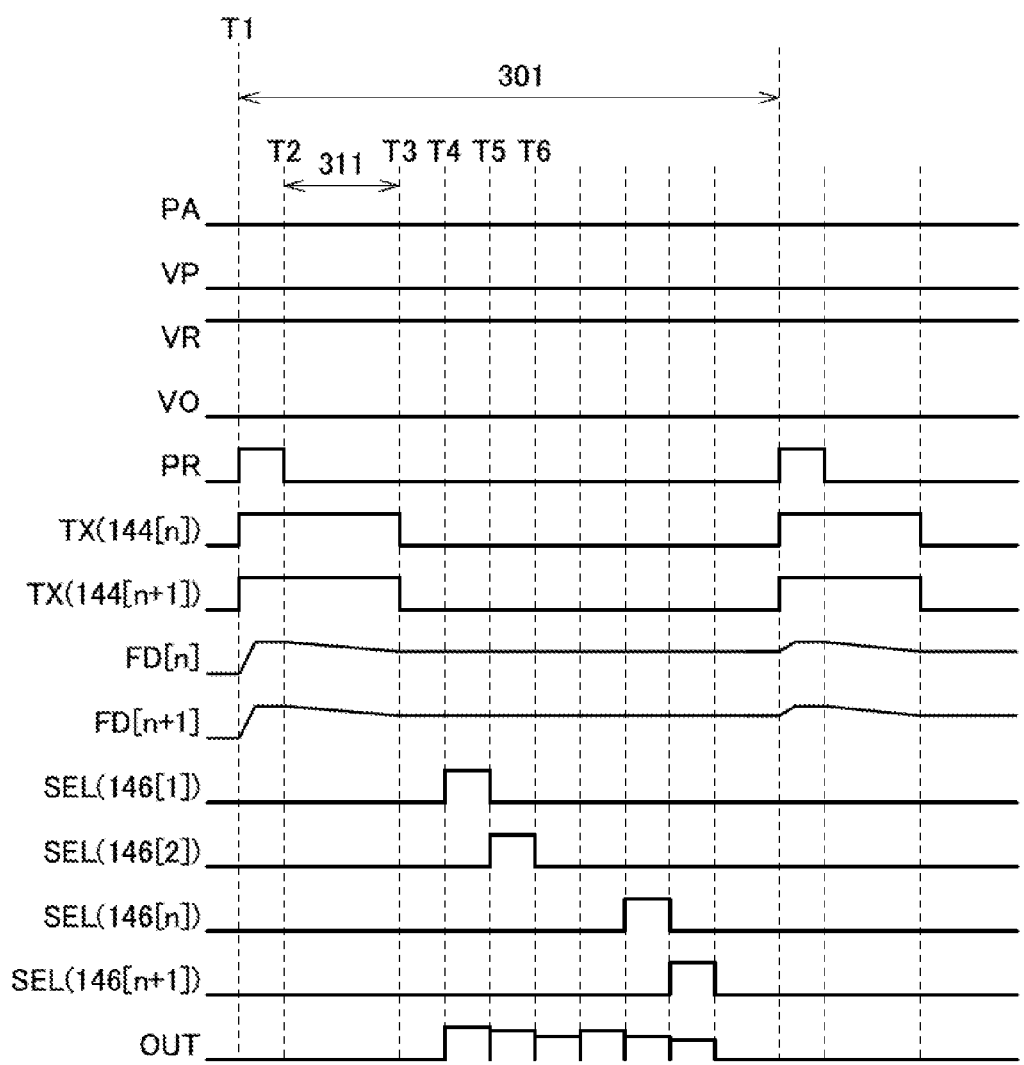
FIG. 6 is a timing chart showing an example of an imaging operation.
Figure 7A:
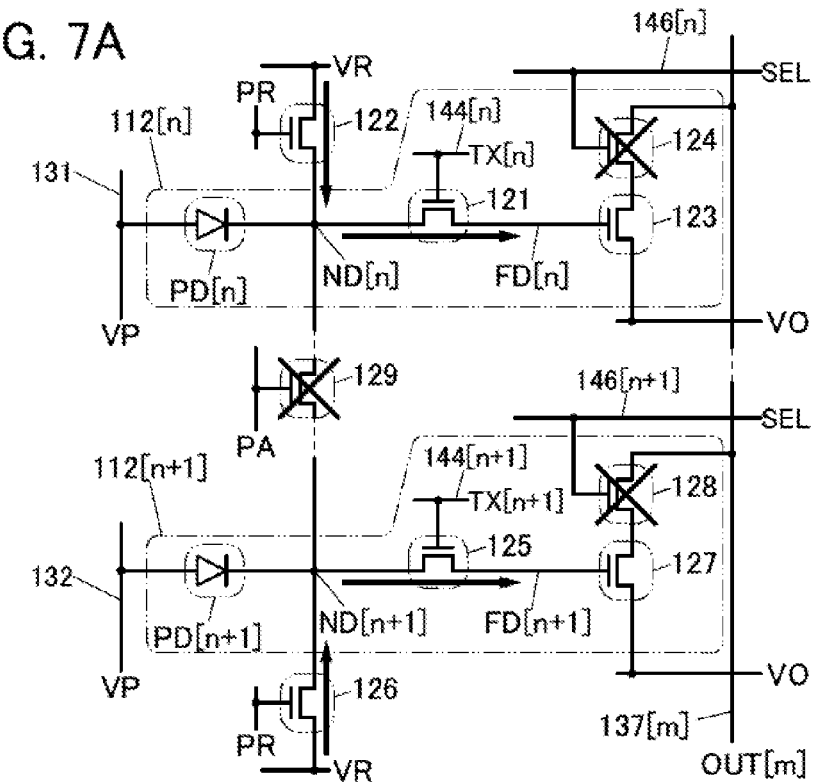
FIGS. 7A and 7B are each a circuit diagram showing an example of an imaging operation.
Figure 7B:
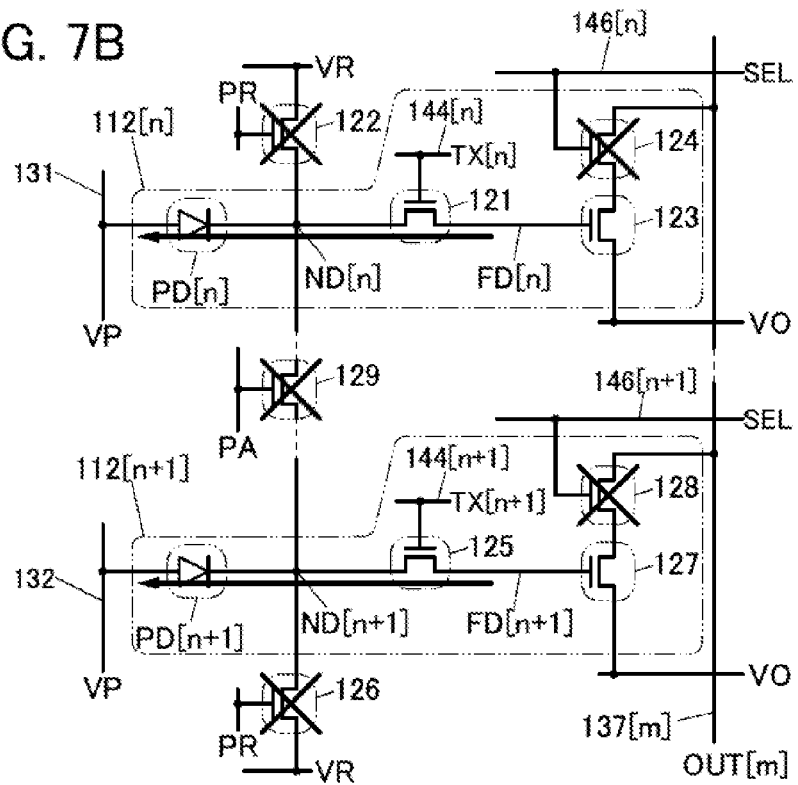
Figure 8A:
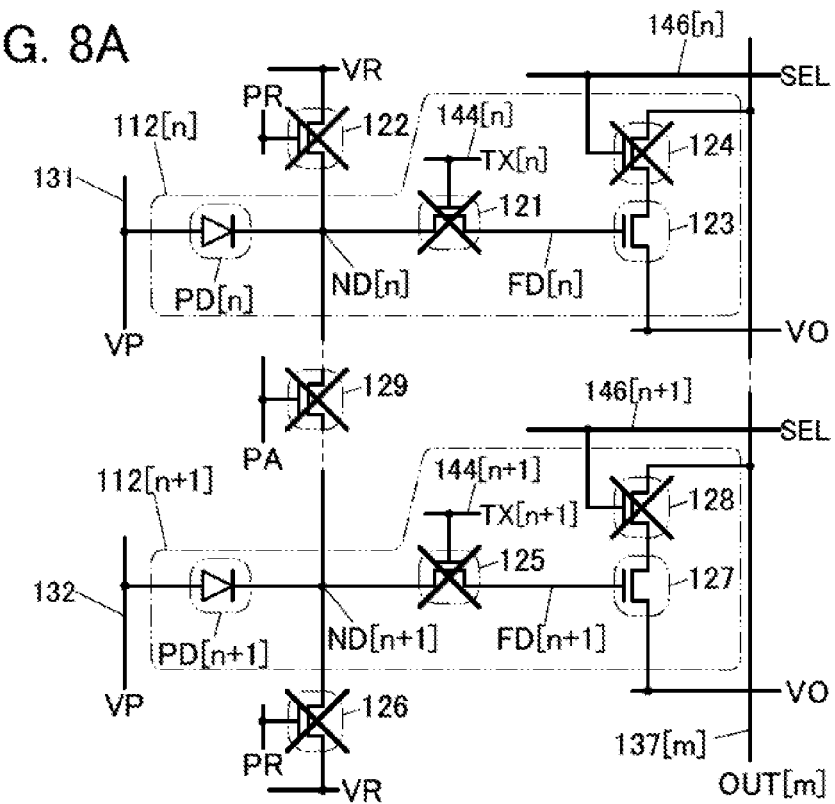
FIGS. 8A and 8B are each a circuit diagram showing an example of an imaging operation.
Figure 8B:
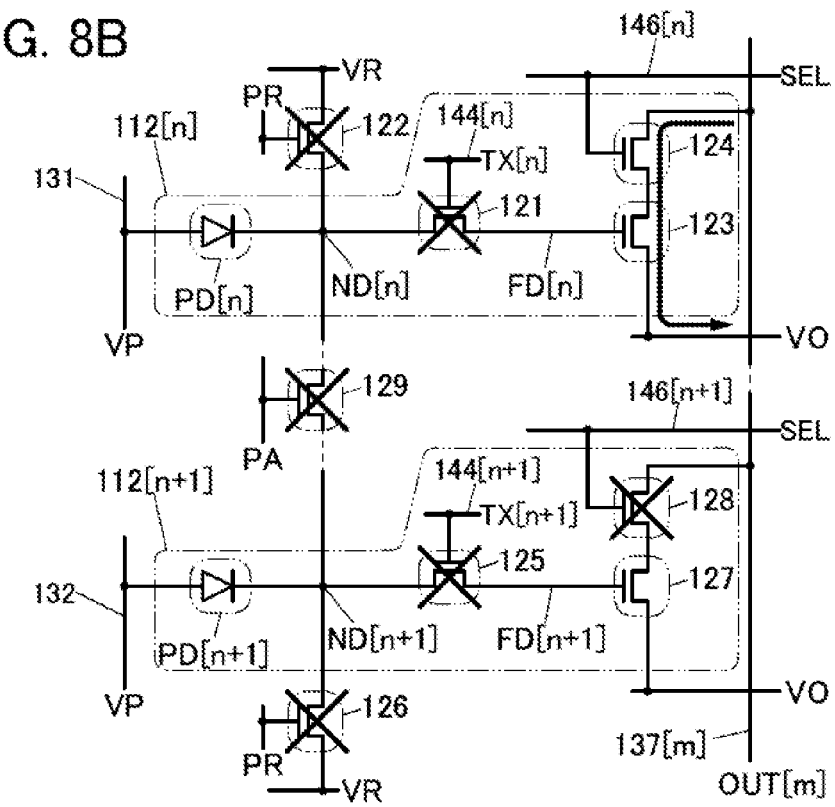
Figure 9A:
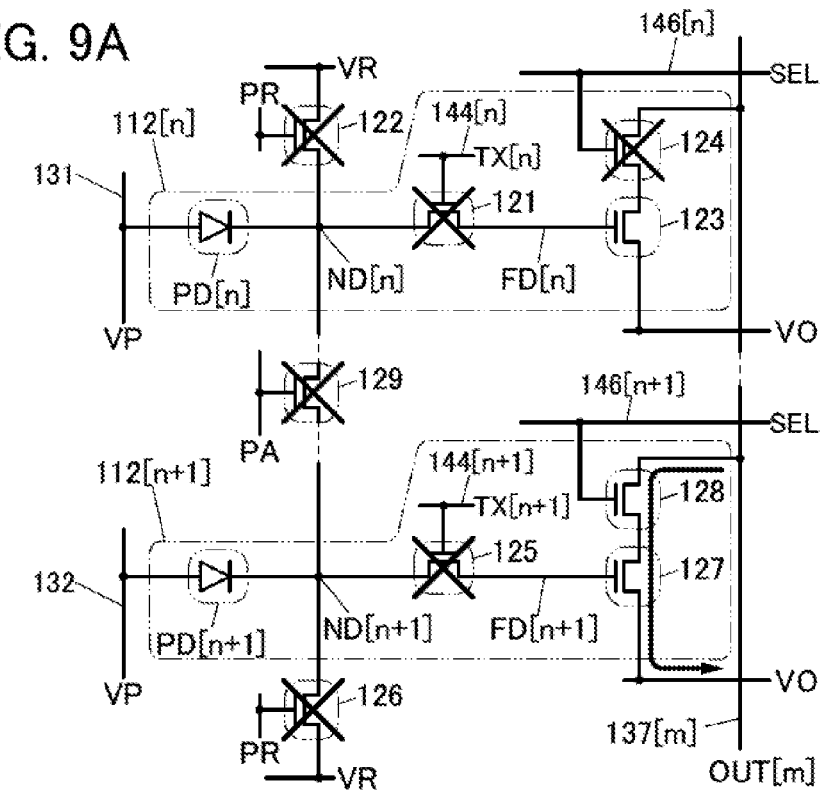
FIGS. 9A and 9B are each a circuit diagram showing an example of an imaging operation.
Figure 9B:
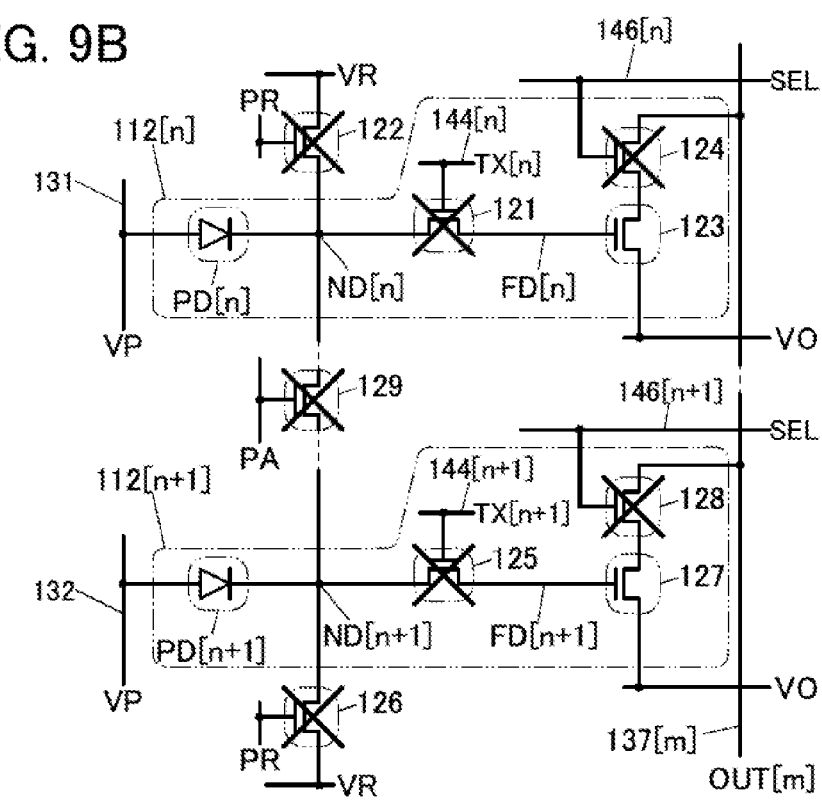

FIG. 6 is a timing chart showing operation of the subpixels 112, and FIGS. 7A and 7B, FIGS. 8A and 8B, and FIGS. 9A and 9B are circuit diagrams showing operation states of the subpixels 112. For easy understanding of the driving method, either the H potential or the L potential is supplied to the above wirings and nodes unless otherwise specified, in the timing chart shown in this embodiment.

With a global shutter system, the accumulation operations of all pixels 111 can be conducted during one period. Thus, unlike the case of using a rolling shutter system, distortion of a taken image, which is caused by the accumulation operations conducted in different periods, is not generated. Note that a frame period in the case of using the global shutter system is referred to as a period 301 in FIG. 6. The period 301 corresponds to the sum of the lengths of time required for the reset operation, the accumulation operation, and the operation of reading data from pixels in all rows. Further, the period 301 corresponds to a period from the end of a reset operation to the start of the next reset operation, for example.

In Operation Example 1, the imaging operation in the case where the potential PA is set at L potential and the transistor 129 is in an off state is described. When the potential PA is set at L potential, the subpixel 112[$n$] and the subpixel 112[$n$+1] can be made to operate independently. Furthermore, the potential VR is set at H potential, and the potential VP and the potential VO are set at L potentials. The potential SEL[n] and the potential SEL[n+1] are set at L potentials.

[Reset Operation]

First, at a time T1, the potential PR, the potential TX[n], and the potential TX[n+1] are set at H potentials. Then, the transistor 121 and the transistor 122 are turned on, and the node ND[n] and the node FD[n] are set at H potentials. In addition, the transistor 125 and the transistor 126 are turned on, and the node ND[n+1] and the node FD[n+1] are set at H potentials. Through the operation, the amount of charge held in the node FD[n] and the node FD[n+1] are reset (see FIG. 7A). A period from the time T1 to a time T2 is referred to as a reset period. The operation during the reset period is referred to as a reset operation.

Although not illustrated, in the reset period, all the nodes FD[n] and nodes FD[n+1] in the imaging device 100 are reset.

[Accumulation Operation]

Next, at the time T2, the potential PR is set at L potential. The potential TX[n] and the potential TX[n+1] remain at H potentials. Furthermore, at the time T2, the photodiode PD[n] and the photodiode PD[n+1] are supplied with a reverse bias. When light is incident on the photodiode PD[n] and the photodiode PD[n+1] in a state where the reverse bias is applied to the photodiode PD[n] and the photodiode PD[n+1], current flows from one of electrodes to the other electrode in each of the photodiode PD[n] and the photodiode PD[n+1] (see FIG. 7B). The amount of current varies depending on the intensity of light in this state. In other words, as the intensity of light incident on the photodiode PD[n] and the photodiode PD[n+1] is increased, the amount of current is increased, and the amount of charge flowing out from the node FD[n] and the node FD[n+1] is increased. In contrast, as the intensity of light incident on the photodiode PD[n] and the photodiode PD[n+1] is low, the amount of current is reduced, and the amount of charge flowing out from the node FD[n] and the node FD[n+1] is reduced. Thus, the higher the intensity of light becomes, the larger the amount of change in the potential of the node FD[n] and the node FD[n+1] becomes; the lower the intensity of light becomes, the smaller the amount of change becomes.

Next, at a time T3, the potential TX[n] and the potential TX[n+1] are set at L potentials, whereby the transistor 121 and the transistor 125 are turned off. When the transistor 121 and the transistor 125 are turned off, the charge transfer from the node FD[n] and the node FD[n+1] to the photodiode PD[n] and the photodiode PD[n+1] stops, and the potentials of the node FD[n] and the node FD[n+1] are determined (see FIG. 8A). A period from the time T2 to the time T3 is referred to as an exposure period. The exposure period in Operation Example 1 is referred to as a period 311 in FIG. 6. The operation during the exposure period is referred to as an accumulation operation.

[Reading Operation]

Next, at a time T4, the potential SEL supplied to the wiring 146[$n$] is set at H potential. Here, the case where n=1 (first row) is described. Immediately before the H potential is supplied to the wiring 146[$n$], the wiring 137[$m$] is pre-charged so that the potential becomes H potential. When the potential SEL supplied to the wiring 146[$n$] is at H potential, the transistor 124 is turned on, and the potential of the wiring 137[$m$] is lowered at a rate corresponding to the potential of the node FD[n] (see FIG. 8B). At a time T5, the potential SEL supplied to the wiring 146[$n$] is set at L potential, whereby the transistor 124 is turned off, and the potential of the wiring 137[$m$] is determined. The potential of the wiring 137[$m$] at this time is measured, so that the amount of light received by the subpixel 112[$n$] can be calculated.

Next, at the time T5, the potential SEL supplied to the wiring 146[$n$+1] (the wiring 146 in the second row in this case) is set at H potential. Immediately before the potential supplied to the wiring 146[$n$+1] is set at H potential, the wiring 137[$m$] is pre-charged so that the potential becomes H potential. When the potential SEL supplied to the wiring 146[$n$+1] is set at H potential, the transistor 128 is turned on, and the potential of the wiring 137[$m$] is lowered at a rate corresponding to the potential of the node FD[n+1] (see FIG. 9A). At a time T6, the potential SEL supplied to the wiring 146[$n$+1] is set at L potential, whereby the transistor 128 is turned off, and the potential of the wiring 137[$m$] is determined (see FIG. 9B). The potential of the wiring 137[$m$] at this time is measured, so that the amount of light received by the subpixel 112[$n$+1] can be calculated.

After the time T6, the potential of the wiring 137[$m$] is measured in order from the third row, whereby the potentials of the wirings 137[$m$] in the n-th row and the (n+1)-th row can be obtained. The potentials of the wirings 137[$m$] in the first to p-th rows are measured, whereby the amount of light received by the pixels 111 in the imaging device 100 can be obtained. Thus, an image data of the object taken with the imaging device 100 can be obtained. For example, a period during which the amount of received light in each row is calculated, such as a period from the time T4 to the time T5, is referred to as a reading period. The operation during the reading period is referred to as a reading operation. Note that the timing of performing the reading operation can be determined as appropriate. The potentials of wirings 137 in the first to q-th columns, connected to the n-th row, may be measured in order from the first column, measured concurrently from the first to q-th columns, or measured per unit of plural columns.

In the global shutter system, the reset operations are concurrently conducted in all pixels, and the accumulation operations are concurrently conducted in all pixels. Thus, the potential TX[n], the potential TX[n+1], and the potential PR of pixels in all columns may be changed all at once.

A period from the end of the accumulation operation and the start of the reading operation, during which charge is held at the nodes FD in the pixels in each row, is referred to as a charge holding period. In the global shutter system, the reset operation and the accumulation operation are performed on all pixels concurrently, and therefore, the exposure period ends in all pixels at substantially the same timing. However, the reading operation is sequentially performed on the pixels per row, and thus the charge holding period differs between rows. For example, the charge holding period in the first row lies between the time T3 and the time T4, and the charge holding period in the second row lies between the time T3 and the time T5. The reading operation is performed row by row; therefore, the timing of when the reading period starts varies from one row to another. Thus, the length of the charge holding period in the last row is the longest.

When an image with a uniform grayscale level is obtained, output signals in all the pixels ideally have potentials of the same level. However, in the case where the length of the charge holding period varies from one pixel row to another, if charge accumulated at the nodes FD in the pixels in each row leaks out over time, the potential of an output signal varies from one row to another, and image data varies in grayscale level from one row to another.

Thus, it is preferable for the transistor 121 and the transistor 125 to use a transistor with extremely low off-state current. With use of a transistor with extremely low off-state current for each of the transistor 121 and the transistor 125, the amount of change in potentials of the node FD[n] and the node FD[n+1] due to a difference in the length of charge holding period can be small, even when the image is taken with the global shutter system. In that case, even when an image is taken with the global shutter system, it is possible to suppress variation in grayscale level of image data due to a difference in the length of the charge holding period, and it is possible to enhance the quality of taken images.

In the case where the global shutter driving method is performed with use of the circuit configuration in FIG. 5, there is a possibility that image data of the pixels in the n-th row is mixed with image data of the pixels in the (n+1)-th row. Thus, it is preferable for the transistor 129 to use a transistor with extremely low off-state current. With use of the transistor with extremely low off-state current for the transistor 129, a mixture of the image data can be suppressed.

According to one embodiment of the present invention, the quality of taken image can be enhanced.

Operation Example 2

Next, an example in which a three-dimensional image is taken with the imaging device 100 shown in FIGS. 1A and 1B will be described. Employing one embodiment of the present invention makes it possible to take a two-dimensional image and a three-dimensional image with the imaging device 100.

For three-dimensional imaging, the circuit configuration example of the subpixels 112 shown in FIG. 5, which is used for two-dimensional imaging, can be used, for example.

An operation example of the imaging device 100 having the circuit configuration shown in FIG. 5 and capable of three-dimensional imaging will be described with reference to FIG. 12, FIGS. 13A and 13B, FIGS. 14A and 14B, FIGS. 15A and 15B, and FIGS. 16A and 16B. FIG. 12 is a timing chart showing operation of the subpixels 112, and FIGS. 13A and 13B, FIGS. 14A and 14B, FIGS. 15A and 15B, and FIGS. 16A and 16B are circuit diagrams showing operation states of the subpixels 112.

Note that a frame period in Operation Example 2 is referred to as a period 401 in FIG. 12. The period 401 corresponds to the sum of lengths of time required for the reset operation, the accumulation operation, and the operation of reading data from pixels in all rows. Further, the period 401 corresponds to a period from the end of a reset operation to the start of the next reset operation.

In Operation Example 2, the imaging operation in the case where the potential PA is set at H potential to turn the transistor 129 on is described. In the case where the potential PA is set at H potential, the subpixel 112[n] and the subpixel 112[n+1] can be used while being connected in parallel. Furthermore, the potential VR is set at H potential, and the potential VP and the potential VO are set at L potentials.

When the photodiode PD[n] in the subpixel 112[n] and the photodiode PD[n+1] in the subpixel 112[n+1] are used while being connected in parallel, a plurality of charge accumulation regions can be provided. The provision of the plurality of charge accumulation regions can achieve high light sensitivity. In addition, three-dimensional imaging in a short period of time becomes possible.

[Sensed Light]

In Operation Example 2, an example in which an object is irradiated with light P1 and light P2 reflected from the object (hereinafter referred to as reflected light P2) is sensed such that a distance x between the imaging device 100 and the object is calculated will be described. A three-dimensional image can be made with the use of the distance x.

Figure 36:
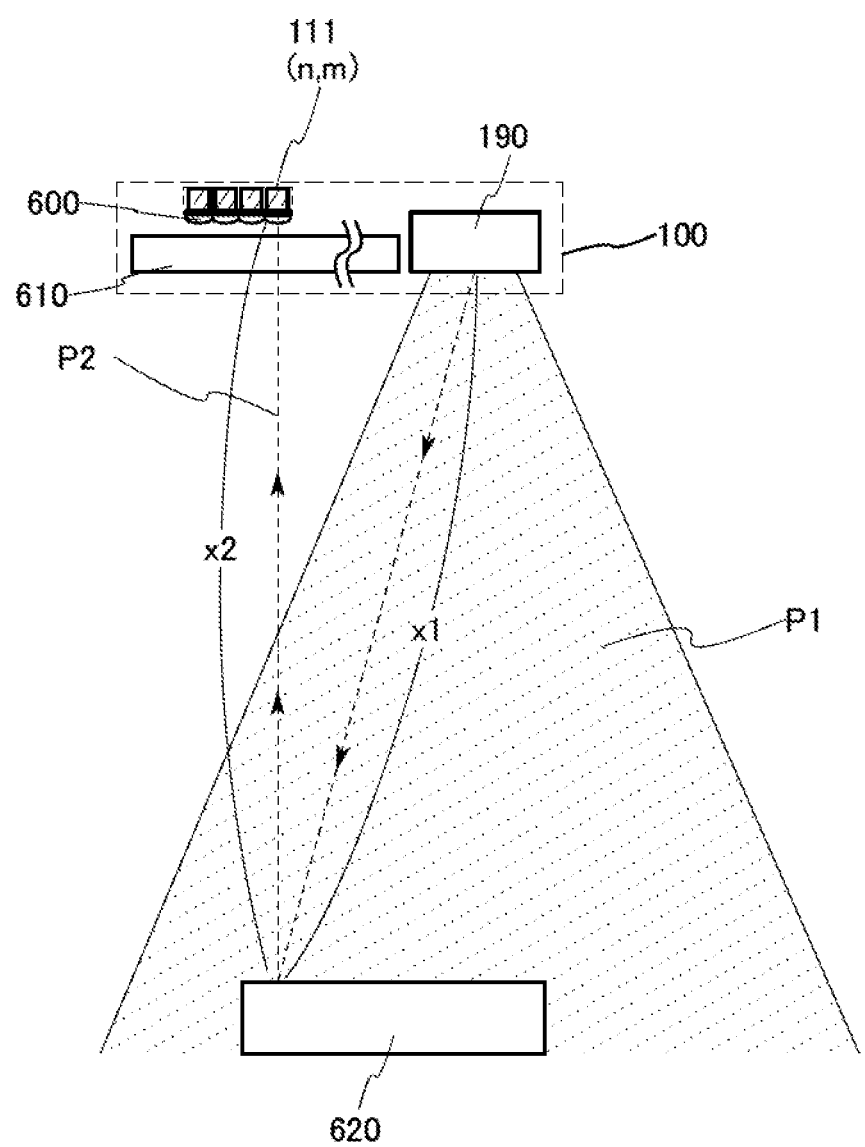
FIG. 36 illustrates an example of an imaging operation.

FIG. 36 is a schematic diagram showing an example in which a surface of an object 620 is irradiated with the light P1, which is emitted from the light source 190 in the imaging device 100, and the reflected light P2 is incident on the photodiode PD in the pixel 111(n,m) in the n-th row and m-th column. In FIG. 36, the imaging device 100 includes the light source 190, the pixel 111, and the lens 600. The imaging device 100 may include two or more lenses. For example, the imaging device 100 may include the lens 600 and a lens 610, as shown in FIG. 36.

As the light P1, light with any wavelength can be used as long as it can be converted by the photoelectric conversion element used in the imaging device 100. Visible light, ultraviolet light, infrared light, and the like can be used, for example. X-rays or gamma rays may also be used as the light P1. Light having a wide wavelength distribution such as white light may also be used.

The object 620 is sometimes irradiated with light other than the light P1. Light with which the object 620 is irradiated, other than the light P1, is referred to as outside light P3. Examples of the outside light P3 include sunlight and lighting.

Here, the intensity of the light P1 is preferably higher than that of the outside light P3. Using light having a distribution of intensity in a specific wavelength range, such as infrared light, as the light P1 and providing the photodiode PD with a filter that transmits light in that wavelength range can reduce the influence of the outside light P3. In the case where fluorescent light is used as lighting, for example, the use of infrared light as the sensed light can decrease the influence of the outside light P3 because fluorescent light includes little infrared light. Thus, the quality of a three-dimensional image taken with the imaging device 100 can be enhanced.

It is preferable that the light P1 be capable of generating a short time pulse wave. A light emitting diode (LED) emitting pulse light may be used as the light P1, for example. Alternatively, pulse light may be generated by opening and shutting a shutter, such as a technical shutter, at high speed.

It is preferable that the object 620 be irradiated with the light P1 widely and uniformly. Furthermore, the light P1 is preferably near the pixel 111.

[Reset Operation]

First, potentials of the potential PR, the potential TX[n], and the potential TX[n+1] are set at H potentials at a time T1. Then, the transistor 121 and the transistor 122 are turned on, and the node ND[n] and the node FD[n] are set at H potentials. In addition, the transistor 125 and the transistor 126 are turned on, and the node ND [n+1] and the node FD[n+1] are set at H potentials. Through the operation, the amount of charge accumulated at the node FD[n] and the node FD[n+1] are reset (see FIG. 13A).

Since the transistor 129 is in an on state in Operation Example 2, either the transistor 122 or the transistor 126 may be in an off state during the reset period. Although not illustrated, in the reset period, all the nodes FD [n] and nodes FD [n+1] in the imaging device 100 are reset.

[Accumulation Operation]

The photodiode PD[n] and the photodiode PD[n+1] are supplied with a reverse bias. When light is incident on the photodiode PD[n] and the photodiode PD[n+1] in a state where the reverse bias is applied to the photodiode PD[n] and the photodiode PD[n+1], current flows from one of electrodes to the other electrode in each of the photodiode PD[n] and the photodiode PD[n+1]. As described above, the amount of current at this time changes depending on the light intensity. Thus, as the intensity of light is higher, the amount of change in potential of the node FD[n] increases, and as the intensity of light is lower, the amount of change decreases.

At a time T2, the potential PR is set at L potential. The potential TX[n+1] supplied to the wiring 144[n+1] is set at L potential. The potential TX[n] supplied to the wiring 144[n] remains at H potential (see FIG. 13B). Next, irradiation of the object 620 with the light P1 is started. The object 620 is irradiated with the light P1 during a period 402 shown in FIG. 12, i.e., from the time T2 to a time T4.

The light P1 with which the object 620 is irradiated at the time T2 is reflected by the surface of the object, and is incident on the photodiode PD[n] and the photodiode PD[n+1] as the reflected light P2 at a time T3. Then, charge transfers from the node FD[n] to the photodiode PD[n] and the photodiode PD[n+1] (see FIG. 14A). Here, a period 403 in FIG. 12 corresponds to a period from the time T2 (the start of the light P1 irradiation) to the time T3 (the incidence of the reflected light P2 on the photodiodes).

The distance x between the imaging device 100 and the object will be described. As shown in FIG. 36, the distance between the light source of the imaging device 100 (i.e., the source of light P1) and a portion of the object 620 which is sensed by the pixel in the n-th row and the m-th column is x1. The distance between the portion of the object 620 which is sensed by the pixel in the n-th row and the m-th column and the pixel in the n-th row and the m-th column is x2. The distance x between the imaging device 100 and the object 620 may be the average of x1 and x2, i.e., x may be equal to (x1+x2)/2. In the case where the distance x1 and the distance x2 are sufficiently greater than the size of the imaging device 100, the distance x to the object 620 can be approximated by x1 or x2.

Here, $\Delta T_x = 2x/c$ is satisfied, where the length of the period 403, i.e., a difference between the time T2 and the time T3 is $\Delta T_X$, the distance between the imaging device 100 and the object 620 is x, and light speed is c. $\Delta T_X$ changes in accordance with the distance between the imaging device and the object 620.

Then, at a time T4, the light P1 irradiation is stopped. In addition, the potential TX[n] supplied to the wiring 144[n] is set at L potential, and the potential TX[n+1] supplied to the wiring 144[n+1] is set at H potential (see FIG. 14B). When the potential TX[n+1] is set at H potential, the transistor 125 is turned on. Thus, charge transfers from the node FD[n+1] to the photodiodes PD[n] and PD[n+1]. When the potential TX[n] is set at L potential, the transistor 121 is turned off. When the transistor 121 is turned off, the charge transfer from the node FD[n] to the photodiodes PD[n] and PD[n+1] is stopped. The potential of the node FD[n] depends on the amount of light received by the photodiodes PD[n] and PD[n+1] in a period during which the transistor 121 is on, i.e., a period from the time T2 to the time T4.

The charge transfer from the node FD[n] due to the reflected light P2 of the light P1 being incident on the photodiodes PD[n] and PD[n+1] occurs in a period 405, i.e., a period from the time T3 to the time T4 shown in FIG. 12. The period 405 is referred to as a first exposure period.

When the object 620 is irradiated with the outside light P3 and the reflected light is incident on the photodiodes PD[n] and PD[n+1] in a period from the time T2 to the time T4, charge transfers to the node FD[n] to affect the potential of the node FD[n].

It is preferable that the light P1 is more intense than the outside light P3. As long as the light P1 is sufficiently more intense than the outside light P3, the amount of the charge transfer from the node FD[n] in the period from the time T2 to the time T4 is determined by the amount of the charge transfer due to the reflected light P2 being incident on the photodiodes PD[n] and PD[n+1] in the period 405 in most cases.

For canceling the effect of the outside light P3, the background may be measured beforehand in a state where the light P1 is not emitted, to perform adjustment.

The incidence of the reflected light P2 that has been incident on the photodiodes PD[n] and PD[n+1] from the time T3 is stopped at a time T5.

The time T5 depends on the distance between the imaging device and the object 620. Further, $T5 = T3 + \Delta T_A$ is satisfied where the length of the period 402, i.e., a difference between the time T4 and the time T2 is $\Delta T_A$.

Next, the potential TX[n+1] supplied to the wiring 144[n+1] is set at L potential at a time T6. The potential TX[n] remains at L potential (see FIG. 15A). Charge can transfer from the node FD[n+1] to the photodiodes PD[n] and PD[n+1] during a period in which the transistor 125 is on, i.e., a period from the time T4 to the time T6. The potential of the node FD[n+1] depends on the amount of light received by the photodiodes PD[n] and PD[n+1] during the period from the time T4 to the time T6.

The charge transfer from the node FD[n+1] due to the reflected light P2 of the light P1 being incident on the photodiodes PD[n] and PD[n+1] occurs in a period 406, i.e., a period from the time T4 to the time T5 shown in FIG. 12. The period 406 is referred to as a second exposure period. The length of the period 404 shown in FIG. 12, i.e., a difference between the time T5 and the time T3 is $\Delta T_A$.

When the object 620 is irradiated with the outside light P3 and the reflected light is incident on the photodiodes PD[n] and PD[n+1] in the period from the time T4 to the time T6, charge transfers to the node FD[n+1] to affect the potential of the node FD[n+1].

The length of the period 405, i.e., the length of the first exposure period, can be expressed as $\Delta T_A - \Delta T_X$. The length of the period 406, i.e., the length of the second exposure period, is $\Delta T_X$.

As the distance x between the imaging device and the object 620 increases, $\Delta T_X$ also increases. As $\Delta T_X$ increases, the first exposure period becomes shorter and the second exposure period becomes longer. That is, the amount of charge accumulated in the node FD[n] decreases and the amount of charge accumulated in the node FD[n+1] increases.

The accumulation operation in the (n+1)-th row is performed without performance of the reset operation after the accumulation operation in the n-th row, so that the frame period can be shortened.

For the subpixel 112[n], the subpixel 112[n+1], the transistor 129, and wirings connecting these elements, it is preferable that parasitic capacitance formed in regions other than those forming the capacitance of the nodes FD[n] and FD[n+1] (the parasitic capacitance is referred to as first parasitic capacitance, here) be sufficiently small. Examples of the first parasitic capacitance includes: capacitance formed by a wiring between the transistor 121 and the node ND[n] and another wiring or a semiconductor layer overlapping therewith; capacitance formed by a wiring and a transistor between the node ND [n] and the node ND[n+1] and another wiring or a semiconductor layer overlapping therewith; capacitance formed by a wiring between the node ND[n+1] and the transistor 125 and another wiring or a semiconductor layer overlapping therewith; and capacitance formed by a wiring between the node ND and the photodiode PD and another wiring or a semiconductor layer overlapping therewith.

The potential of the node FD[n+1] is determined by the reset operation at the time T1 and held until the time T4. Then, at the time T4, the potential of the first parasitic capacitance, e.g., the potentials of the node ND[n] and the node ND[n+1], becomes the potential equivalent to the potential of the node FD[n]. In the case where the first parasitic capacitance is not sufficiently smaller than the capacitance of the node FD[n+1], a significant voltage drop in the node FD[n+1] may occur right after the transistor 125 is turned on at the time T4. In such a case, a second reset operation may be performed right after the transistor 125 is turned on to reset the potential of the node FD[n+1] at H potential, which will be described in Operation Example 3 later.

[Reading Operation]

First, at a time T7, the potential SEL supplied to the wiring 146[n] is set at H potential. Here, the case where n is 1 (first row) is described. Immediately before the H potential is supplied to the wiring 146[n], the wiring 137[m] is pre-charged so that the potential becomes H potential. When the potential SEL supplied to the wiring 146[n] is at H potential, the transistor 124 is turned on, and the potential of the wiring 137[m] is lowered at a rate corresponding to the potential of the node FD[n] (see FIG. 15B). At a time T8, the potential SEL supplied to the wiring 146[n] is set at L potential, whereby the transistor 124 is turned off, and the potential of the wiring 137[m] is determined. The potential of the wiring 137[m] at this time is measured, so that the amount of light received by the subpixel 112[n] can be calculated.

Next, at the time T8, the potential SEL supplied to the wiring 146[n+1] (the wiring 146 in the second row in this case) is set at H potential. Immediately before the potential supplied to the wiring 146[n+1] is set at H potential, the wiring 137[m] is pre-charged so that the potential becomes H potential. When the potential SEL supplied to the wiring 146[n+1] is set at H potential, the transistor 128 is turned on, and the potential of the wiring 137[m] is lowered at a rate corresponding to the potential of the node FD[n+1] (see FIG. 16A). At the time T6, the potential SEL supplied to the wiring 146[n+1] is set at L potential, whereby the transistor 128 is turned off, and the potential of the wiring 137[m] is determined (see FIG. 16B). The potential of the wiring 137[m] at this time is measured, so that the amount of light received by the subpixel 112[n+1] can be calculated.

After a time T9, the potential of the wiring 137[m] is measured in order from the third row, whereby the potentials of the wirings 137[m] in the n-th row and the (n+1)-th row can be obtained. The potentials of the wirings 137[m] in the first to p-th rows are measured, whereby the amount of light received by the pixels 111 in the imaging device 100 can be obtained. Thus, image data of the object taken with the imaging device 100 can be obtained. For example, a period during which the amount of received light in each row is calculated, such as a period from the time T7 to the time T8, is referred to as a reading period. The operation during the reading period is referred to as a reading operation. Note that the timing of performing the reading operation can be determined as appropriate. The potentials of wirings 137 in the first to q-th columns, connected to the n-th row, may be measured in order from the first column, measured concurrently from the first to q-th columns, or measured per unit of plural columns.

Here, the potential of the n-th row and the potential of the (n+1)-th row obtained by the reading operation are S[n] and S[n+1], respectively. In the case where the light P1 is sufficiently more intense than the outside light P3, it is assumed that S[n] and S[n+1] can be approximated by $k(\Delta T_A - \Delta T_X)$ and $k \cdot \Delta T_X$, respectively. Here, k is a constant. $\Delta T_X$ can be obtained by the following formula: $\Delta T_X = \Delta T_A \cdot S[n+1]/(S[n]+S[n+1])$. Further, x can be obtained by the following formula: $x = \{c \Delta T_A \cdot S[n+1]/(S[n]+S[n+1])\}/2$. With the use of the distance x which is obtained by the calculation, a three-dimensional image can be made.

The reset operation and the accumulation operation may be performed in a condition where the wirings 144[n] are in the odd-numbered rows and the wirings 144[n+1] is in the even-numbered rows. The number of pixels in which the other electrodes of the photodiodes PD are shared is increased, whereby the frequency of continuous accumulation operations can be increased. In other words, image data of continuous frames can be obtained with m short intervals in the following manner; in m pixels, the other electrodes of the photodiodes are shared with each other; the charge is sequentially accumulated in charge accumulation regions in the pixels through the continuous accumulation operations performed m times; and the taken image data in the pixels is sequentially read out.

According to one embodiment of the present invention, a solid-state imaging device with which three-dimensional images can be taken with a short duration can be provided. In addition, a solid-state imaging device capable of high-definition two-dimensional imaging can be provided.

[Modification Example of Operation Example 2]

FIG. 5 shows a configuration in which the subpixel 112[n] and the subpixel 112[n+1] are arranged in adjacent rows and connected to each other in parallel. A configuration in which a subpixel 112[m] and a subpixel 112[m+1] are arranged in adjacent columns and connected to each other in parallel may also be employed.

Figure 17:
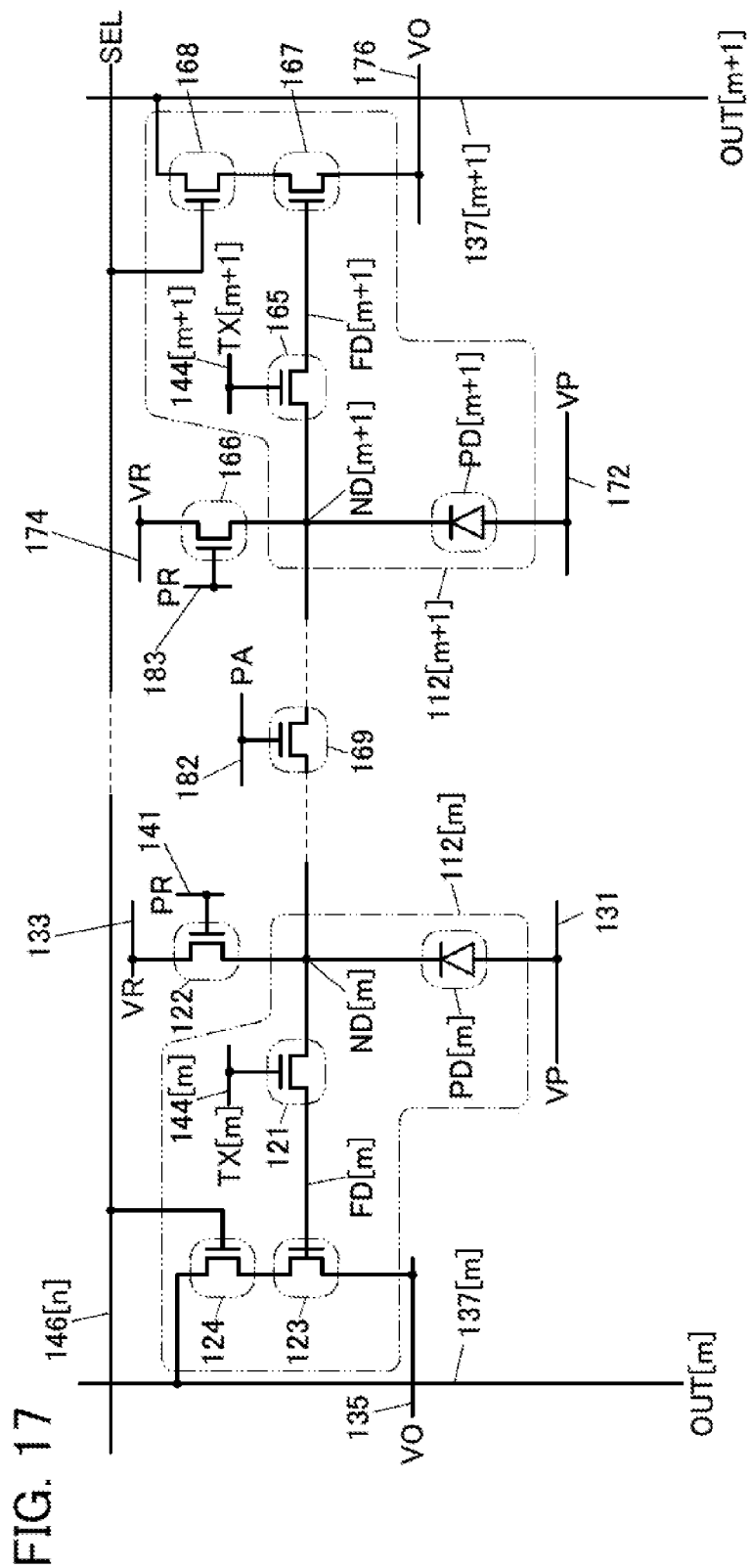
FIG. 17 illustrates a configuration example of a pixel.

Further, in the case where the subpixel 112[m] and the subpixel 112[m+1] are arranged in adjacent columns and connected to each other in parallel, the wiring 146[n] and the wiring 146[n+1] may be one common wiring and an individual OUT[m] may be provided for each of the subpixels 112[m] and 112[m+1], as shown in FIG. 17.

In the circuit configuration in FIG. 17, one of an anode and a cathode of a photodiode PD[m] is electrically connected to a wiring 131 from which a potential VP can be supplied. The other of the anode and the cathode of the photodiode PD[m], one of a source and a drain of a transistor 121, and one of a source and a drain of a transistor 122 are electrically connected to a node ND[m]. The other of the source and the drain of the transistor 122 is electrically connected to a wiring 133 from which a potential VR can be supplied. A gate of the transistor 122 is electrically connected to a wiring 141 from which a potential PR can be supplied. The other of the source and the drain of the transistor 121 and a gate of a transistor 123 are electrically connected to a node FD[m]. A gate of the transistor 121 is electrically connected to a wiring 144[m] from which a potential TX[m] can be supplied. One of a source and a drain of the transistor 123 is electrically connected to a wiring 135 from which a potential VO can be supplied, and the other of the source and the drain of the transistor 123 is electrically connected to one of a source and a drain of a transistor 124. The other of the source and the drain of the transistor 124 is electrically connected to a wiring 137[m], and a gate of the transistor 124 is electrically connected to a wiring 146[n] from which a potential SEL can be supplied. One of a source and a drain of the transistor 169 is electrically connected to the node ND[m], and a gate of the transistor 169 is electrically connected to a wiring 182 from which a potential PA can be supplied.

In the circuit configuration in FIG. 17, one of an anode and a cathode of a photodiode PD[m+1] is electrically connected to a wiring 172 from which the potential VP can be supplied. The other of the anode and the cathode of the photodiode PD[m+1], one of a source and a drain of a transistor 165, and one of a source and a drain of a transistor 166 are electrically connected to a node ND[m+1]. The other of the source and the drain of the transistor 166 is electrically connected to a wiring 174 from which the potential VR can be supplied. A gate of the transistor 166 is electrically connected to a wiring 183 from which the potential PR can be supplied. The other of the source and the drain of the transistor 165 and a gate of a transistor 167 are electrically connected to a node FD[m+1]. A gate of the transistor 165 is electrically connected to a wiring 144[m+1] from which the potential TX[m+1] can be supplied. One of a source and a drain of a transistor 167 is electrically connected to a wiring 176 from which the potential VO can be supplied. The other of the source and the drain of the transistor 167 is electrically connected to one of a source and a drain of a transistor 168. The other of the source and the drain of the transistor 168 is electrically connected to a wiring 137[m+1], and a gate of the transistor 168 is electrically connected to the wiring 146[n] from which the potential SEL can be supplied. The other of the source and the drain of the transistor 169 is electrically connected to the node ND[m+1].

The wiring 131 and the wiring 172 may be one common wiring although they are separate wirings in FIG. 17. The wiring 141 and the wiring 183 may be one common wiring although they are separate wirings in FIG. 17. The wiring 135 and the wiring 176 may be one common wiring although they are separate wirings in FIG. 17.

Figure 18:
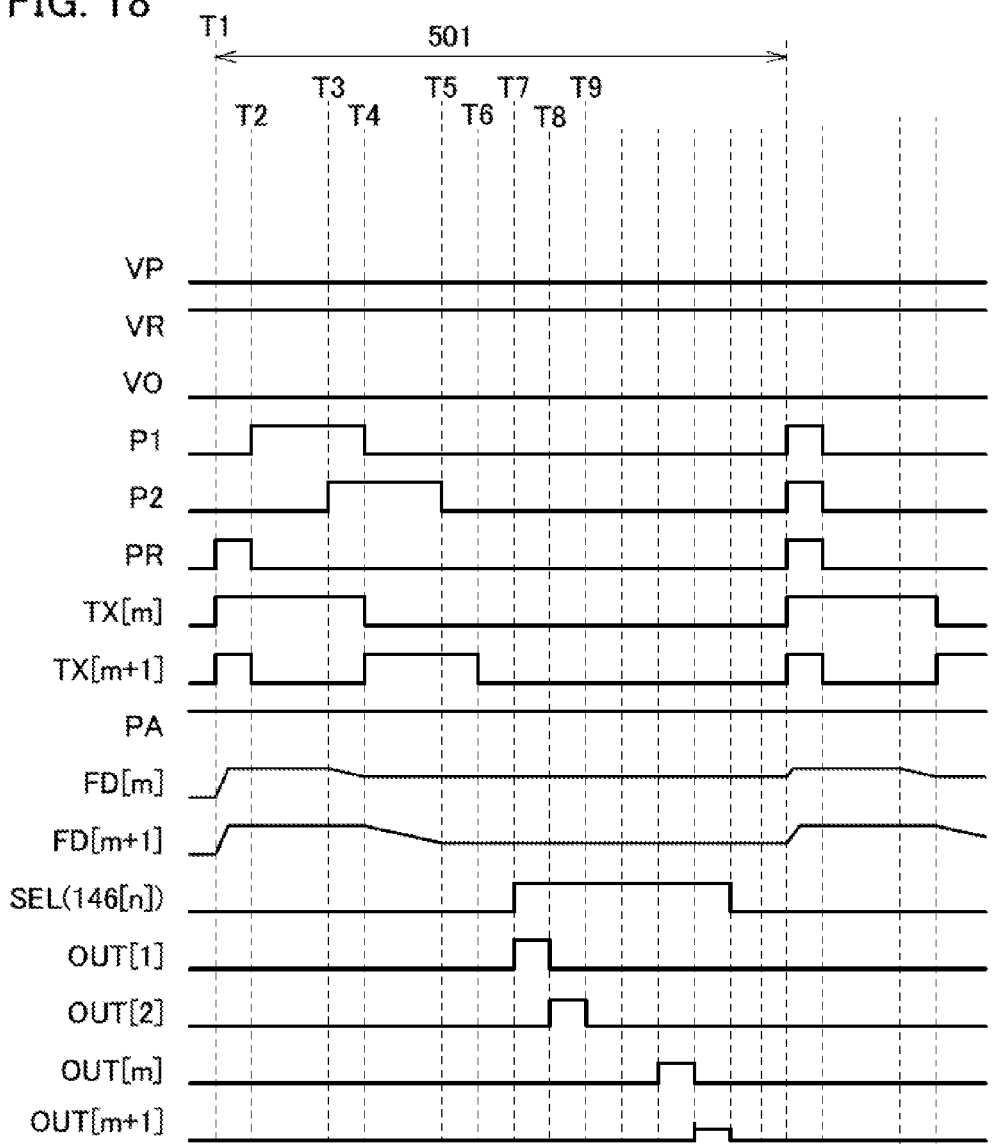
FIG. 18 is a timing chart showing an example of an imaging operation.

An example of an imaging operation of the imaging device 100 having the configuration in FIG. 17 is shown in FIG. 18. A period 501 corresponds to the sum of lengths of time required for the reset operation, the accumulation operation, and the operation of reading data from pixels in all rows. Further, the period 501 corresponds to a period from the end of a reset operation to the start of the next reset operation, for example.

[Reset Operation]

First, at a time T1, the potential PR, the potential TX[m], and the potential TX[m+1] are set at H potentials, and the amount of charge held in each of the node FD[m] and the node FD[m+1] is reset. Although not illustrated, in the reset period, all the nodes FD[m] and nodes FD[m+1] in the imaging device 100 are reset.

[Accumulation Operation]

Next, at a time T2, the potential PR is set at L potential. The potential TX[m+1] supplied to the wiring 144[m+1] is set at L potential. The potential TX[m] supplied to the wiring 144[m] remains at H potential. In addition, the object 620 starts to be irradiated with the light P1.

The light P1 with which the object 620 is irradiated at the time T2 is reflected by the surface of the object, and is incident on the photodiode PD[m] and the photodiode PD[m+1] as the reflected light P2 at a time T3.

Then, the light P1 irradiation is stopped at a time T4. The potential TX[m] supplied to the wiring 144[m] is set at L potential, and the potential TX[m+1] supplied to the wiring 144[m+1] is set at H potential. The charge transfer caused by the reflected light P2 of the light P1 being incident on the photodiode PD[m] and the photodiode PD[m+1] occurs during a period from the time T3 to the time T4.

The reflected light P2 that is incident on and received by the photodiodes PD[m] and PD[m+1] at the time T3 keeps being received by them until a time T5.

Next, at a time T6, the potential TX[m+1] supplied to the wiring 144[m+1] is set at L potential. The potential TX[m] remains at L potential. The charge transfer caused by the reflected light P2 of the light P1 being incident on the photodiode PD[m] and the photodiode PD[m+1] occurs during a period from the time T4 to the time T5.

For example, in the configuration shown in FIG. 17, the reset operation and the accumulation operation may be performed in a condition where the wirings 144[m] are in the odd-numbered columns and the wirings 144[m+1] are in the even-numbered columns.

[Reading Operation]

For reading, a method similar to the reading method described in Operation Example 2 can be used.

Another example of a reading method will be described. Here, the potential VO is at L potential. The potential SEL supplied to the wiring 146[n] is set at H potential to perform reading. It is preferable that, immediately before H potential is supplied to the wiring 146[n], the wiring 137[m] and the wiring 137[m+1] are pre-charged so that the potentials become H potentials. In the case where the wiring 137[m] and the wiring 137[m+1] are pulled up with the use of a resistor or a transistor, precharge is not necessary. At this time, the potentials of the wiring 137[m] and the wiring 137[m+1] change in accordance with the potentials of the node ND[m] and the node ND[m+1]. Therefore, the amount of light received by the subpixel 112[m] and the subpixel 112[m+1] can be calculated by sequentially measuring the potentials of the wiring 137[m] and the wiring 137[m+1]. Employing this reading method can increase the reading speed.

Another example of a reading method different from the above will be described. Here, the potential VO is at H potential. The wiring 137[m] and the wiring 137[m+1] are pulled up with the use of a resistor or a transistor. The potential SEL supplied to the wiring 146[n] is set at H potential to perform reading. At this time, the potentials of the wiring 137[m] and the wiring 137[m+1] change in accordance with the potentials of the node ND[m] and the node ND[m+1]. Therefore, the amount of light received by the subpixel 112[m] and the subpixel 112[m+1] can be calculated by sequentially measuring the potentials of the wiring 137[m] and the wiring 137[m+1]. In this reading method, a change in the potentials of the wiring 137[m] and the wiring 137[m+1] is approximately proportional to the potentials of the node ND[m] and the node ND[m+1]; thus, the accuracy of distance calculation can be improved.

Here, the potential in the n-th row and the m-th column and the potential in the n-th row and the (m+1)-th column obtained by the reading operation are S[m] and S[m+1], respectively. In the case where the light P1 is sufficiently more intense than the outside light P3, a distance x between the imaging device 100 and the object 620 can be approximated by $\{c\Delta T_A \cdot S[m+1]/(S[m]+S[m+1])\}/2$. With the use of the distance x obtained by the calculation, a three-dimensional image can be made.

Operation Example 3

Figure 19:
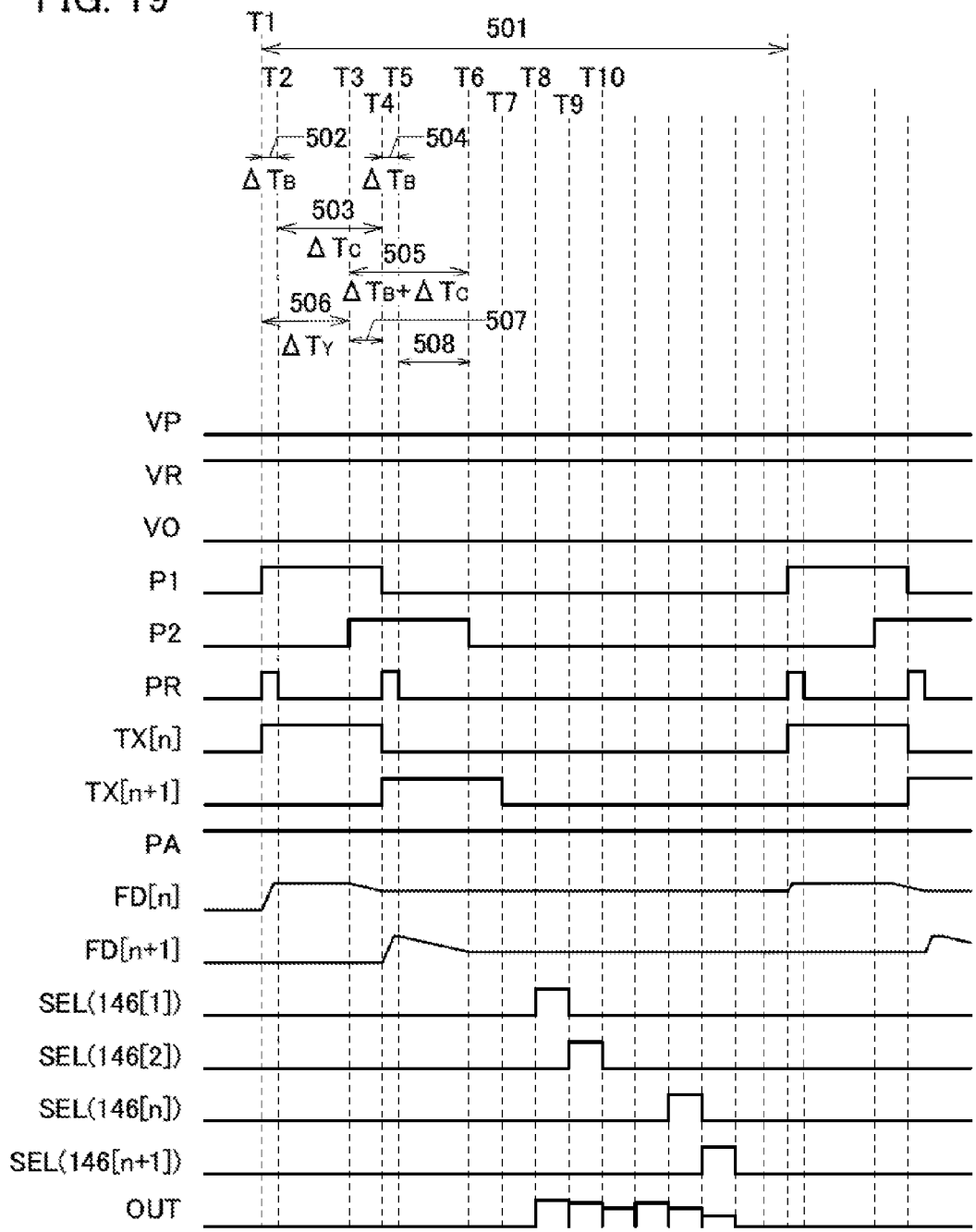
FIG. 19 is a timing chart showing an example of an imaging operation.

FIG. 19 is a timing chart showing an example of a method for three-dimensional imaging. Immediately after the potential of the node FD[n] is determined and the transistor 125 is turned on, a second reset operation is performed, in the method shown in FIG. 19. Whether or not the second reset operation is performed is a difference between FIG. 12 and FIG. 19.

An imaging operation of the imaging device 100 will be described below with reference to FIG. 19.
[Reset Operation]
At a time T1, the potential PR and the potential TX[n] are set at H potentials. Then, the transistor 121 and the transistor 122 are turned on, and the node ND[n] and the node FD[n] are set at H potentials. Through the operation, the amount of charge held at the node FD[n] is reset. Further, the transistor 126 is turned on. Next, the object 620 starts to be irradiated with the light P1. The object 620 is irradiated with the light P1 during a period 502 and a period 503, i.e., during a period from the time T1 to a time T4 in FIG. 19.
[Accumulation Operation]
The photodiode PD[n] and the photodiode PD[n+1] are supplied with a reverse bias. At a time T2 after $\Delta T_B$ of the time T1, the potential PR is set at L potential. The potential TX[n] supplied to the wiring 144[n] remains at H potential. The potential TX[n+1] supplied to the wiring 144[n+1] remains at L potential.

The light P1 with which the object 620 is irradiated at the time T2 is reflected by the surface of the object, and is incident on the photodiode PD[n] and the photodiode PD[n+1] as the reflected light P2 at the time T3. Then, charge transfers from the node FD[n] to the photodiode PD[n] and the photodiode PD[n+1]. Here, a period 506 in FIG. 19 corresponds to a period from the time T2 (the start of the light P1 irradiation) to a time T3 (the incidence of the reflected light P2 on the photodiodes).

Here, $\Delta T_Y = 2x/c$ is satisfied where the length of the period 506, i.e., a difference between the time T3 and the time T1, is $\Delta T_Y$, a distance between the imaging device and the object 620 is y, and the light speed is c, and $\Delta T_Y$ depends on the distance between the imaging device and the object 620.

The charge transfer from the node FD[n] due to the reflected light P2 of the light P1 being incident on the photodiodes PD[n] and PD[n+1] occurs in a period 507, i.e., a period from the time T3 to the time T4 shown in FIG. 19. The length of the period 507 can be expressed as ($\Delta T_B + \Delta T_C - \Delta T_Y$). The period 507 is referred to as a first exposure period.

Next, the light P1 irradiation is stopped at a time T4. In addition, the potential TX[n] supplied to the wiring 144[n] is set at L potential, and the potential PR and the potential TX[n+1] supplied to the wiring 144[n+1] are set at H potentials. Through the operation, the transistor 125 and the transistor 126 are turned on and the node ND[n+1] is set at H potential. Through the operation, the amount of charge held at the node ND[n+1] is reset. Further, the potential TX[n] set at L potential turns off the transistor 121. The transistor 121 being turned off stops the charge transfer from the node FD[n] to the photodiodes PD[n] and PD[n+1], whereby the potential of the node FD[n] is determined.

Next, the potential PR is set at L potential at a time T5 after $\Delta T_B$ of the time T4. The potential TX[n+1] remains at H potential. Through the operation, the transistor 126 is turned off. In addition, charge transfers from the node FD[n+1] to the photodiodes PD[n] and PD[n+1]. The charge transfer from the node FD[n+1] caused by the reflected light P2 of the light P1 being incident on the photodiode PD[n] and the photodiode PD[n+1] occurs during a period 508, i.e., during a period from the time T5 to a time T6 in FIG. 19. The length of the period 508 can be expressed as ($\Delta T_Y - \Delta T_B$). The period 508 is referred to as a second exposure period.

Next, the potential TX[n+1] supplied to the wiring 144[n+1] is set at L potential at a time T7. The potential TX[n] remains at L potential. The charge transfer from the node FD[n+1] to the photodiodes PD[n] and PD[n+1] stops, and the potential of the node FD[n+1] is determined.
[Reading Operation]
A reading operation can be performed in a manner similar to that described in Operation Example 2.

The potential of the n-th row and the potential of the (n+1)-th row obtained by the reading operation are S[n] and S[n+1], respectively. In the case where the light P1 is sufficiently more intense than the outside light P3, it is assumed that S[n] and S[n+1] can be approximated by $j(\Delta T_C + \Delta T_B - \Delta T_Y)$ and $j(\Delta T_Y - \Delta T_B)$, respectively. Here, j is a constant. $\Delta T_Y$ can be obtained by the following formula: $\Delta T_Y = \{S[n+1]/(S[n]+S[n+1])\} \cdot \Delta T_C + \Delta T_B$. Further, y can be obtained by the following formula: $y = c \cdot [\{S[n+1]/(S[n]+S[n+1])\} \cdot \Delta T_C + \Delta T_B]/2$. With the use of the distance y obtained by the calculation, a three-dimensional image can be made.

Embodiment 2

In this embodiment, another example of circuit configuration of the subpixel 112 will be described with reference to drawings.

Figure 20A:
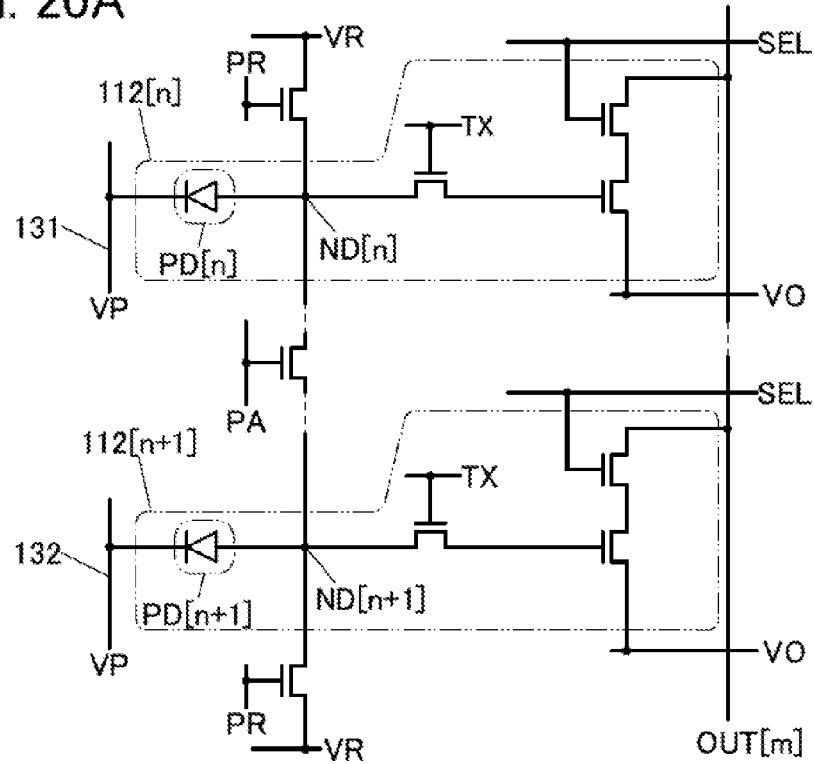
FIGS. 20A and 20B each illustrate a circuit configuration example of a pixel.

One of an anode and a cathode of the photodiode PD in the subpixel 112 may be electrically connected to the node ND, and the other of the anode and the cathode may be electrically connected to the wiring 131 (or the wiring 132) (see FIG. 20A). In this case, the potential VR is set at L potential, and the potential VP is set at H potential, whereby the imaging device 100 can be made to operate as in the above operation example.

Figure 20B:
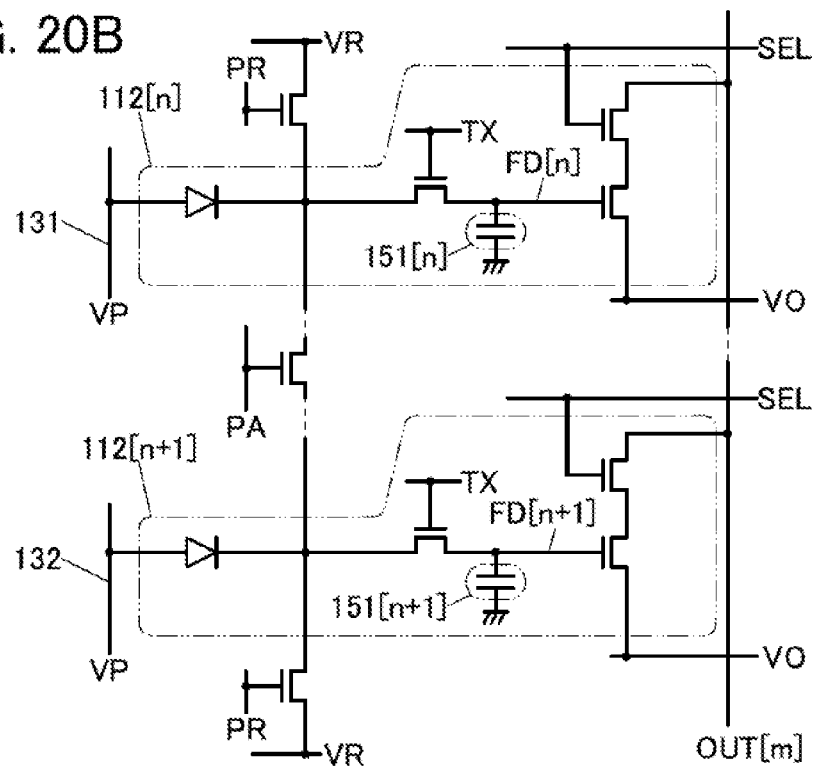

In addition, a capacitor 151 may be provided at the node FD in the subpixel 112 (see FIG. 20B). With the capacitor 151, the data holding time of image data at the node FD can be increased. Furthermore, the dynamic range of the imaging device 100 can be increased.

This embodiment can be implemented in an appropriate combination with any of the structures described in the other embodiments.

Embodiment 3

Figure 21:
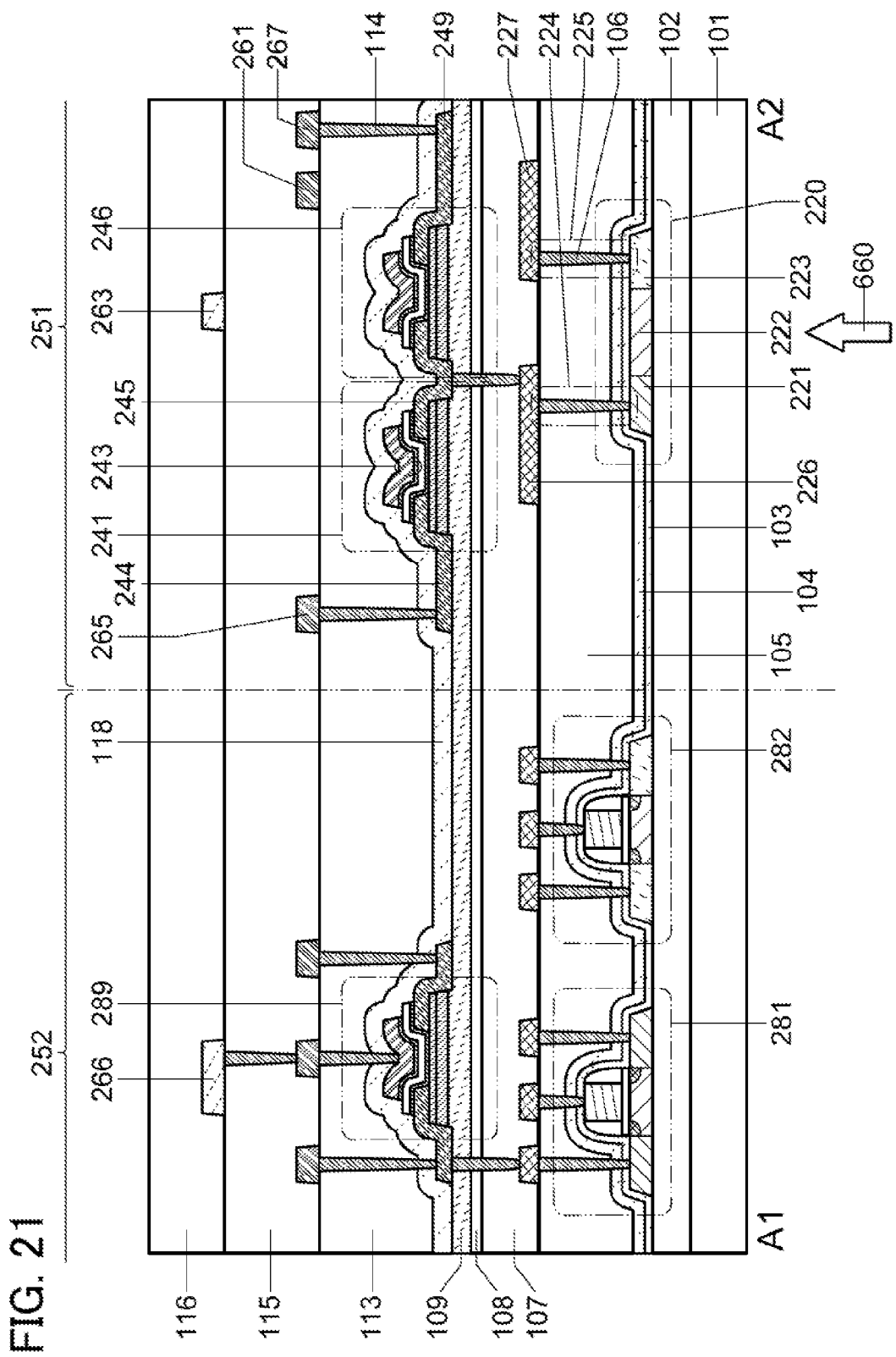
FIG. 21 illustrates a structure example of an imaging device.
Figure 22:
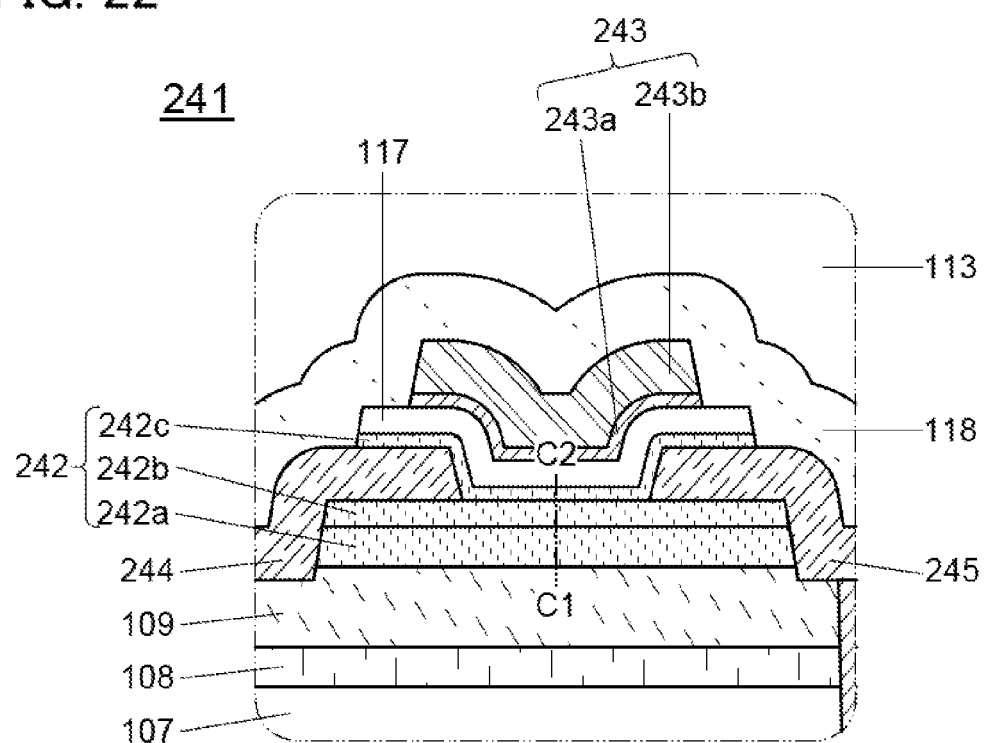
FIG. 22 illustrates a structure example of a transistor.
Figure 23:
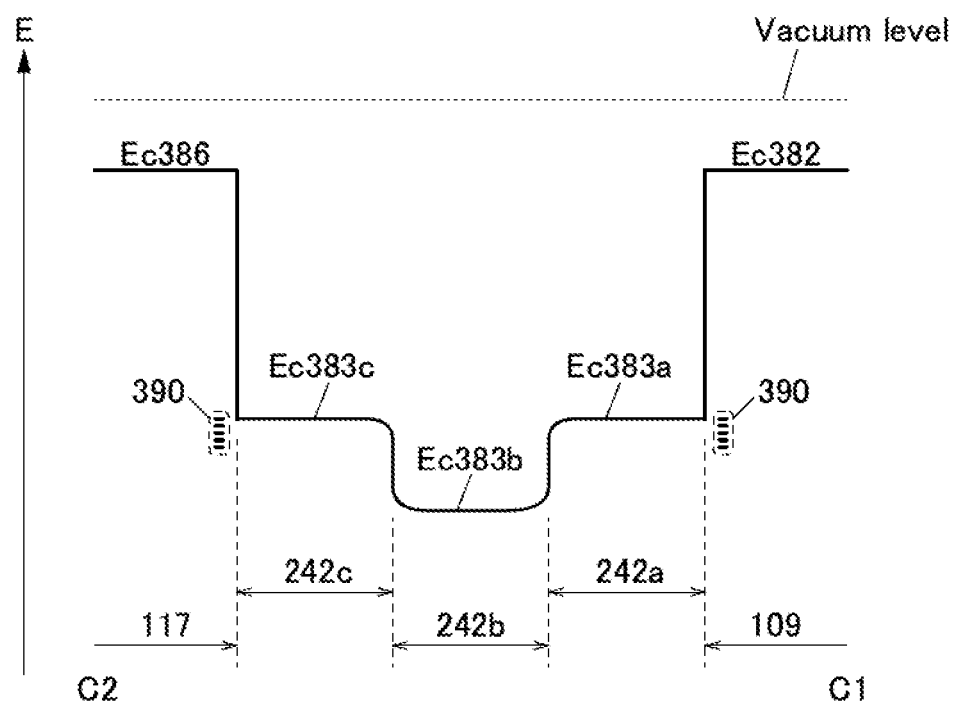
FIG. 23 shows an energy band structure.
Figure 24A:
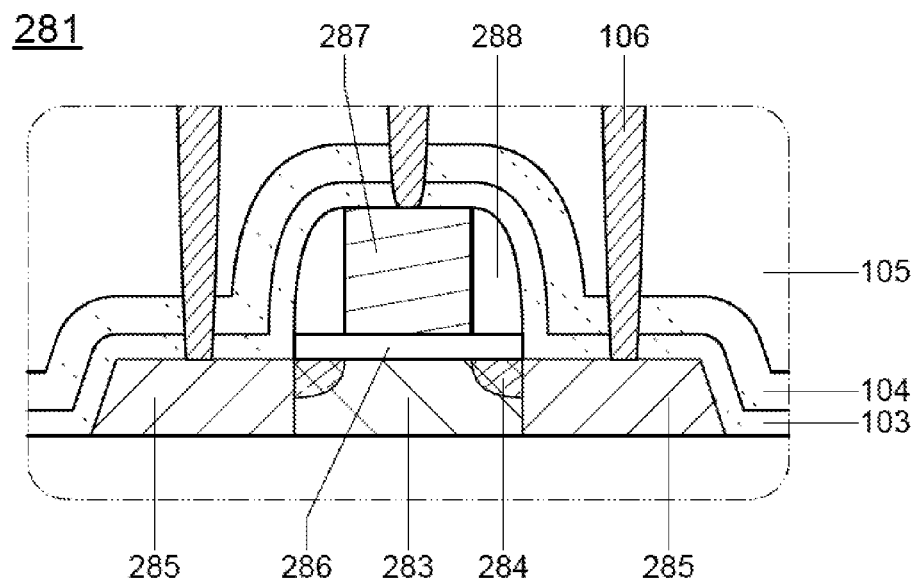
FIGS. 24A and 24B each illustrate an example of a transistor.
Figure 24B:
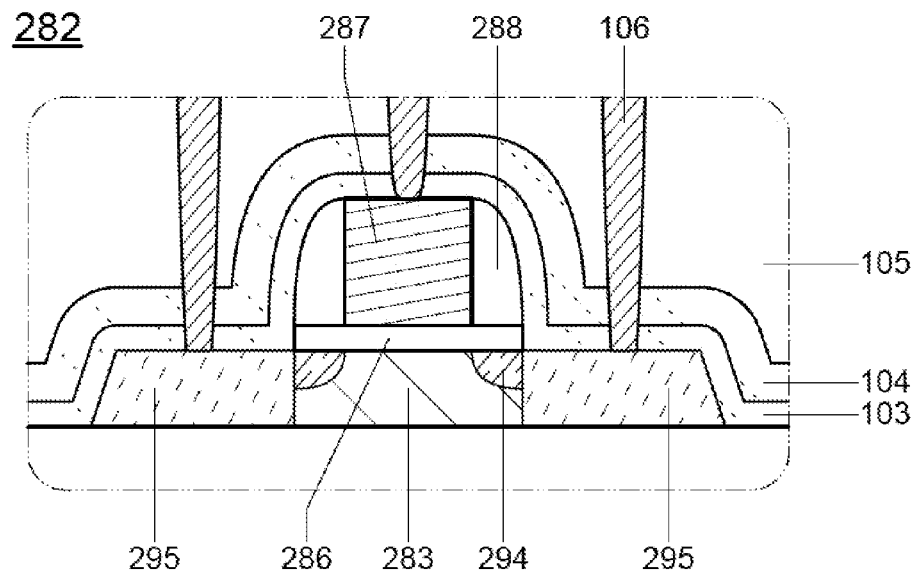

In this embodiment, an example in which the imaging device 100 includes a CMOS image sensor that is a type of solid-state image sensor will be described with reference to FIG. 21, FIG. 22, FIG. 23, and FIGS. 24A and 24B. A pixel region 251 shown in FIG. 21 as a cross-sectional view corresponds to part of the pixel 111 in the imaging device 100. A peripheral circuit region 252 shown in FIG. 21 as a cross-sectional view corresponds to part of a peripheral circuit in the imaging device 100. FIG. 22 is an enlarged view of a transistor 241 in FIG. 21. FIG. 24A is an enlarged view of a transistor 281 in FIG. 21. FIG. 24B is an enlarged view of a transistor 282 in FIG. 21.

The imaging device 100 described in this embodiment includes an insulating layer 102 over a substrate 101, and a photoelectric conversion element 220 having a PIN junction over the insulating layer 102. The photoelectric conversion element 220 includes a p-type semiconductor layer 221, an i-type semiconductor layer 222, and an n-type semiconductor layer 223. The photoelectric conversion element 220 has a structure in which the i-type semiconductor layer 222 is sandwiched between the p-type semiconductor layer 221 and the n-type semiconductor layer 223. Note that the photoelectric conversion element 220 may be formed with the p-type semiconductor layer 221 and the n-type semiconductor layer 223 without the i-type semiconductor layer 222. When the i-type semiconductor layer 222 is provided in the photoelectric conversion element 220, the photosensitivity can be increased. The photoelectric conversion element 220 described in this embodiment can function as the photodiode PD described in the above embodiment.

Note that an intrinsic semiconductor (i-type semiconductor) is ideally a semiconductor which does not include impurities and whose Fermi level lies substantially in the middle of the band gap, but in this specification and the like, a semiconductor to which an impurity serving as a donor or an impurity serving as an acceptor is added and whose Fermi level lies substantially in the middle of the band gap is also included in the category of the intrinsic semiconductor. Even when a semiconductor includes an impurity serving as a donor or an impurity serving as an acceptor, the semiconductor is included in the category of intrinsic semiconductors as long as the semiconductor can function as an intrinsic semiconductor.

As the substrate 101, a glass substrate, a quartz substrate, a sapphire substrate, a ceramic substrate, a metal substrate, a semiconductor substrate, or the like can be used. Alternatively, a plastic substrate having heat resistance to the processing temperature of this embodiment may be used. Examples of the substrate include a semiconductor substrate (e.g., a single crystal substrate or a silicon substrate), a silicon on insulator (SOI) substrate, a glass substrate, a quartz substrate, a plastic substrate, a metal substrate, a stainless steel substrate, a substrate including stainless steel foil, a tungsten substrate, and a substrate including tungsten foil. As an example of a glass substrate, a barium borosilicate glass substrate, an aluminoborosilicate glass substrate, a soda lime glass substrate, or the like can be given.

Further, a single crystal semiconductor substrate or a polycrystalline semiconductor substrate may be used as the substrate. Fabrication of the photoelectric conversion element 220 with the use of a single crystal semiconductor substrate or a polycrystalline semiconductor substrate can improve the light detection sensitivity of the photoelectric conversion element 220. In such cases, the formation of the i-type semiconductor layer 222 may be omitted.

After the photoelectric conversion element 220 and the pixel circuit 230 are formed, the substrate 101 may be removed by a mechanical polishing method, an etching method, or the like. In the case where the substrate 101 is left, a material that transmits light sensed by the photoelectric conversion element 220 may be used for the substrate 101.

The insulating layer 102 can be formed to have a single-layer structure or a multi-layer structure using an oxide material such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide; a nitride material such as silicon nitride, silicon nitride oxide, aluminum nitride, or aluminum nitride oxide; or the like. The insulating layer 102 can be formed by a sputtering method, a chemical vapor deposition (CVD) method, a thermal oxidation method, a coating method, a printing method, or the like.

The p-type semiconductor layer 221, the i-type semiconductor layer 222, and the n-type semiconductor layer 223 may be formed, for example, in such a manner that the i-type semiconductor layer 222 having an island shape is formed over the insulating layer 102, and then a mask is formed over the i-type semiconductor layer 222, and impurity elements are selectively introduced into part of the i-type semiconductor layer 222. The impurity elements can be introduced by an ion implantation method, in which mass separation is performed, or an ion doping method, in which mass separation is not performed. The mask is removed after the impurity elements are introduced.

The p-type semiconductor layer 221, the i-type semiconductor layer 222, and the n-type semiconductor layer 223 can be formed using a single crystal semiconductor, a polycrystalline semiconductor, a microcrystalline semiconductor, a nanocrystal semiconductor, a semi-amorphous semiconductor, an amorphous semiconductor, or the like. For example, amorphous silicon or microcrystalline germanium can be used. Alternatively, a compound semiconductor such as silicon carbide or gallium arsenide can be used.

In the case where silicon is used as a material for formation of the p-type semiconductor layer 221, the i-type semiconductor layer 222, and the n-type semiconductor layer 223, Group 13 elements can be used, for example, as a p-type impurity element. As an n-type impurity element, for example, a Group 15 element can be used.

In the case where the semiconductor layer is formed using SOI, for example, the insulating layer 102 may be a buried oxide (BOX) layer.

The imaging device 100 described in this embodiment includes an insulating layer 103 and an insulating layer 104 over the p-type semiconductor layer 221, the i-type semiconductor layer 222, and the n-type semiconductor layer 223. The insulating layer 103 and the insulating layer 104 can be formed using a material and a method similar to those of the insulating layer 102. Note that one of the insulating layers 103 and 104 may be omitted or another insulating layer may be stacked thereover.

Further, in the imaging device 100 described in this embodiment, an insulating layer 105 having a flat surface is formed over the insulating layer 104. The insulating layer 105 can be formed using a material and a method similar to those of the insulating layer 102. It is also possible to use a low-dielectric constant material (a low-k material), a siloxane-based resin, phosphosilicate glass (PSG), borophosphosilicate glass (BPSG), or the like for the insulating layer 105. Further, the surface of the insulating layer 105 may be subjected to chemical mechanical polishing (CMP) treatment (hereinafter also referred to as CMP treatment). The CMP treatment can reduce unevenness of the surface, whereby coverage with an insulating layer or a conductive layer to be formed later can be increased.

In a region including the insulating layers 103 to 105 which overlaps with the p-type semiconductor layer 221, an opening 224 is formed, and in a region including the insulating layers 103 to 105 which overlaps with the n-type semiconductor layer 223, an opening 225 is formed. Contact plugs 106 are formed in the opening 224 and the opening 225. The contact plugs 106 are formed by filling the openings provided in the insulating layers with a conductive material. As the conductive material, for example, a conductive material with high embeddability, such as tungsten or polysilicon, can be used. Although not illustrated, the side surface and the bottom surface of the material can be covered with a barrier layer (a diffusion prevention layer) such as a titanium layer, a titanium nitride layer, or a stack of these layers. In this case, the barrier film is regarded as part of the contact plug.

Over the insulating layer 105, an electrode 226 and an electrode 227 are formed. The electrode 226 is electrically connected to the p-type semiconductor layer 221 via the contact plug 106 in the opening 224. The electrode 227 is electrically connected to the n-type semiconductor layer 223 via the contact plug 106 in the opening 225.

Further, an insulating layer 107 is formed to cover the electrode 226 and the electrode 227. The insulating layer 107 can be formed using a material and a method that are similar to those of the insulating layer 105. A surface of the insulating layer 107 may be subjected to CMP treatment. The CMP treatment can reduce unevenness of the surface, whereby coverage with an insulating layer or a conductive layer to be formed later can be increased.

The electrode 226 and the electrode 227 can be formed with a single-layer structure or a stacked-layer structure using any of metals such as aluminum, titanium, chromium, nickel, copper, yttrium, zirconium, molybdenum, manganese, silver, tantalum, and tungsten, or an alloy containing any of these metals as its main component. For example, a single-layer structure of a copper film containing manganese; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; a three-layer structure in which a tungsten film, a copper film, and a tungsten film are stacked in this order; and the like can be given. Alternatively, an alloy film or a nitride film in which aluminum and one or more elements selected from titanium, tantalum, tungsten, molybdenum, chromium, neodymium, and scandium are combined may be used.

Note that a conductive material containing oxygen such as indium tin oxide, zinc oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a conductive material containing nitrogen such as titanium nitride or tantalum nitride may be used. It is also possible to use a stacked-layer structure formed using a material containing the above metal element and conductive material containing oxygen. It is also possible to use a stacked-layer structure formed using a material containing the above metal element and conductive material containing nitrogen. It is also possible to use a stacked-layer structure formed using a material containing the above metal element, conductive material containing oxygen, and conductive material containing nitrogen.

The photoelectric conversion element 220 senses the light 660 incident on the insulating layer 102 side.

The transistor included in the pixel 111 may be provided to overlap with the photoelectric conversion element. In FIG. 21, the transistor 241 and a transistor 246 are provided above the photoelectric conversion element 220. Specifically, the transistor 241 and the transistor 246 are formed over the insulating layer 107 with an insulating layer 108 and an insulating layer 109 positioned therebetween. Further, in FIG. 21, a transistor 289 is provided above the transistor 281.

In this embodiment, the transistor 241, the transistor 246 and the transistor 289 are each a top-gate transistor; however, a bottom-gate transistor may be employed.

Alternatively, an inverted staggered transistor or a forward staggered transistor can also be used as the transistors. It is also possible to use a dual-gate transistor, in which a semiconductor layer in which a channel is formed is positioned between two gate electrodes. Further, the transistor is not limited to a transistor having a single-gate structure; a multi-gate transistor having a plurality of channel formation regions, such as a double-gate transistor may be used.

A transistor with any of a variety of structures such as a planar type, a FIN-type, a Tri-Gate type, and the like can be used.

The above transistors may have the same structure or different structures. The size (e.g., channel length and channel width) or the like of each transistor can be adjusted as appropriate.

In the case where all of the plurality of transistors in the imaging device 100 have the same structure, the transistors can be formed concurrently in the same process.

The transistor 241 includes an electrode 243 that can function as a gate electrode, an electrode 244 that can function as one of a source electrode and a drain electrode, an electrode 245 that can function as the other of the source electrode and the drain electrode, an insulating layer 117 that can function as a gate insulating layer, and a semiconductor layer 242 (see FIG. 22).

Note that in FIG. 21, both of the electrode that functions as the other of the source electrode and the drain electrode of the transistor 241 and the electrode that can function as one of the source electrode and the drain electrode of the transistor 246 are formed using the electrode 245. However, one embodiment of the present invention is not limited thereto. The electrode that functions as the other of the source electrode and the drain electrode of the transistor 241 and the electrode that can function as one of the source electrode and the drain electrode of the transistor 246 may be formed using different electrodes.

The insulating layer 108 is preferably formed using an insulating film that has a function of preventing diffusion of impurities such as oxygen, hydrogen, water, alkali metal, and alkaline earth metal. Examples of the insulating film include silicon oxide, silicon oxynitride, silicon nitride, silicon nitride oxide, gallium oxide, hafnium oxide, yttrium oxide, aluminum oxide, aluminum oxynitride, and the like. When the insulating film is formed using silicon nitride, gallium oxide, hafnium oxide, yttrium oxide, aluminum oxide, or the like, impurities diffused from the photoelectric conversion element 220 side can be suppressed from reaching the semiconductor layer 242. Note that the insulating layer 108 can be formed by a sputtering method, a CVD method, an evaporation method, a thermal oxidation method, or the like. The insulating layer 108 can be formed to have a single-layer structure or a stacked-layer structure including any of these materials.

The insulating layer 109 can be formed using a material and a method similar to those of the insulating layer 102. In the case where an oxide semiconductor is used for the semiconductor layer 242, an insulating layer containing oxygen in excess of the stoichiometric composition is preferably used for the insulating layer 108. From the insulating layer containing oxygen at a higher proportion than oxygen in the stoichiometric composition, part of oxygen is released by heating. The insulating layer containing oxygen at a higher proportion than oxygen in the stoichiometric composition is an insulating layer of which the amount of released oxygen converted into oxygen atoms is greater than or equal to $1.0\times10^{18}$ atoms/cm3, preferably greater than or equal to $3.0\times10^{20}$ atoms/cm3 in TDS analysis. Note that the temperature of the film surface in the TDS analysis is preferably higher than or equal to 100° C. and lower than or equal to 700° C., or higher than or equal to 100° C. and lower than or equal to 500° C.

The insulating layer containing oxygen at a higher proportion than the stoichiometric composition can be formed by treatment for adding oxygen to the insulating layer. The treatment for adding oxygen can be performed by heat treatment under an oxygen atmosphere or performed with an ion implantation apparatus, an ion doping apparatus, or a plasma treatment apparatus. As a gas for adding oxygen, an oxygen gas of $16O_2$, $18O_2$, or the like, a nitrous oxide gas, an ozone gas, or the like can be used. In this specification, the treatment for adding oxygen is also referred to as "oxygen doping treatment".

Each semiconductor layer in the transistor 241, the transistor 246, the transistor 289, and the like can be formed using a single crystal semiconductor, a polycrystalline semiconductor, a microcrystalline semiconductor, a nanocrystal semiconductor, a semi-amorphous semiconductor, an amorphous semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

In this embodiment, an example in which an oxide semiconductor is used for the semiconductor layer 242 is described. Furthermore, in this embodiment, a case where the semiconductor layer 242 is a stacked layer including a semiconductor layer 242a, a semiconductor layer 242b, and a semiconductor layer 242c is described.

Each of the semiconductor layer 242a, the semiconductor layer 242b, and the semiconductor layer 242c is formed using a material containing either In or Ga or both of them. Typical examples are an In—Ga oxide (an oxide containing In and Ga), an In—Zn oxide (an oxide containing In and Zn), and an In-M-Zn oxide (an oxide containing In, an element M, and Zn: the element M is one or more kinds of metal elements selected from Al, Ti, Ga, Y, Zr, La, Ce, Nd, and Hf whose strength of bonding with oxygen is higher than that of In).

The semiconductor layer 242a and the semiconductor layer 242c are preferably formed using a material containing one or more kinds of metal elements contained in the semiconductor layer 242b. With use of such a material, interface states at interfaces between the semiconductor layer 242a and the semiconductor layer 242b and between the semiconductor layer 242c and the semiconductor layer 242b are less likely to be generated. Accordingly, carriers are not likely to be scattered or captured at the interfaces, which results in an improvement in field-effect mobility of the transistor. Further, threshold-voltage variation of the transistor can be reduced. Thus, a semiconductor device having favorable electrical characteristics can be obtained.

Each of the thicknesses of the semiconductor layer 242a and the semiconductor layer 242c is greater than or equal to 3 nm and less than or equal to 100 nm, preferably greater than or equal to 3 nm and less than or equal to 50 nm. The thickness of the semiconductor layer 242b is greater than or equal to 3 nm and less than or equal to 200 nm, preferably greater than or equal to 3 nm and less than or equal to 100 nm, further preferably greater than or equal to 3 nm and less than or equal to 50 nm.

In the case where the semiconductor layer 242b is an In-M-Zn oxide and the semiconductor layer 242a and the semiconductor layer 242c are each an In-M-Zn oxide, the semiconductor layer 242a and the semiconductor layer 242c each have the atomic ratio where In:M:Zn=$x_1$:$y_1$:$z_1$, and the semiconductor layer 242b has an atomic ratio where In:M:Zn=$x_2$:$y_2$:$z_2$, for example. In that case, the compositions of the semiconductor layer 242a, the semiconductor layer 242c, and the semiconductor layer 242b are determined so that $y_1/x_1$ is larger than $y_2/x_2$. It is preferable that the compositions of the semiconductor layer 242a, the semiconductor layer 242c, and the semiconductor layer 242b are determined so that $y_1/x_1$ is 1.5 times or more as large as $y_2/x_2$. It is further preferable that the compositions of the semiconductor layer 242a, the semiconductor layer 242c, and the semiconductor layer 242b are determined so that $y_1/x_1$ is twice or more as large as $y_2/x_2$. It is still further preferable that the compositions of the semiconductor layer 242a, the semiconductor layer 242c, and the semiconductor layer 242b are determined so that $y_1/x_1$ is three times or more as large as $y_2/x_2$. At this time, $y_1$ is preferably greater than or equal to $x_1$ in the semiconductor layer 242b, in which case stable electrical characteristics of a transistor can be achieved. However, when $y_1$ is three times or more as large as $x_1$, the field-effect mobility of the transistor is reduced; accordingly, $y_1$ is preferably smaller than three times $x_1$. When the semiconductor layer 242a and the semiconductor layer 242c have the above compositions, the semiconductor layer 242a and the semiconductor layer 242c can each be a layer in which oxygen vacancies are less likely to be generated than that in the semiconductor layer 242b.

In the case where the semiconductor layer 242a and the semiconductor layer 242c are each an In-M-Zn oxide; the atomic percentages of In and the elementMare preferably less than 50 atoms % and more than 50 atoms %, respectively, further preferably less than 25 atomic % and more than 75 atoms %, respectively, where the summation of In and M is assumed to be 100 atomic %. In the case where the semiconductor layer 242b is an In-M-Zn oxide and the summation of In and M is assumed to be 100 atomic %; the atomic percentages of In and the element M are preferably more than 25 atomic % and less than 75 atomic %, respectively, further preferably more than 34 atomic % and less than 66 atomic %, respectively.

For example, an In—Ga—Zn oxide which is formed using a target having an atomic ratio of In:Ga:Zn=1:3:2, 1:3:4, 1:3:6, 1:6:4, 1:9:6, or the like or an In—Ga oxide which is formed using a target having an atomic ratio of In:Ga=1:9 or the like can be used for each of the semiconductor layers 242a and 242c containing In or Ga. Furthermore, an In—Ga—Zn oxide which is formed using a target having an atomic ratio of In:Ga:Zn=3:1:2, 1:1:1, or 5:5:6 can be used for the semiconductor layer 242b. Note that the atomic ratio of each of the semiconductor layer 242a and the semiconductor layer 242b may vary within a range of ±20% of any of the above-described atomic ratios as an error.

In order to give stable electrical characteristics to the transistor including the semiconductor layer 242b, it is preferable that impurities and oxygen vacancies in the semiconductor layer 242b be reduced to obtain a highly purified semiconductor layer; accordingly, the semiconductor layer 242b can be regarded as an intrinsic or substantially intrinsic oxide semiconductor layer. Furthermore, it is preferable that at least the channel formation region of the semiconductor layer 242b be regarded as an intrinsic or substantially intrinsic semiconductor layer.

Note that the substantially intrinsic semiconductor layer refers to an oxide semiconductor layer in which the carrier density is lower than $1\times10^{17}/cm^3$, lower than $1\times10^{15}/cm^3$, or lower than $1\times10^{13}/cm^3$.

Figure 34:
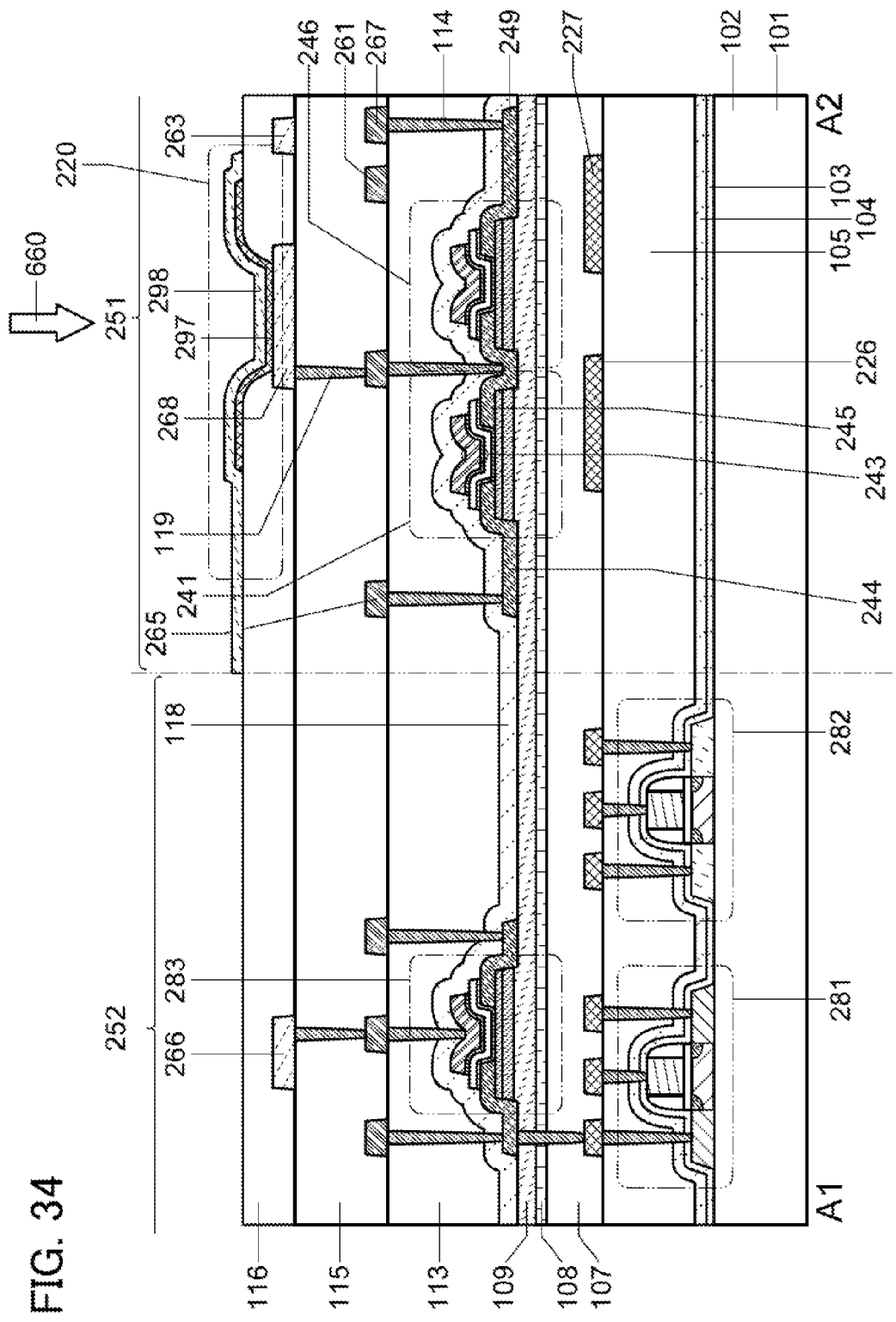
FIG. 34 illustrates a structure example of an imaging device.
Figure 37:
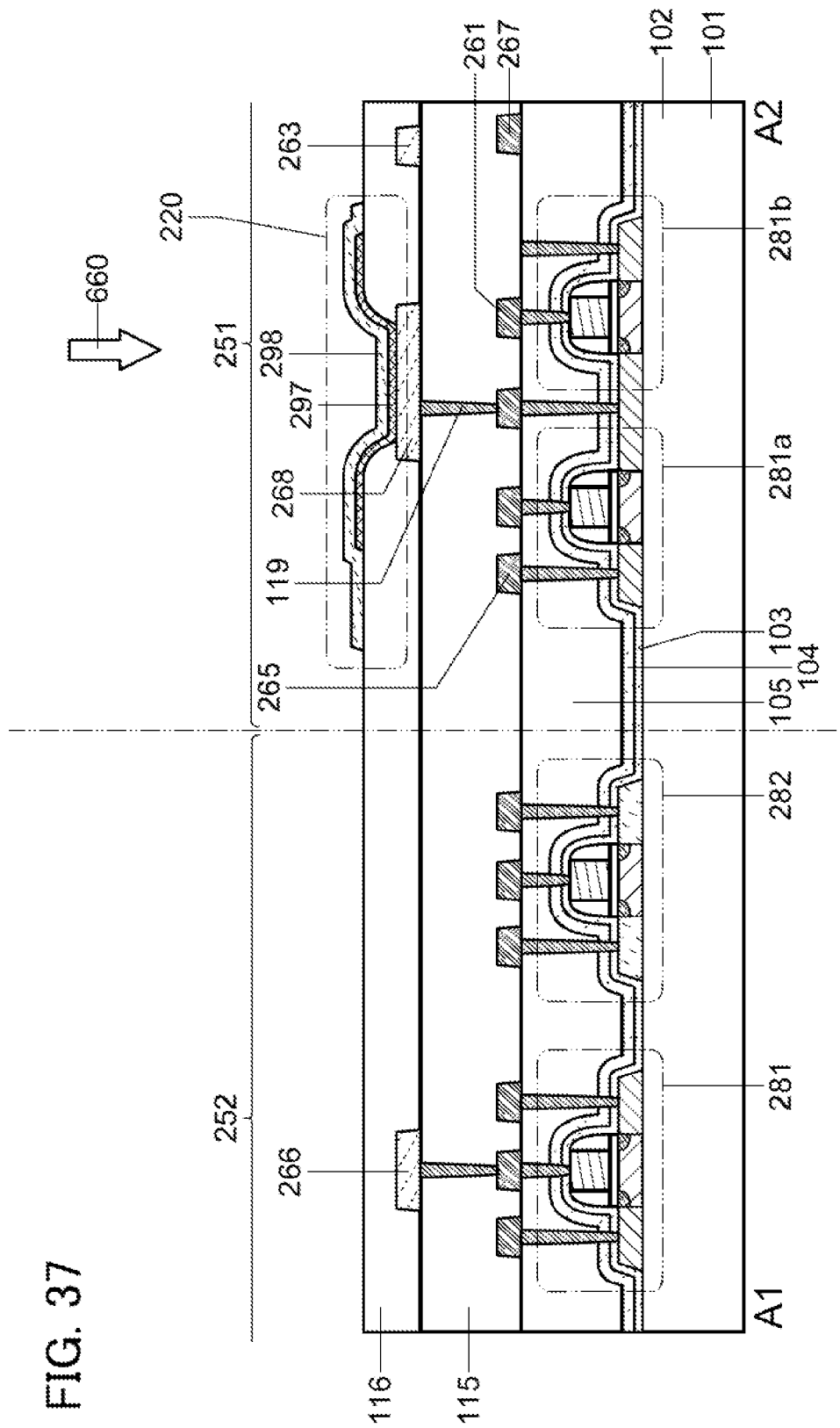
FIG. 37 illustrates a structure example of an imaging device.

Although in FIG. 21 the photoelectric conversion element 220 includes the i-type semiconductor layer 222 positioned between the p-type semiconductor layer 221 and the n-type semiconductor layer 223, the photoelectric conversion element 220 may have a stacked structure as shown in FIG. 34. In the photoelectric conversion element 220 shown in FIG. 34, a photoelectric conversion layer 297 is sandwiched between an electrode 268 and an electrode 298. The electrode 268, which is one of the electrodes of the photoelectric conversion element 220, is electrically connected via the contact plug 119 and the like to the electrode 245 in the transistor 241. As the photoelectric conversion layer 297, a selenium-based semiconductor element $S_{Se}$, described in Embodiment 4 later, may be used, for example. For the electrodes 268 and 298, the materials listed in the description of the electrode 226 may be used, for example. The electrodes 268 and 298 may be formed using different materials or using the same material. Note that it is also possible to form the transistors in the pixel region 251 through the same process as the transistors 281 and 282 in the peripheral circuit region 252, as exemplified by a transistor 281a and a transistor 281b shown in FIG. 37.

Figure 38:
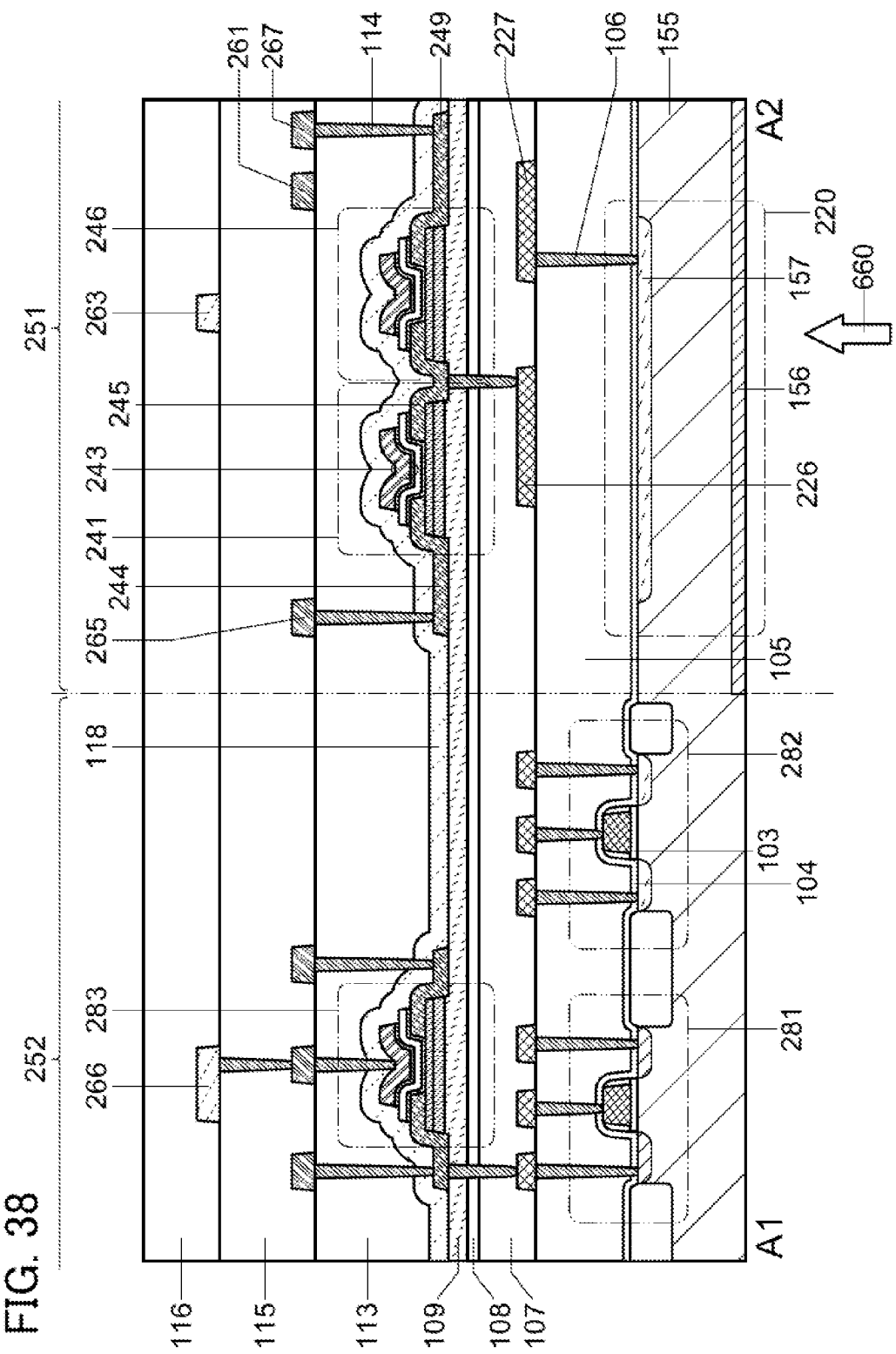
FIG. 38 illustrates a structure example of an imaging device.

Further, a p-type transistor 281, an n-type transistor 282, and the photoelectric conversion element 220 may be formed using a semiconductor substrate 155, as shown in FIG. 38. As the semiconductor substrate 155, for example, a silicon substrate can be used. An n-type semiconductor layer 157 and a p-type semiconductor layer 156 may be used as a cathode and an anode of the photoelectric conversion element 220, respectively, for example. It is preferable that the silicon substrate be thinned by polishing or the like to allow light to be easily transmitted therethrough.

[Energy Band Structure of Oxide Semiconductor]

The function and effect of the semiconductor layer 242 that is a stacked layer including the semiconductor layer 242a, the semiconductor layer 242b, and the semiconductor layer 242c will be described with an energy band structure diagram shown in FIG. 23. FIG. 23 is the energy band structure diagram showing a portion along dashed-dotted line C1-C2 in FIG. 22. Thus, FIG. 23 illustrates the energy band structure of a channel formation region of the transistor 241.

In FIG. 23, Ec382, Ec383a, Ec383b, Ec383c, and Ec386 are the energies of bottoms of the conduction band in the insulating layer 109, the semiconductor layer 242a, the semiconductor layer 242b, the semiconductor layer 242c, and the insulating layer 117, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as an ionization potential). Note that the energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

An example of the energy gap and electron affinity of an In—Ga—Zn oxide formed using a sputtering method will be explained. An In—Ga—Zn oxide which is formed using a target having an atomic ratio of In:Ga:Zn=1:3:2 has an energy gap of approximately 3.5 eV and an electron affinity of approximately 4.5 eV. An In—Ga—Zn oxide which is formed using a target having an atomic ratio of In:Ga:Zn=1:3:4 has an energy gap of approximately 3.4 eV and an electron affinity of approximately 4.5 eV. An In—Ga—Zn oxide which is formed using a target having an atomic ratio of In:Ga:Zn=1:3:6 has an energy gap of approximately 3.3 eV and an electron affinity of approximately 4.5 eV. An In—Ga—Zn oxide which is formed using a target having an atomic ratio of In:Ga:Zn=1:6:2 has an energy gap of approximately 3.9 eV and an electron affinity of approximately 4.3 eV. An In—Ga—Zn oxide which is formed using a target having an atomic ratio of In:Ga:Zn=1:6:8 has an energy gap of approximately 3.5 eV and an electron affinity of approximately 4.4 eV. An In—Ga—Zn oxide which is formed using a target having an atomic ratio of In:Ga:Zn=1:6:10 has an energy gap of approximately 3.5 eV and an electron affinity of approximately 4.5 eV. An In—Ga—Zn oxide which is formed using a target having an atomic ratio of In:Ga:Zn=1:1:1 has an energy gap of approximately 3.2 eV and an electron affinity of approximately 4.7 eV. An In—Ga—Zn oxide which is formed using a target having an atomic ratio of In:Ga:Zn=3:1:2 has an energy gap of approximately 2.8 eV and an electron affinity of approximately 5.0 eV. Note that values obtained as the energy gap and electron affinity of an In—Ga—Zn oxide formed using a sputtering method may change depending on the film formation conditions of the sputtering method.

Since the insulating layer 109 and the insulating layer 117 are insulators, Ec382 and Ec386 are closer to the vacuum level (have a smaller electron affinity) than Ec383a, Ec383b, and Ec383c.

Further, Ec383a is closer to the vacuum level than Ec383b. Specifically, Ec383a is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

Further, Ec383c is closer to the vacuum level than Ec383b. Specifically, Ec383c is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

In the vicinity of an interface between the semiconductor layer 242a and the semiconductor layer 242b and the vicinity of an interface between the semiconductor layer 242b and the semiconductor layer 242c, mixed regions are formed; thus, the energy of the bottom of the conduction band continuously changes. In other words, no state or few states exist at these interfaces.

Accordingly, electrons transfer mainly through the semiconductor layer 242b in the stacked-layer structure having the above energy band structure. Therefore, even when an interface state exists at an interface between the semiconductor layer 242a and the insulating layer 109 or an interface between the semiconductor layer 242c and the insulating layer 117, the interface state hardly influences the transfer of the electrons. In addition, the interface state does not exist or hardly exists at the interface between the semiconductor layer 242a and the semiconductor layer 242b and at the interface between the semiconductor layer 242c and the semiconductor layer 242b; thus, transfer of electrons are not prohibited in the region. Accordingly, high field-effect mobility can be obtained in the transistor 241 having the above stacked-layer structure of the oxide semiconductor layers.

Note that although trap states 390 due to impurities or defects might be formed in the vicinity of the interface between the semiconductor layer 242a and the insulating layer 109 and in the vicinity of the interface between the semiconductor layer 242c and the insulating layer 117 as shown in FIG. 23, the semiconductor layer 242b can be separated from the trap states owing to the existence of the semiconductor layer 242a and the semiconductor layer 242c.

In particular, in the transistor 241 described in this embodiment, an upper surface and a side surface of the semiconductor layer 242b are in contact with the semiconductor layer 242c, and a bottom surface of the semiconductor layer 242b is in contact with the semiconductor layer 242a. In this manner, the semiconductor layer 242b is surrounded by the semiconductor layer 242a and the semiconductor layer 242c, whereby the influence of the trap state can be further reduced.

However, in the case where an energy difference between Ec383a or Ec383c and Ec383b is small, electrons in the semiconductor layer 242b might reach the trap states by passing over the energy gap. The electrons are trapped by the trap states, which generates a negative fixed charge at the interface with the insulating layer, causing the threshold voltage of the transistor to be shifted in the positive direction.

Therefore, each of the energy differences between Ec383a and Ec383b and between Ec383c and Ec383b is preferably set to be larger than or equal to 0.1 eV, more preferably larger than or equal to 0.15 eV, in which case a change in the threshold voltage of the transistor can be reduced and the transistor can have favorable electrical characteristics.

Each of the band gaps of the semiconductor layer 242a and the semiconductor layer 242c is preferably larger than that of the semiconductor layer 242b.

With one embodiment of the present invention, a transistor with a small variation in electrical characteristics can be provided. Accordingly, a semiconductor device with a small variation in electrical characteristics can be provided. With one embodiment of the present invention, a transistor with high reliability can be provided. Accordingly, a semiconductor device with high reliability can be provided.

An oxide semiconductor has a band gap of 2 eV or more; therefore, a transistor including an oxide semiconductor in a semiconductor layer in which a channel is formed has an extremely small off-state current. Specifically, the off-state current per micrometer of channel width at room temperature can be lower than $1 \times 10^{-20}$ A, preferably lower than $1 \times 10^{-22}$ A, more preferably lower than $1 \times 10^{-24}$ A. That is, the on/off ratio of the transistor can be greater than or equal to 20 digits and less than or equal to 150 digits.

In a transistor that transfers the charge obtained through photoelectric conversion of a photodiode to a charge accumulation region, such as the transistor 121 and the transistor 125 in FIG. 5, the channel width is increased to improve the transfer efficiency in some cases. In such cases, the use of an oxide semiconductor for the transistors can achieve extremely small off-state current, and leakage of charge in a charge accumulation region, e.g., leakage of the charge accumulated in the nodes FD[n] and FD[n+1] in FIG. 5, can be suppressed. Thus, imaging time can be shortened. Furthermore, an imaging device with high reliability can be provided.

With one embodiment of the present invention, a transistor with small power consumption can be provided. Accordingly, a semiconductor device with small power consumption can be provided.

Furthermore, since an oxide semiconductor has a wide bandgap, a semiconductor device including an oxide semiconductor can be used in a wide range of ambient temperature. According to one embodiment of the present invention, a semiconductor device which can operate in a wide temperature range can be provided.

Note that the above-described three-layer structure is an example. For example, a two-layer structure without either one of the semiconductor layer 242a and the semiconductor layer 242c may be employed.

[Oxide Semiconductor]

An oxide semiconductor applicable to the semiconductor layer 242 will be described in detail below.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like. In the case of using an oxide semiconductor for the semiconductor layer, a c-axis aligned crystalline oxide semiconductor (CAAC-OS), a polycrystalline oxide semiconductor, a microcrystalline oxide semiconductor, a nanocrystalline oxide semiconductor (nc-OS), an amorphous oxide semiconductor, or the like can be used.

First, a CAAC-OS film will be described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a form reflecting unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary cannot be found clearly in the nc-OS film sometimes for example.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. A diffraction pattern like a halo pattern appears in a selected-area electron diffraction pattern of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film; hence, the nc-OS film has a higher density of defect states than the CAAC-OS film.

Next, an amorphous oxide semiconductor film will be described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description will be given below. For example, for an oxide semiconductor film with an atomic ratio of In:Ga:Zn=1:1:1, the density of single-crystal $InGaZnO_4$ with a rhombohedral crystal structure is 6.357 $g/cm^3$. Thus, for example, for the oxide semiconductor film with an atomic ratio of In:Ga:Zn=1:1:1, the density of an a-like OS film is higher than or equal to 5.0 $g/cm^3$ and lower than 5.9 $g/cm^3$. In addition, for example, for the oxide semiconductor film with an atomic ratio of In:Ga:Zn=1:1:1, the density of an nc-OS film or a CAAC-OS film is higher than or equal to 5.9 $g/cm^3$ and lower than 6.3 $g/cm^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

As an example of an oxide semiconductor that can be used for the semiconductor layer 242a, the semiconductor layer 242b, and the semiconductor layer 242c, an oxide containing indium can be given. An oxide can have a high carrier mobility (electron mobility) by containing indium, for example. An oxide semiconductor preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, magnesium, and the like. Note that two or more of the above elements may be used in combination as the element M. The element M is an element having a high bonding energy with oxygen, for example. The element M is an element that can increase the energy gap of the oxide, for example. Further, the oxide semiconductor preferably contains zinc. When the oxide contains zinc, the oxide is easily to be crystallized, for example.

Note that the oxide semiconductor is not limited to the oxide containing indium. The oxide semiconductor may be, for example, zinc tin oxide, gallium tin oxide, or gallium oxide.

For the oxide semiconductor, an oxide with a wide energy gap is used. For example, the energy gap of the oxide semiconductor is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

Influence of impurities in the oxide semiconductor will be described below. In order to obtain stable electrical characteristics of a transistor, it is effective to reduce the concentration of impurities in the oxide semiconductor to have lower carrier density so that the oxide semiconductor is highly purified. The carrier density of the oxide semiconductor is set to be lower than $1\times10^{17}/cm^3$, lower than $1\times10^{15}/cm^3$, or lower than $1\times10^{13}/cm^3$. In order to reduce the concentration of impurities in the oxide semiconductor, the concentration of impurities in a film which is adjacent to the oxide semiconductor is preferably reduced.

For example, silicon in the oxide semiconductor might serve as a carrier trap or a carrier generation source. The silicon concentration in the oxide semiconductor measured by secondary ion mass spectrometry (SIMS) is lower than $1\times10^{19}$ atoms/cm$^3$, preferably lower than $5\times10^{18}$ atoms/cm$^3$, more preferably lower than $2\times10^{18}$ atoms/cm$^3$.

Furthermore, when hydrogen is contained in the oxide semiconductor, the carrier density is increased in some cases. Thus, the concentration of hydrogen in the oxide semiconductor, which is measured by SIMS, can be set to lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. When nitrogen is contained in the oxide semiconductor, the carrier density is increased in some cases. The concentration of nitrogen in the oxide semiconductor measured by SIMS is set to be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

In order to reduce the hydrogen concentration in the oxide semiconductor, the hydrogen concentrations in the insulating layer 109 and the insulating layer 117 that are in contact with the semiconductor layer 242 are preferably reduced. The hydrogen concentration in the insulating layer 109 and the insulating layer 117 measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. In order to reduce the nitrogen concentration in the oxide semiconductor, the nitrogen concentrations in the insulating layer 109 and the insulating layer 117 are preferably reduced. The nitrogen concentration in the insulating layer 109 and the insulating layer 117 measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

In this embodiment, first, the semiconductor layer 242a is formed over the insulating layer 109, and the semiconductor layer 242b is formed over the semiconductor layer 242a.

A sputtering method is preferably used for formation of the oxide semiconductor layers. As a sputtering method, an RF sputtering method, a DC sputtering method, an AC sputtering method, or the like can be used. A DC sputtering method or an AC sputtering method can achieve uniform deposition as compared to an RF sputtering method.

In this embodiment, as the semiconductor layer 242a, 20-nm-thick In—Ga—Zn oxide is deposited by a sputtering method using an In—Ga—Zn oxide target (In:Ga:Zn=1:3:2). Note that the constituent elements and compositions applicable to the semiconductor layer 242a are not limited thereto.

The oxygen doping treatment may be performed after the formation of the semiconductor layer 242a.

Next, the semiconductor layer 242b is formed over the semiconductor layer 242a. In this embodiment, as the semiconductor layer 242b, 30-nm-thick In—Ga—Zn oxide is deposited by a sputtering method using an In—Ga—Zn oxide target (In:Ga:Zn=1:1:1). Note that the constituent elements and compositions applicable to the semiconductor layer 242b are not limited thereto.

The oxygen doping treatment may be performed after the formation of the semiconductor layer 242b.

Next, heat treatment may be performed to further reduce the impurities such as moisture or hydrogen contained in the semiconductor layer 242a and the semiconductor layer 242b, so that the semiconductor layer 242a and the semiconductor layer 242b are highly purified.

For example, the semiconductor layer 242a and the semiconductor layer 242b are subjected to heat treatment in a reduced-pressure atmosphere, an inert gas atmosphere of nitrogen, a rare gas, or the like, an oxidation atmosphere, or an ultra dry air atmosphere (the moisture amount is 20 ppm (−55° C. by conversion into a dew point) or less, preferably 1 ppm or less, more preferably 10 ppb or less, in the case where the measurement is performed by a dew point meter in a cavity ring down laser spectroscopy (CRDS) system). Note that the oxidation atmosphere refers to an atmosphere including an oxidation gas such as oxygen, ozone, or nitrogen oxide at 10 ppm or higher. The inert gas atmosphere refers to an atmosphere including the oxidation gas at lower than 10 ppm and is filled with nitrogen or a rare gas.

By heat treatment, oxygen included in the insulating layer 109 can be diffused into the semiconductor layer 242a and the semiconductor layer 242b, concurrently with the release of impurities, so that oxygen vacancies in the semiconductor layer 242a and the semiconductor layer 242b can be reduced. Note that the heat treatment may be performed in such a manner that heat treatment is performed in an inert gas atmosphere, and then another heat treatment is performed in an atmosphere containing an oxidizing gas at 10 ppm or more, 1% or more, or 10% or more. The heat treatment may be performed at any time after the semiconductor layer 242b is formed. For example, the heat treatment may be performed after the semiconductor layer 242b is selectively etched.

The heat treatment can be performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

Next, a resist mask is formed over the semiconductor layer 242b, and with use of the resist mask, part of the semiconductor layer 242a and part of the semiconductor layer 242b are etched selectively. At this time, the insulating layer 109 might be partly etched, thereby having a projection.

Either of a dry etching method or a wet etching method may be used for etching of the semiconductor layer 242a and the semiconductor layer 242b, or both of them may be used. After the etching, the resist mask is removed.

In the transistor 241, the electrode 244 and the electrode 245 that are in contact with part of the semiconductor layer 242b are provided over the semiconductor layer 242b. The electrode 244 and the electrode 245 (including another electrode or wiring that is formed in the same layer as these electrodes) can be formed using a material and a method similar to those of the wiring 226.

In addition, the transistor 241 includes the semiconductor layer 242c over the semiconductor layer 242b, the electrode 244, and the electrode 245. The semiconductor layer 242c is partly in contact with each of the semiconductor layer 242b, the electrode 244, and the electrode 245.

In this embodiment, the semiconductor layer 242c is formed by a sputtering method using an In—Ga—Zn oxide target (In:Ga:Zn=1:3:2). Note that the constituent elements and compositions applicable to the semiconductor layer 242c are not limited thereto. For example, oxide gallium may be used for the semiconductor layer 242c. Furthermore, oxygen doping treatment may be performed on the semiconductor layer 242c.

Furthermore, in the transistor 241, the insulating layer 117 is provided over the semiconductor layer 242c. The insulating layer 117 can function as a gate insulating layer. The insulating layer 117 can be formed using a material and a method similar to those of the insulating layer 102. The oxygen doping treatment may be performed on the insulating layer 117.

After the semiconductor layer 242c and the insulating layer 117 are formed, a mask is formed over the insulating layer 117, and parts of the semiconductor layer 242c and the insulating layer 117 are selectively etched, so that the semiconductor layer 242c and the insulating layer 117 may be formed into island shapes.

Moreover in the transistor 241, the electrode 243 is provided over the insulating layer 117. The electrode 243 (including another electrode or wiring that is formed in the same layer as this electrode) can be formed using a material and a method similar to those of the wiring 226.

In this embodiment, an example in which the electrode 243 has a stacked-layer structure including an electrode 243a and an electrode 243b is shown. For example, the electrode 243a is formed using tantalum nitride, and the electrode 243b is formed using copper. The electrode 243a functions as a barrier layer to prevent copper diffusion. Thus, a semiconductor device with high reliability can be obtained.

Moreover, the transistor 241 includes an insulating layer 118 covering the electrode 243. The insulating layer 118 can be formed using a material and a method similar to those of the insulating layer 102. The oxygen doping treatment may be performed on the insulating layer 117. Furthermore, a surface of the insulating layer 118 may be subjected to CMP treatment. The CMP treatment can reduce unevenness of the surface, whereby coverage with an insulating layer or a conductive layer to be formed later can be increased.

In addition, an insulating layer 113 is formed over the insulating layer 118. The insulating layer 113 can be formed using a material and a method similar to those of the insulating layer 105. A surface of the insulating layer 113 may be subjected to CMP treatment. The CMP treatment can reduce unevenness of the surface, whereby coverage with an insulating layer or a conductive layer to be formed later can be increased. In addition, an opening is formed in parts of the insulating layer 113 and the insulating layer 118. Contact plugs 114 are formed in the openings.

Over the insulating layer 113, a wiring 261, a wiring 265, and a wiring 267 (including another electrode or wiring formed in the same layer as the wirings) are formed. The wiring 267 is electrically connected to an electrode 249 via the contact plug 114 in the opening formed through the insulating layer 113 and the insulating layer 118. The wiring 265 is electrically connected to the electrode 244 via the contact plug 114 in the opening formed in the insulating layer 113 and the insulating layer 118.

The imaging device 100 includes an insulating layer 115 to cover the wiring 261, the wiring 265, and the wiring 267 (including another electrode or wiring formed in the same layer as the wirings). The insulating layer 115 can be formed using a material and a method similar to those of the insulating layer 105. A surface of the insulating layer 115 may be subjected to CMP treatment. The CMP treatment can reduce unevenness of the surface, and coverage whereby an insulating layer or a conductive layer to be formed later can be increased. In addition, an opening is formed in part of the insulating layer 115. A contact plug 114 is formed in the opening.

Further, a wiring 263 and a wiring 266 (including another electrode or wiring that is formed in the same layer as these wirings) are formed over the insulating layer 115.

Each of the wiring 263 and the wiring 266 (including another electrode or wiring formed in the same layer as the wirings) can be electrically connected to another wiring or another electrode via an opening and a contact plug formed through the insulating layer.

Further, an insulating layer 116 is provided to cover the wiring 263 and the wiring 266. The insulating layer 116 can be formed using a material and a method similar to those of the insulating layer 105. A surface of the insulating layer 116 may be subjected to CMP treatment.

The transistor 241 illustrated in FIG. 21 corresponds to the transistor 121, for example. When a transistor included in a pixel is provided over the photoelectric conversion element 220, an area occupied by the photoelectric conversion element 220 can be increased in a plan view. Accordingly, the light sensitivity of the imaging device 100 can be improved. Moreover, it is possible to provide the imaging device 100 whose light sensitivity is less likely to decrease even when the resolution is increased.

FIG. 24A is an enlarged cross-sectional view of the transistor 281 illustrated in FIG. 21 as an example of a transistor included in a peripheral circuit. FIG. 24B is an enlarged cross-sectional view of the transistor 282 illustrated in FIG. 21. In this embodiment, the transistor 281 is a p-channel transistor, and the transistor 282 is an n-channel transistor, for example.

The transistor 281 includes an i-type semiconductor layer 283 in which a channel is formed, p-type semiconductor layers 285, an insulating layer 286, an electrode 287, and sidewalls 288. At a region overlapping with the sidewall 288 in the i-type semiconductor layer 283, low-concentration p-type impurity regions 284 are provided.

The i-type semiconductor layer 283 included in the transistor 281 can be formed in a step of forming the i-type semiconductor layer 222 in the photoelectric conversion element 220 at the same time. The p-type semiconductor layer 285 included in the transistor 281 can be formed in a step of forming the p-type semiconductor layer 221 in the photoelectric conversion element 220 at the same time.

The insulating layer 286 can function as a gate insulating layer. The electrode 287 can function as a gate electrode. The low-concentration p-type impurity regions 284 can be formed in such a manner that an impurity element is added with the use of the electrode 287 as a mask after formation of the electrode 287 and before the formation of the sidewalls 288. In other words, the low-concentration p-type impurity regions 284 can be formed in a self-aligned manner. The low-concentration p-type impurity regions 284 have the same conductivity type as that of the p-type semiconductor layer 285, and lower concentration of impurities imparting conductivity type than the p-type semiconductor layer 285.

The transistor 282 has a structure similar to that of the transistor 281; however, there is a difference in that low-concentration n-type impurity regions 294 and an n-type semiconductor layer 295 are provided, instead of the low-concentration p-type impurity regions 284 and the p-type semiconductor layer 285.

The n-type semiconductor layers 295 included in the transistor 282 can be formed in a step of forming the n-type semiconductor layers 223 in the photoelectric conversion element 220 at the same time. As in the case of the transistor 281, the low-concentration n-type impurity regions 294 can be formed in a self-aligned manner. The low-concentration n-type impurity regions 294 have the same conductivity type as that of the n-type semiconductor layers 295 and lower concentration of impurities imparting the conductivity type than the n-type semiconductor layers 295.

Although the variety of films such as the metal film, the semiconductor film, the inorganic insulating film which are disclosed in this specification and the like can be formed by a sputtering method or a plasma chemical vapor deposition (CVD) method, such films may be formed by another method, for example, a thermal CVD method. A metal organic chemical vapor deposition (MOCVD) method or an atomic layer deposition (ALD) method, for example, may be employed as a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied at a time to the chamber, in which the pressure is set to an atmospheric pressure or a reduced pressure, and react with each other in the vicinity of the substrate or over the substrate.

Deposition by an ALD method may be performed in such a manner that source gases for reaction are sequentially introduced into the chamber, in which the pressure is set to an atmospheric pressure or a reduced pressure, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute field effect transistor (FET).

The variety of films such as the metal film, the semiconductor film, and the inorganic insulating film which have been disclosed in the embodiment can be formed by a thermal CVD method such as a MOCVD method or an ALD method. For example, for forming an In—Ga—Zn—O film, trimethylindium, trimethylgallium, and dimethylzinc are used. The chemical formula of trimethylindium is $In(CH_3)_3$. The chemical formula of trimethylindium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source material gas which is obtained by vaporizing liquid containing a solvent and a hafnium precursor compound (hafnium alkoxide or hafnium amide such as tetrakis(dimethylamide) hafnium (TDMAH)) are used. The chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. The chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced a plurality of times to form an initial tungsten film, and then a $WF_6$ gas and an $H_2$ gas are concurrently introduced, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced a plurality of times to form an In—O layer, a $Ga(CH_3)_3$ gas and an $O_3$ gas are sequentially introduced plural times to form a GaO layer, and then a $Zn(CH_3)_2$ gas and an $O_3$ gas are sequentially introduced plural times to form a ZnO layer. Note that the order of these layers is not limited to this example. A mixed compound layer such as an In—Ga—O layer, an In—Zn—O layer, or a Ga—Zn—O layer may be formed by mixing these gases. Note that although an $H_2O$ gas which is obtained by bubbling water with an inert gas such as Ar may be used instead of an $O_3$ gas, it is preferable to use an $O_3$ gas, which does not contain H. Further, instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Furthermore, a Zn(CH$_3$)$_2$ gas may be used.

This embodiment can be implemented in an appropriate combination with any of the structures described in the other embodiments.

Embodiment 4

The peripheral circuit and the pixel circuit can be provided with, as appropriate, a logic circuit such as an OR circuit, an AND circuit, a NAND circuit, and a NOR circuit, an inverter circuit, a buffer circuit, a shift register circuit, a flip-flop circuit, an encoder circuit, a decoder circuit, an amplifier circuit, an analog switch circuit, an integrator circuit, a differentiation circuit, a memory element, and the like.

In this embodiment, an example of a CMOS circuit that can be used for the peripheral circuit and the pixel circuit, or the like will be described with reference to FIGS. 25A to 25E. In the circuit diagrams in FIGS. 25A to 25E, the indication of "OS" is given beside a transistor in order to clearly demonstrate that the transistor includes an oxide semiconductor.

Figure 25A:
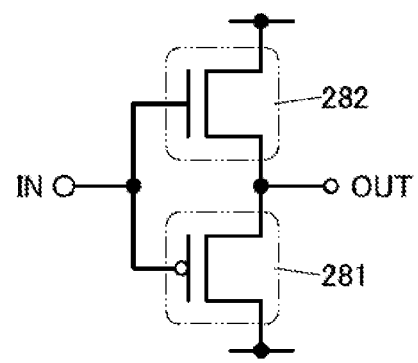
FIGS. 25A to 25E each illustrate an example of a circuit configuration.

The CMOS circuit shown in FIG. 25A has a configuration of what is called an inverter circuit in which the p-channel transistor 281 and the n-channel transistor 282 are connected to each other in series and in which gates of the transistors are connected to each other.

Figure 25B:
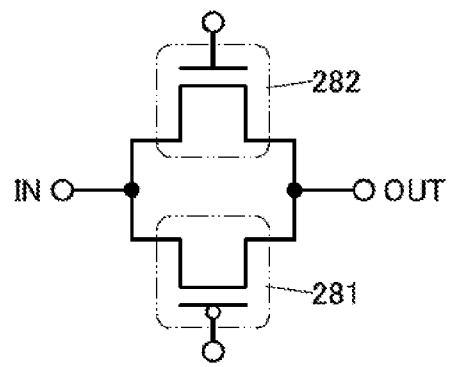

The CMOS circuit shown in FIG. 25B has a configuration of what is called an analog switch circuit in which the p-channel transistor 281 and the n-channel transistor 282 are connected to each other in parallel.

Figure 25C:
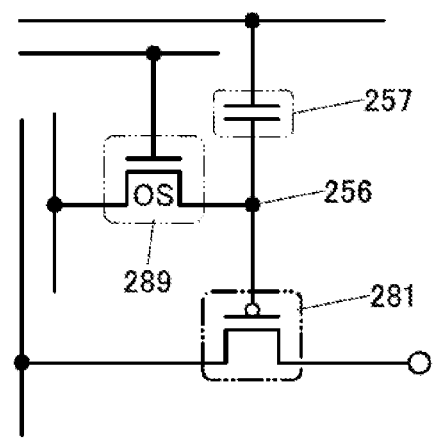

The circuit shown in FIG. 25C has a configuration of what is called a memory element in which one of a source and a drain of the n-channel transistor 289 is connected to a gate of the p-channel transistor and one electrode of a capacitor 257. The circuit shown in FIG. 25D has a configuration of what is called a memory element in which one of a source and a drain of the n-channel transistor 289 is connected to one electrode of the capacitor 257.

Figure 25D:
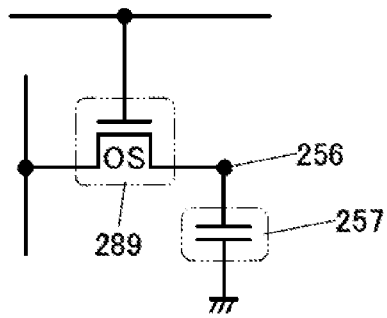

In each of the circuits shown in FIGS. 25C and 25D, charge injected from the other of the source and the drain of the transistor 289 can be stored at a node 256. The transistor 289 is a transistor including an oxide semiconductor, which enables charge to be stored at the node 256 for a long period. The transistor 281 may also be a transistor including an oxide semiconductor in a semiconductor layer in which a channel is formed.

Figure 25E:
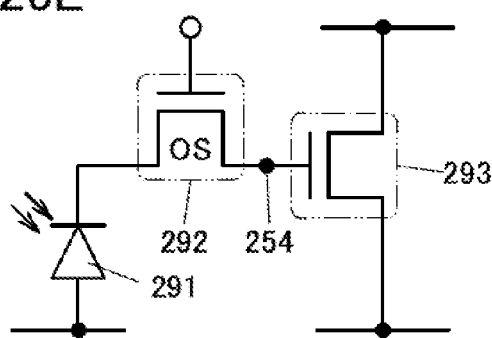

The circuit shown in FIG. 25E has a configuration example of an optical sensor. In FIG. 25E, one of a source and a drain of a transistor 292 using an oxide semiconductor for a semiconductor layer in which a channel is formed is electrically connected to a photodiode 291, and the other of the source and the drain of the transistor 292 is electrically connected to a gate of a transistor 293 via a node 254. The transistor 292 using an oxide semiconductor for a semiconductor layer in which a channel is formed has the extremely small amount of off-state current; thus, the potential of the node 254 that is determined in accordance with the amount of received light hardly changes. Thus, an imaging device which is less likely to be affected by noise can be provided. Further, an imaging device with high linearity can be provided.

The photodiode 291 in the circuit diagram of FIG. 25E may be a sensor S$_{IS}$.

An element which is capable of converting a given physical amount into the amount of current Is flowing in the element is preferable as the sensor S$_{IS}$. Alternatively, an element which is capable of converting a given physical amount into another physical amount and then converting it into the amount of current flowing in the element is preferable.

For the sensor S$_{IS}$, a variety of sensors can be used. For example, the sensor S$_{IS}$ can be a temperature sensor, an optical sensor, a gas sensor, a flame sensor, a smoke sensor, a humidity sensor, a pressure sensor, a flow sensor, a vibration sensor, a voice sensor, a magnetic sensor, a radiation sensor, a smell sensor, a pollen sensor, an acceleration sensor, an inclination sensor, a gyro sensor, a direction sensor, or a power sensor.

For example, when an optical sensor is used as the sensor S$_{IS}$, the above-described photodiode or a phototransistor can be used.

When a gas sensor is used as the sensor S$_{IS}$, a semiconductor gas sensor which detects change in resistance of a metal oxide semiconductor such as tin oxide due to its contact with a gas, a catalytic combustion type gas sensor, or a solid electrolyte-type gas sensor can be used.

Figure 26A:
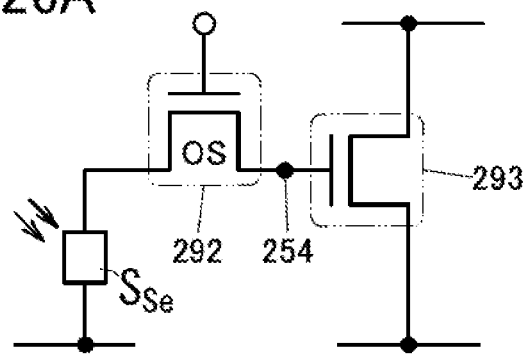
FIGS. 26A to 26C each illustrate an example of an optical sensor.

Further, a circuit diagram in which the photodiode 291 in the optical sensor shown in FIG. 25E is a photoelectric conversion element that includes a selenium-based semiconductor element S$_{Se}$ is shown in FIG. 26A as an example.

A photoelectric conversion element including the selenium-based semiconductor element S$_{Se}$ is an element which is capable of conducting photoelectric conversion utilizing a phenomenon called avalanche multiplication, in which a plurality of electrons can be taken from one incident photon by application of voltage. Therefore, in the optical sensor using the photoelectric conversion element including the selenium-based semiconductor element S$_{Se}$, the gain of electrons to the amount of incident light can be large; therefore, a highly sensitive sensor can be obtained.

For the selenium-based semiconductor element S$_{Se}$, a selenium-based semiconductor including an amorphous structure or a selenium-based semiconductor including a crystalline structure can be used. For example, the selenium-based semiconductor including a crystalline structure may be obtained in such a manner that a selenium-based semiconductor including an amorphous structure is deposited and subjected to heat treatment. Note that it is preferable that the crystal grain diameter of the selenium-based semiconductor including a crystalline structure be smaller than a pixel pitch because variation in characteristics of the pixels is reduced and the image quality of an image to be obtained becomes uniform.

A selenium-based semiconductor including a crystalline structure among the selenium-based semiconductors S$_{Se}$ has a characteristic of having a light absorption coefficient in a wide wavelength range. Therefore, the selenium-based semiconductor including a crystalline structure can be used as an imaging element for light in a wide wavelength range, such as visible light, ultraviolet light, X-rays, and gamma rays, and can be used as what is called a direct conversion element, which is capable of directly converting light in a short wavelength range, such as X-rays and gamma rays, into charge.

Figure 26B:
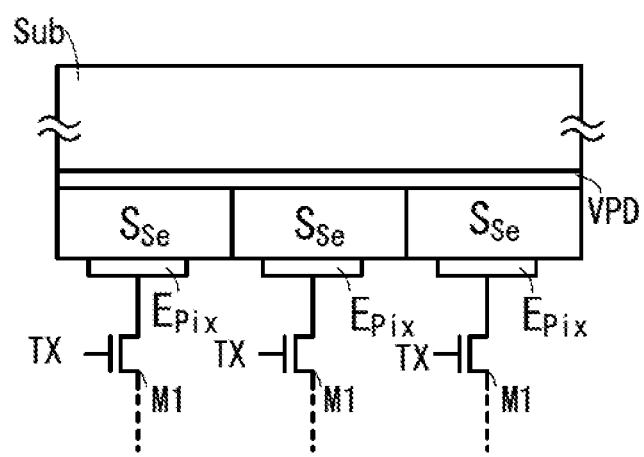

FIG. 26B is a cross-sectional schematic view corresponding to part of the circuit configuration of FIG. 26A. FIG. 26B illustrates transistors M1, electrodes E$_{Pix}$ connected to the transistors M1, the selenium-based semiconductor elements S$_{Se}$, an electrode E$_{VPD}$, and a substrate Sub.

Light is emitted from the side where the electrode $E_{VPD}$ and the substrate Sub are formed toward the selenium-based semiconductor elements $S_{Se}$. Therefore, the electrode $E_{VPD}$ and the substrate Sub preferably transmit light. Indium tin oxide can be used for the electrode $E_{VPD}$, and a glass substrate can be used as the substrate Sub.

The selenium-based semiconductor elements $S_{Se}$ and the electrodes $E_{VPD}$ stacked over the selenium-based semiconductor elements $S_{Se}$ can be used without being processed in their shapes in accordance with each pixel. A step for processing the shape can be omitted, leading to a reduction in the manufacturing cost and improvement in the manufacturing yield.

For example, a chalcopyrite-based semiconductor can be used for the selenium-based semiconductor element $S_{Se}$. Specifically, $CuIn_{1-x}Ga_xSe_2$ ($0 \leq x \leq 1$, abbreviated to CIGS) can be used, for example. CIGS can be formed by an evaporation method, a sputtering method, or the like.

The selenium-based semiconductor element $S_{Se}$ formed using a chalcopyrite-based semiconductor can perform avalanche multiplication by being applied with a voltage of several volts (from 5 V to 20 V). By application of voltage to the selenium-based semiconductor element $S_{Se}$, the movement of signal charge generated owing to light irradiation can have high linearity. Note that when the thickness of the selenium-based semiconductor element $S_{Se}$ is smaller than or equal to 1 μm, the application voltage can be made smaller.

Note that in the case where the thickness of the selenium-based semiconductor element $S_{Se}$ is small, dark current flows at the time of application of voltage; however, providing a layer for inhibiting dark current from flowing in the CIGS that is a chalcopyrite-based semiconductor (hole-injection barrier layer) can prevent the dark current from flowing. An oxide semiconductor such as gallium oxide can be used for the hole-injection barrier layer. The thickness of the hole-injection barrier layer is preferably smaller than that of the selenium-based semiconductor element $S_{Se}$.

Figure 26C:
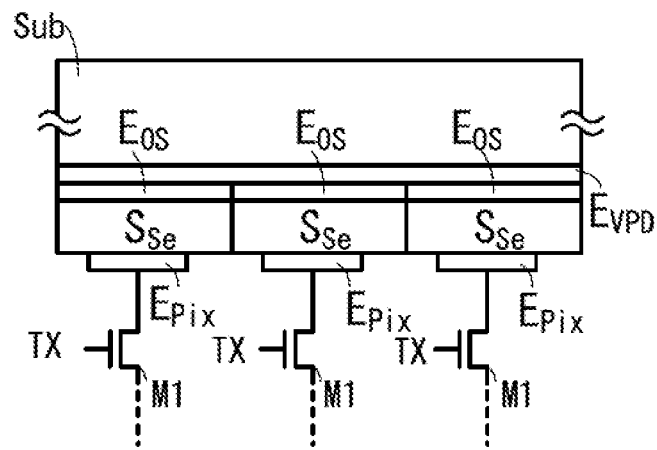

FIG. 26C is a schematic cross-sectional view different from that of FIG. 26B. FIG. 26C shows hole-injection barrier layers $E_{OS}$ together with the transistors M1, the electrodes $E_{Pix}$ connected to the transistors M1, the selenium-based semiconductor elements $S_{Se}$, the electrode $E_{VPD}$, and the substrate Sub.

As described above, use of the selenium-based semiconductor element $S_{Se}$ as a sensor can reduce the manufacturing cost and characteristic variation among pixels and improves the manufacturing yield; as a result, a highly sensitive sensor can be obtained.

Figure 27A:
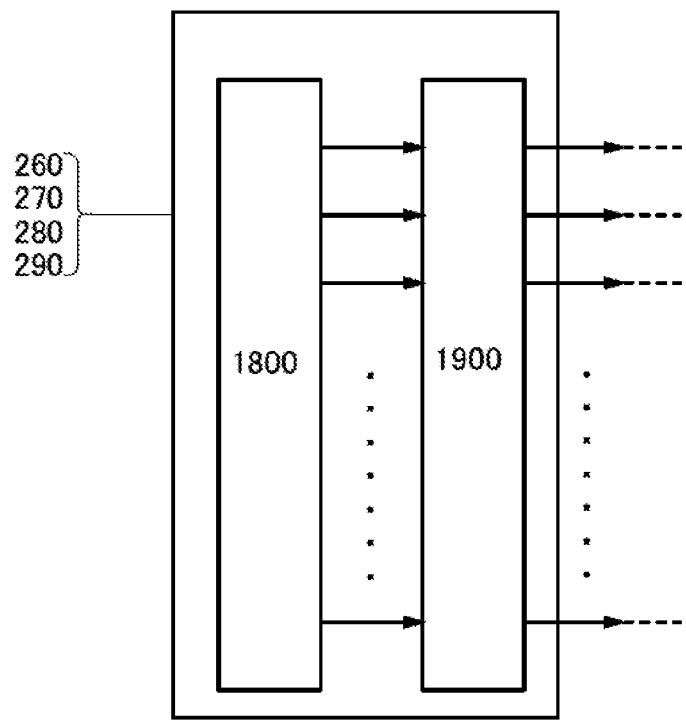
FIGS. 27A and 27B each illustrate an example of a circuit configuration.
Figure 27B:
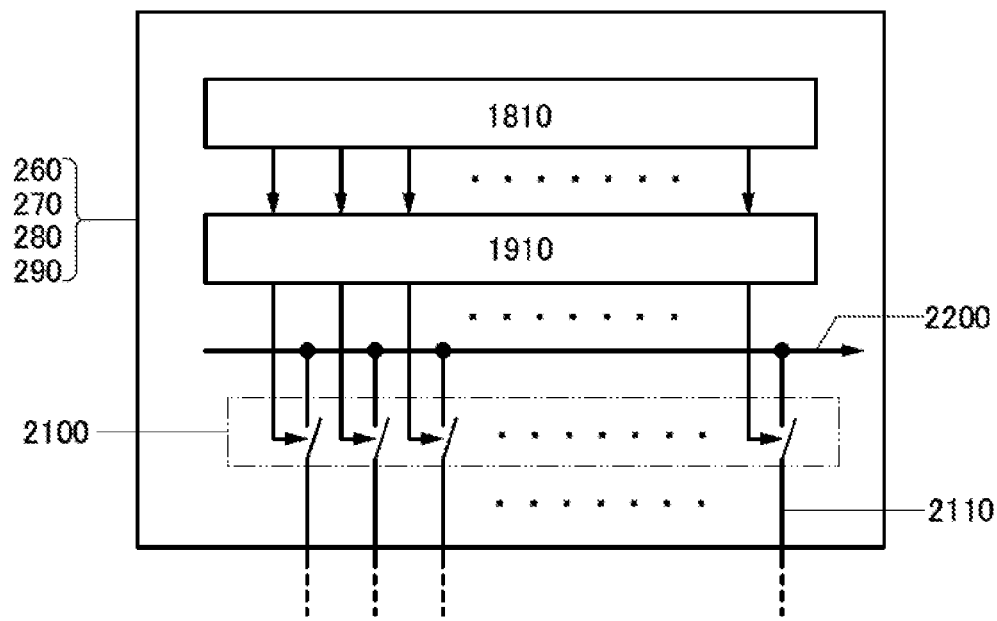

For the peripheral circuit, a circuit in which a shift register circuit 1800 and a buffer circuit 1900 are combined, shown in FIG. 27A, may be provided. Alternatively, for the peripheral circuit, a circuit in which a shift register circuit 1810, a buffer circuit 1910, and an analog switch circuit 2100 are combined, as shown in FIG. 27B, may be provided. Vertical output lines 2110 are selected by the analog switch circuit 2100, and output signals are output to an output line 2200. The analog switch circuit 2100 can be sequentially selected by the shift register circuit 1810 and the buffer circuit 1910.

Figure 28A:
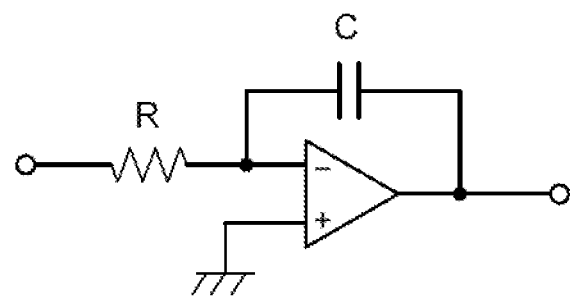
FIGS. 28A to 28C each illustrate an example of a circuit configuration.
Figure 28B:
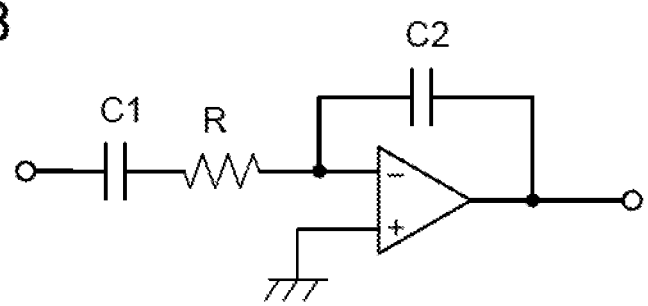
Figure 28C:
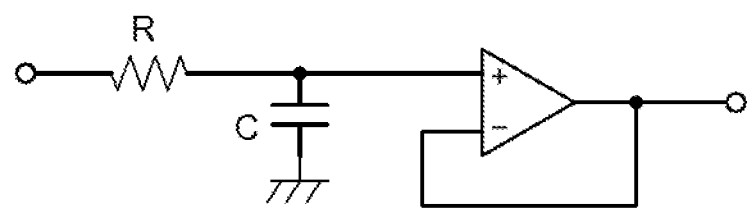

In the circuit diagrams shown in the above embodiment, any of integrator circuits shown in FIGS. 28A, 28B, and 28C may be connected to the wiring 137 (OUT). The circuit enables an S/N ratio of a reading signal to be increased, which makes it possible to sense weaker light, that is, to increase the sensitivity of the imaging device.

FIG. 28A illustrates an integrator circuit using an operational amplifier circuit (also referred to as an op-amp). An inverting input terminal of the operational amplifier circuit is connected to the wiring 137 via a resistor R. A non-inverting input terminal of the operational amplifier circuit is grounded. An output terminal of the operational amplifier circuit is connected to the inverting input terminal of the operational amplifier circuit via a capacitor C.

FIG. 28B illustrates an integrator circuit using an operational amplifier circuit having a structure different from that in FIG. 28A. An inverting input terminal of the operational amplifier circuit is connected to the wiring 137 (OUT) via the resistor R and a capacitor C1. A non-inverting input terminal of the operational amplifier circuit is grounded. An output terminal of the operational amplifier circuit is connected to the inverting input terminal of the operational amplifier circuit via a capacitor C2.

FIG. 28C illustrates an integrator circuit using an operational amplifier circuit having a structure different from those in FIGS. 28A and 28B. A non-inverting input terminal of the operational amplifier circuit is connected to the wiring 137 (OUT) via the resistor R. An output terminal of the operational amplifier circuit is connected to an inverting input terminal of the operational amplifier circuit. The resistor R and the capacitor C constitute a CR integrator circuit. The operational amplifier circuit constitutes a unity gain buffer.

This embodiment can be implemented in an appropriate combination with any of the structures described in the other embodiments.

Embodiment 5

In this embodiment, a structure example of a transistor that can be used as the transistor described in the above embodiments will be described with reference to FIGS. 29A1, 29A2, 29B1, and 29B2, FIGS. 30A1, 30A2, 30A3, 30B1, and 30B2, and FIGS. 31A to 31C.

<Bottom-Gate Transistor>

A transistor 410 shown in FIG. 29A1 as an example is a channel-protective transistor that is a type of bottom-gate transistor. The transistor 410 includes an insulating layer 209 that can function as a channel protective layer over a channel formation region in the semiconductor layer 242. The insulating layer 209 can be formed using a material and a method that are similar to those of the insulating layer 117. Part of an electrode 244 and part of an electrode 245 are formed over the insulating layer 209.

With the insulating layer 209 provided over the channel formation region, the semiconductor layer 242 can be prevented from being exposed at the time of forming the electrode 244 and the electrode 245. Thus, the semiconductor layer 242 can be prevented from being reduced in thickness at the time of forming the electrode 244 and the electrode 245. According to one embodiment of the present invention, a transistor with favorable electrical characteristics can be provided.

A transistor 411 illustrated in FIG. 29A2 is different from the transistor 410 in that an electrode 213 that can function as a back gate electrode is provided over the insulating layer 118. The electrode 213 can be formed using a material and a method that are similar to those of the electrode 243.

In general, the back gate electrode is formed using a conductive layer and positioned so that the channel formation region of the semiconductor layer is positioned between the gate electrode and the back gate electrode. Thus, the back gate electrode can function in a manner similar to that of the gate electrode. The potential of the back gate electrode may be the same as that of the gate electrode or may be a GND potential or a predetermined potential. By changing the potential of the back gate electrode independently of the potential of the gate electrode, the threshold voltage of the transistor can be changed.

The electrodes 243 and 213 can both function as gate electrodes. Thus, the insulating layers 117, 209, and 118 can all function as gate insulating layers.

In the case where one of the electrode 243 and the electrode 213 is simply referred to as a "gate electrode", the other can be referred to as a "back gate electrode". For example, in the transistor 411, in the case where the electrode 213 is referred to as a "gate electrode", the electrode 243 may be referred to as a "back gate electrode". In the case where the electrode 213 is used as a "gate electrode", the transistor 411 can be considered as a kind of top-gate transistor. Furthermore, one of the electrode 243 and the electrode 213 may be referred to as a "first gate electrode", and the other may be referred to as a "second gate electrode".

By providing the electrode 243 and the electrode 213 with the semiconductor layer 242 positioned therebetween and setting the potentials of the electrode 243 and the electrode 213 to be the same, a region of the semiconductor layer 242 through which carriers flow is enlarged in the film thickness direction; thus, the number of transferred carriers is increased. As a result, the on-state current and the field-effect mobility of the transistor 411 are increased.

Therefore, the transistor 411 has large on-state current for the area occupied thereby. That is, the area occupied by the transistor 411 can be small for required on-state current. With one embodiment of the present invention, the area occupied by a transistor can be reduced. Therefore, with one embodiment of the present invention, a semiconductor device having a high degree of integration can be provided.

Furthermore, the gate electrode and the back gate electrode are formed using conductive layers and thus each have a function of preventing an electric field generated outside the transistor from influencing the semiconductor layer in which the channel is formed (in particular, a blocking function against static electricity).

Since the electrode 243 and the electrode 213 each have a function of blocking an electric field generated outside, the charge of charged particles and the like generated on the insulating layer 109 side or above the electrode 213 does not influence the channel formation region in the semiconductor layer 242. Therefore, degradation in a stress test (e.g., a negative gate bias temperature (−GBT) stress test in which negative charge is applied to a gate) can be reduced, and changes in the rising voltages of on-state current at different drain voltages can be reduced. Note that this effect can be obtained when the electrodes 243 and 213 have the same potential or different potentials.

The BT stress test is one kind of accelerated test and can evaluate, in a short time, a change caused by long-term use (i.e., a change over time) in characteristics of transistors. In particular, the amount of change in threshold voltage of the transistor between before and after the BT stress test is an important indicator when examining the reliability of the transistor. If the amount of change in the threshold voltage between before and after the BT stress test is small, the transistor has higher reliability.

By providing the electrode 243 and the electrode 213 and setting the potentials of the electrode 243 and the electrode 213 to be the same, the change in threshold voltage is reduced. Accordingly, variation in electrical characteristics among a plurality of transistors is also reduced.

The transistor including the back gate electrode has a smaller change in threshold voltage by a positive GBT stress test in which positive electric charge is applied to a gate than a transistor including no back gate electrode.

In the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

With one embodiment of the present invention, a transistor with high reliability can be provided. Moreover, a semiconductor device with high reliability can be provided.

A transistor 420 shown in FIG. 29B1 as an example is a channel-protective transistor that is a type of bottom-gate transistor. The transistor 420 has substantially the same structure as the transistor 410 but is different from the transistor 410 in that the insulating layer 209 covers the semiconductor layer 242. Furthermore, the semiconductor layer 242 is electrically connected to the electrode 244 in the opening which is formed by selectively removing part of the insulating layer 209 overlapping the semiconductor layer 242. Furthermore, the semiconductor layer 242 is electrically connected to the electrode 245 in the opening which is formed by selectively removing part of the insulating layer 209 overlapping the semiconductor layer 242. A region of the insulating layer 209 which overlaps the channel formation region can function as a channel protective layer.

A transistor 421 illustrated in FIG. 29B2 is different from the transistor 420 in that the electrode 213 that can function as a back gate electrode is provided over the insulating layer 118.

With the insulating layer 209, the semiconductor layer 242 can be prevented from being exposed at the time of forming the electrode 244 and the electrode 245. Thus, the semiconductor layer 242 can be prevented from being reduced in thickness at the time of forming the electrode 244 and the electrode 245.

The distance between the electrode 244 and the electrode 243 and the distance between the electrode 245 and the electrode 243 in the transistors 420 and 421 are longer than those in the transistors 410 and 411. Thus, the parasitic capacitance generated between the electrode 244 and the electrode 243 can be reduced. The parasitic capacitance generated between the electrode 245 and the electrode 243 can also be reduced. According to one embodiment of the present invention, a transistor with favorable electrical characteristics can be provided.

<Top-Gate Transistor>

A transistor 430 shown in FIG. 30A1 as an example is a type of top-gate transistor. The transistor 430 includes the semiconductor layer 242 over the insulating layer 109; the electrode 244 in contact with part of the semiconductor layer 242 and the electrode 245 in contact with part of the semiconductor layer 242, over the semiconductor layer 242 and the insulating layer 109; the insulating layer 117 over the semiconductor layer 242, the electrode 244, and the electrode 245; and the electrode 243 over the insulating layer 117.

Since, in the transistor 430, the electrode 243 overlaps with neither the electrode 244 nor the electrode 245, the parasitic capacitance generated between the electrode 243 and the electrode 244 and the parasitic capacitance generated between the electrode 243 and the electrode 245 can be reduced. After the formation of the electrode 243, an impurity element 255 is introduced into the semiconductor layer 242 using the electrode 243 as a mask, so that an impurity region can be formed in the semiconductor layer 242 in a self-aligned manner (see FIG. 30A3). According to one embodiment of the present invention, a transistor with favorable electrical characteristics can be provided.

The introduction of the impurity element 255 can be performed with an ion implantation apparatus, an ion doping apparatus, or a plasma treatment apparatus.

As the impurity element 255, for example, at least one kind of element of Group 13 elements and Group 15 elements can be used. In the case where an oxide semiconductor is used for the semiconductor layer 242, it is possible to use at least one kind of element of a rare gas, hydrogen, and nitrogen as the impurity element 255.

A transistor 431 illustrated in FIG. 30A2 is different from the transistor 430 in that the electrode 213 and an insulating layer 217 are provided. The transistor 431 includes the electrode 213 formed over the insulating layer 109 and the insulating layer 217 formed over the electrode 213. As described above, the electrode 213 can function as a back gate electrode. Thus, the insulating layer 217 can function as a gate insulating layer. The insulating layer 217 can be formed using a material and a method that are similar to those of the insulating layer 205.

The transistor 431 as well as the transistor 411 has large on-state current for the area occupied thereby. That is, the area occupied by the transistor 431 can be small for required on-state current. With one embodiment of the present invention, the area occupied by a transistor can be reduced. Therefore, with one embodiment of the present invention, a semiconductor device having a high degree of integration can be provided.

A transistor 440 shown in FIG. 30B1 as an example is a type of top-gate transistor. The transistor 440 is different from the transistor 430 in that the semiconductor layer 242 is formed after the formation of the electrode 244 and the electrode 245. A transistor 441 illustrated in FIG. 30B2 is different from the transistor 440 in that the electrode 213 and the insulating layer 217 are provided. Thus, in the transistors 440 and 441, part of the semiconductor layer 242 is formed over the electrode 244 and another part of the semiconductor layer 242 is formed over the electrode 245.

The transistor 441 as well as the transistor 411 has large on-state current for the area occupied thereby. That is, the area occupied by the transistor 441 can be small for required on-state current. With one embodiment of the present invention, the area occupied by a transistor can be reduced. Therefore, with one embodiment of the present invention, a semiconductor device having a high degree of integration can be provided.

Also in the transistors 440 and 441, after the formation of the electrode 243, the impurity element 255 is introduced into the semiconductor layer 242 using the electrode 243 as a mask, so that an impurity region can be formed in the semiconductor layer 242 in a self-aligned manner. According to one embodiment of the present invention, a transistor with favorable electrical characteristics can be provided. Furthermore, according to one embodiment of the present invention, a semiconductor device having a high degree of integration can be provided.

<S-Channel Transistor>

Figure 31A:
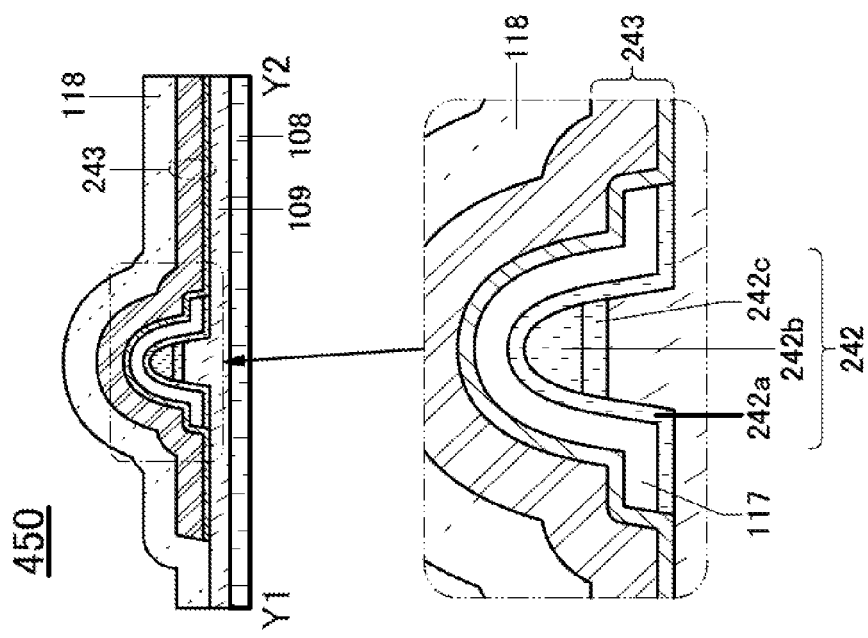
FIGS. 31A to 31C illustrate one embodiment of a transistor.
Figure 31B:
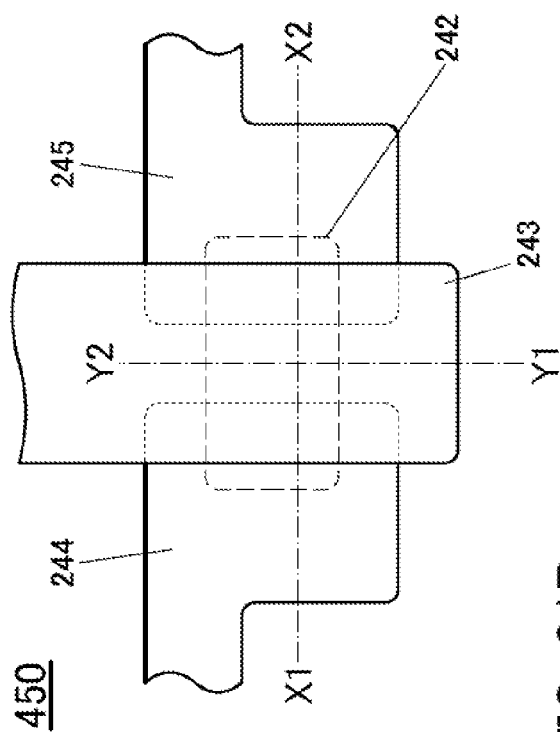
Figure 31C:
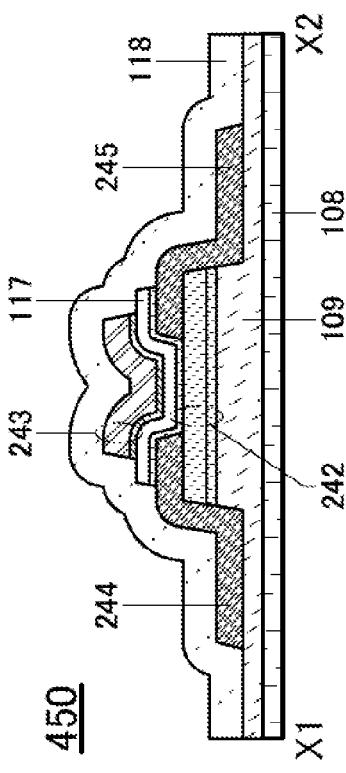

A transistor 450 illustrated in FIGS. 31A to 31C has a structure in which a top surface and side surface of the semiconductor layer $242b$ are covered with the semiconductor layer $242a$. FIG. 31A is the top view of the transistor 450. FIG. 31B is a cross-sectional view (in the channel length direction) taken along dashed-dotted line X1-X2 in FIG. 31A. FIG. 31C is a cross-sectional view (in the channel width direction) taken along dashed-dotted line Y1-Y2 in FIG. 31A.

With the semiconductor layer $242a$ provided on the projection of the insulating layer 109, the side surface of the semiconductor layer $242b$ can also be covered with the electrode 243. Thus, the transistor 450 has a structure in which the semiconductor layer $242b$ can be electrically surrounded by electric field of the electrode 243. In this way, the structure of a transistor in which the semiconductor layer in which the channel is formed is electrically surrounded by the electric field of the conductive film is called a surrounded channel (s-channel) structure. A transistor having an s-channel structure is referred to as an s-channel transistor.

In the transistor with an s-channel structure, a channel is formed in the whole (bulk) of the semiconductor layer $242b$ in some cases. In the s-channel structure, the drain current of the transistor is increased, so that a larger amount of on-state current can be obtained. Furthermore, the entire channel formation region of the semiconductor layer $242b$ can be depleted by the electric field of the electrode 243. Accordingly, off-state current of the transistor with an s-channel structure can be further reduced.

When the projecting portion of the insulating layer 109 is increased in height, and the channel width is shortened, the effects of the s-channel structure to increase the on-state current and reduce the off-state current can be enhanced. Part of the semiconductor layer $242a$ exposed in the formation of the semiconductor layer $242b$ may be removed. In this case, the side surfaces of the semiconductor layer $242a$ and the semiconductor layer $242b$ may be aligned to each other.

Figure 32C:
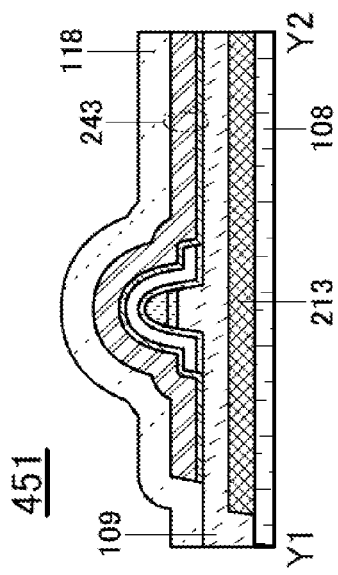
FIGS. 32A to 32C illustrate one embodiment of a transistor.
Figure 32A:
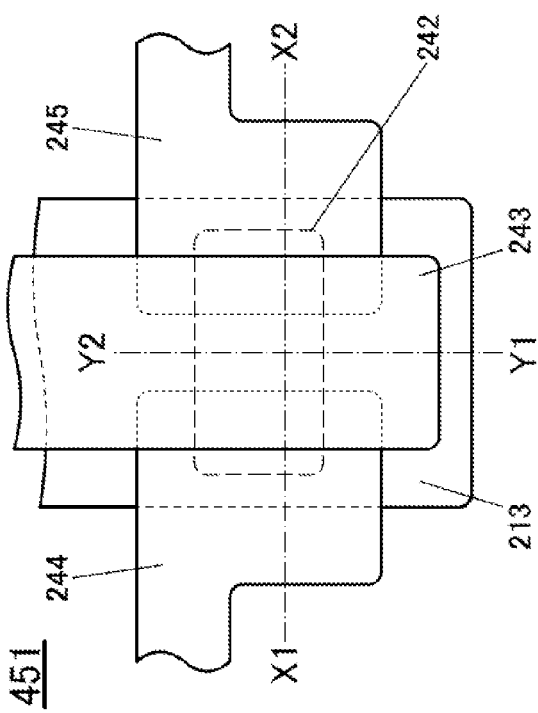
Figure 32B:
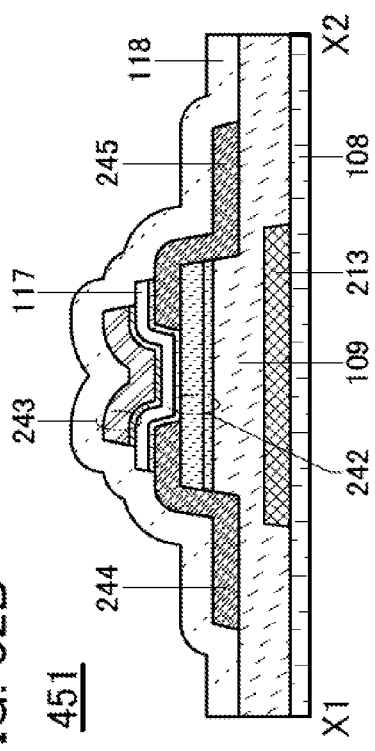

As in a transistor 451 illustrated in FIGS. 32A to 32C, the electrode 213 may be provided below the semiconductor layer 242 with an insulating layer interposed therebetween. FIG. 32A is a top view of the transistor 451. FIG. 32B is a cross-sectional view taken along the dashed-dotted line X1-X2 in FIG. 32A. FIG. 32C is a cross-sectional view taken along the dashed-dotted line Y1-Y2 in FIG. 32A.

This embodiment can be implemented in an appropriate combination with any of the structures described in the other embodiments.

Embodiment 6

In this embodiment, examples of an electronic device including an imaging device of one embodiment of the present invention will be described.

Examples of an electronic device including the imaging device of one embodiment of the present invention are as follows: display devices such as televisions and monitors, lighting devices, desktop personal computers and laptop personal computers, word processors, image reproduction devices which reproduce still images and moving images stored in recording media such as digital versatile discs (DVDs), portable CD players, radios, tape recorders, headphone stereos, stereos, navigation systems, table clocks, wall clocks, cordless phone handsets, transceivers, mobile phones, car phones, portable game consoles, tablet terminals, large game machines such as pinball machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electric power tools such as chain saws, smoke detectors, medical equipment such as dialyzers, facsimiles, printers, multifunction printers, automated teller machines (ATM), and vending machines. Further, industrial equipment such as guide lights, traffic lights, belt conveyors, elevators, escalators, industrial robots, power storage systems, and power storage devices for leveling the amount of power supply and smart grid can be given. In addition, moving objects and the like driven by fuel engines and electric motors using power from non-aqueous secondary batteries are also included in the category of electronic appliances. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

Figure 33A:
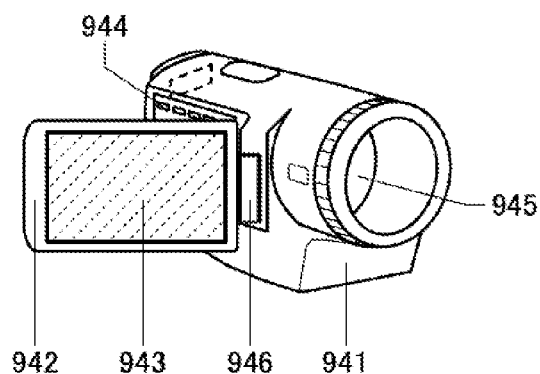
FIGS. 33A to 33F are diagrams illustrating electronic devices according to one embodiment of the present invention.

FIG. 33A shows a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942. The imaging device of one embodiment of the present invention can be provided in a focus position of the lens 945.

Figure 33B:
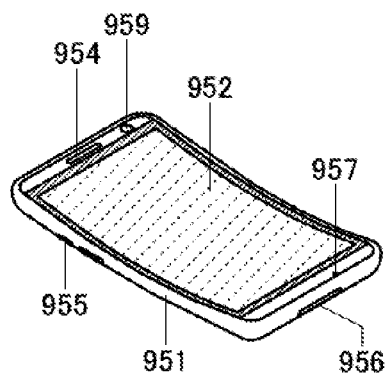

FIG. 33B shows a mobile phone, which includes a display portion 952, a microphone 957, a speaker 954, a camera 959, an input/output terminal 956, an operation button 955, and the like in a housing 951. The imaging device of one embodiment of the present invention can be used for the camera 959.

Figure 33C:
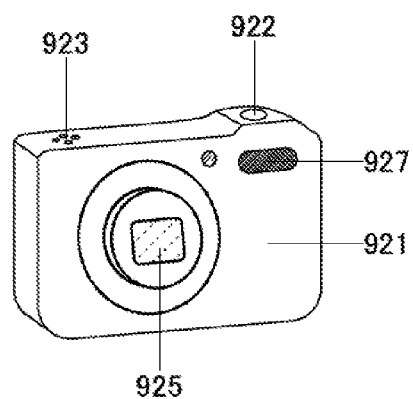

FIG. 33C shows a digital camera, which includes a housing 921, a shutter button 922, a microphone 923, a light-emitting portion 927, a lens 925, and the like. The imaging device of one embodiment of the present invention can be provided in a focus position of the lens 925.

Figure 33D:
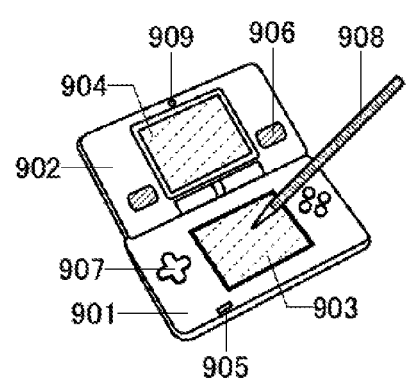

FIG. 33D illustrates a portable game console, which includes a housing 901, a housing 902, a display portion 903, a display portion 904, a microphone 905, a speaker 906, an operation key 907, a stylus 908, a camera 909, and the like. Although the portable game console in FIG. 33D has the two display portions 903 and 904, the number of display portions included in a portable game console is not limited to this. The imaging device of one embodiment of the present invention can be used for the camera 909.

Figure 33E:
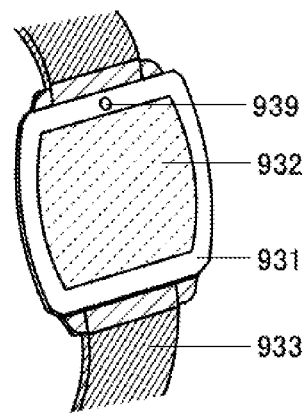

FIG. 33E shows a wrist-watch-type information terminal, which includes a housing 931, a display portion 932, a wristband 933, a camera 939, and the like. The display portion 932 may be a touch panel. The imaging device of one embodiment of the present invention can be used for the camera 939.

Figure 33F:
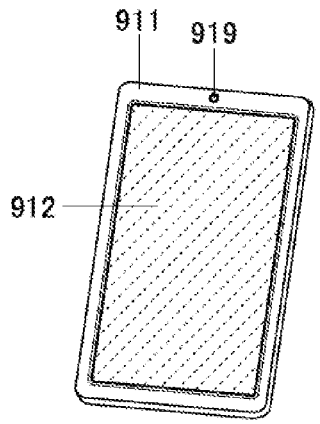

FIG. 33F shows a portable data terminal, which includes a first housing 911, a display portion 912, a camera 919, and the like. A touch panel function of the display portion 912 enables input and output of information. The imaging device of one embodiment of the present invention can be used for the camera 919.

Needless to say, the examples are not limited to the above-described electronic devices as long as the imaging device of one embodiment of the present invention is included.

This embodiment can be implemented in an appropriate combination with any of the structures described in the other embodiments.

This application is based on Japanese Patent Application serial no. 2014-143256 filed with Japan Patent Office on Jul. 11, 2014, the entire contents of which are hereby incorporated by reference.

What is claimed is:

1. A driving method of an imaging device comprising:
irradiating an object with light;
receiving the light reflected by the object by using a plurality of photoelectric conversion elements each electrically connected to a charge accumulation region in a state where the plurality of photoelectric conversion elements are electrically connected with each other;
calculating a distance from the object by using a potential of the charge accumulation region;
taking a two-dimensional image of the object by using the plurality of photoelectric conversion elements in a state where the plurality of photoelectric conversion elements are not electrically connected with each other; and
making a three-dimensional image of the object by using the two-dimensional image and the distance,
wherein the plurality of photoelectric conversion elements comprises:
a first photoelectric conversion element electrically connected to a first charge accumulation region through a first transistor; and
a second photoelectric conversion element electrically connected to a second charge accumulation region through a second transistor,
wherein the first photoelectric conversion element and the second photoelectric conversion element are electrically connected through a third transistor, so that the third transistor controls whether there is electrical conduction or no electrical conduction between the first photoelectric conversion element and the second photoelectric conversion element.

2. The driving method of an imaging device according to claim 1, wherein the light is pulse light.

3. The driving method of an imaging device according to claim 1, wherein the light is not visible light.

4. A driving method of an imaging device comprising:
irradiating an object with light;
receiving the light reflected by the object by using a plurality of photoelectric conversion elements each electrically connected to a charge accumulation region in a state where the plurality of photoelectric conversion elements are electrically connected with each other;
calculating a distance from the object by using a potential of the charge accumulation region;
taking a two-dimensional image of the object by using the plurality of photoelectric conversion elements with a global shutter system in a state where the plurality of photoelectric conversion elements are not electrically connected with each other; and making a three-dimensional image of the object by using the two-dimensional image and the distance,
wherein the plurality of photoelectric conversion elements comprises:
a first photoelectric conversion element electrically connected to a first charge accumulation region through a first transistor; and
a second photoelectric conversion element electrically connected to a second charge accumulation region through a second transistor,
wherein the first photoelectric conversion element and the second photoelectric conversion element are electrically connected through a third transistor, so that the third transistor controls whether there is electrical conduction or no electrical conduction between the first photoelectric conversion element and the second photoelectric conversion element.

5. The driving method of an imaging device according to claim 4, wherein the light is pulse light.

6. The driving method of an imaging device according to claim 4, wherein the light is not visible light.

7. A driving method of an imaging device comprising:
irradiating an object with light;
receiving the light reflected by the object by using a plurality of photoelectric conversion elements each electrically connected to a charge accumulation region in a state where the plurality of photoelectric conversion elements are electrically connected with each other;
calculating a distance from the object by using a potential of the charge accumulation region;
measuring background by using the plurality of photoelectric conversion elements in a state of no irradiation with the light;
adjusting the distance by using the background;
taking a two-dimensional image of the object by using the plurality of photoelectric conversion elements in a state where the plurality of photoelectric conversion elements are not electrically connected with each other; and
making a three-dimensional image of the object by using the two-dimensional image and the distance,
wherein the plurality of photoelectric conversion elements comprises:
a first photoelectric conversion element electrically connected to a first charge accumulation region through a first transistor; and
a second photoelectric conversion element electrically connected to a second charge accumulation region through a second transistor,
wherein the first photoelectric conversion element and the second photoelectric conversion element are electrically connected through a third transistor, so that the third transistor controls whether there is electrical conduction or no electrical conduction between the first photoelectric conversion element and the second photoelectric conversion element.

8. The driving method of an imaging device according to claim 7, wherein the light is pulse light.

9. The driving method of an imaging device according to claim 7, wherein the light is not visible light.

10. The driving method of an imaging device according to claim 1, wherein one of the first transistor, the second transistor, and the third transistor comprises a channel formation region comprising an oxide semiconductor.

11. The driving method of an imaging device according to claim 4, wherein one of the first transistor, the second transistor, and the third transistor comprises a channel formation region comprising an oxide semiconductor.

12. The driving method of an imaging device according to claim 7, wherein one of the first transistor, the second transistor, and the third transistor comprises a channel formation region comprising an oxide semiconductor.

* * * * *